(12) United States Patent
Yoshizawa et al.

(10) Patent No.: US 9,087,891 B2
(45) Date of Patent: Jul. 21, 2015

(54) SEMICONDUCTOR DEVICE, SEMICONDUCTOR WAFER AND MANUFACTURING METHOD OF SEMICONDUCTOR DEVICE

(75) Inventors: Kazutaka Yoshizawa, Yokohama (JP); Taiji Ema, Yokohama (JP); Takuya Moriki, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 13/618,389

(22) Filed: Sep. 14, 2012

(65) Prior Publication Data
US 2013/0069206 A1    Mar. 21, 2013

(30) Foreign Application Priority Data

Sep. 15, 2011   (JP) ................................. 2011-201321
Jun. 22, 2012   (JP) ................................. 2012-141392

(51) Int. Cl.
*H01L 23/544*   (2006.01)
*H01L 21/78*    (2006.01)
*H01L 21/66*    (2006.01)

(52) U.S. Cl.
CPC ................ *H01L 21/78* (2013.01); *H01L 22/34* (2013.01)

(58) Field of Classification Search
CPC ............................... H01L 21/78; H01L 22/34
USPC ........... 257/620, E23.179, E21.599, E21.523, 257/E21.524
See application file for complete search history.

(56) References Cited

U.S. PATENT DOCUMENTS

| | | | |
|---|---|---|---|
| 6,680,484 B1 | 1/2004 | Young | |
| 7,129,566 B2 * | 10/2006 | Uehling et al. | ............... 257/620 |
| 7,387,950 B1 * | 6/2008 | Kuo et al. | ..................... 438/462 |
| 8,067,819 B2 | 11/2011 | Yoshida et al. | |
| 2002/0024115 A1 * | 2/2002 | Ibnabdeljalil et al. | ........ 257/620 |

(Continued)

FOREIGN PATENT DOCUMENTS

| | | |
|---|---|---|
| JP | 2002-190456 A | 7/2002 |
| JP | 2005-158832 A | 6/2005 |

(Continued)

OTHER PUBLICATIONS

Chinese Office Action dated Sep. 25, 2014, issued in corresponding Chinese Patent Application No. 201210342242.X (12 pages), with English translation.

*Primary Examiner* — Michael Lebentritt
*Assistant Examiner* — Jordan Klein
(74) *Attorney, Agent, or Firm* — Westerman, Hattori, Daniels & Adrian, LLP

(57) ABSTRACT

A semiconductor device includes wiring layers formed over a semiconductor wafer, a via-layer between the wiring layers, conductive films in the wiring layers, and a via-plug in the via-layer connecting the conductive films of the wiring layers above and below, a scribe region at an outer periphery of a chip region along an edge of the semiconductor substrate and including a pad region in the vicinity of the edge, the pad region overlapping the conductive films of the plurality of wiring layers in the plan view, the plurality of wiring layers including first second wiring layers, the conductive film of the first wiring layer includes a first conductive pattern formed over an entire surface of said pad region in a plan view, and the conductive film of the second wiring layer includes a second conductive pattern formed in a part of the pad region in a plan view.

15 Claims, 53 Drawing Sheets

(56) References Cited

U.S. PATENT DOCUMENTS

| | | | |
|---|---|---|---|
| 2004/0212047 A1* | 10/2004 | Joshi et al. | 257/620 |
| 2008/0299708 A1* | 12/2008 | Tsutsue | 438/121 |
| 2009/0201043 A1* | 8/2009 | Kaltalioglu | 324/765 |
| 2009/0272973 A1* | 11/2009 | Yoshida et al. | 257/48 |
| 2010/0264413 A1* | 10/2010 | Chatterjee et al. | 257/48 |
| 2011/0027917 A1 | 2/2011 | Shinkawata | |
| 2011/0287627 A1* | 11/2011 | Chen et al. | 438/622 |

FOREIGN PATENT DOCUMENTS

| | | |
|---|---|---|
| JP | 2007-173752 A | 7/2007 |
| JP | 2008-034783 A | 2/2008 |
| JP | 2011-24948 A | 2/2011 |
| JP | 2011-29498 A | 2/2011 |

* cited by examiner

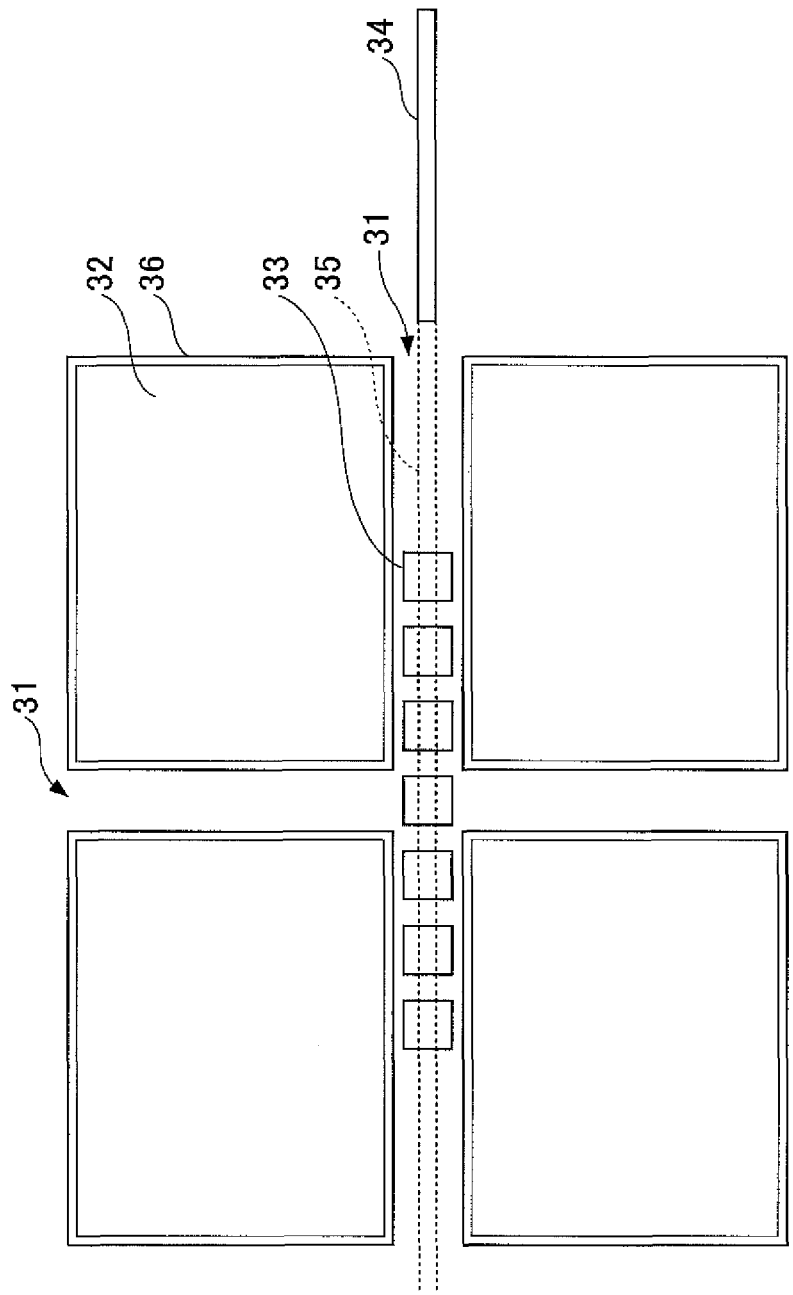

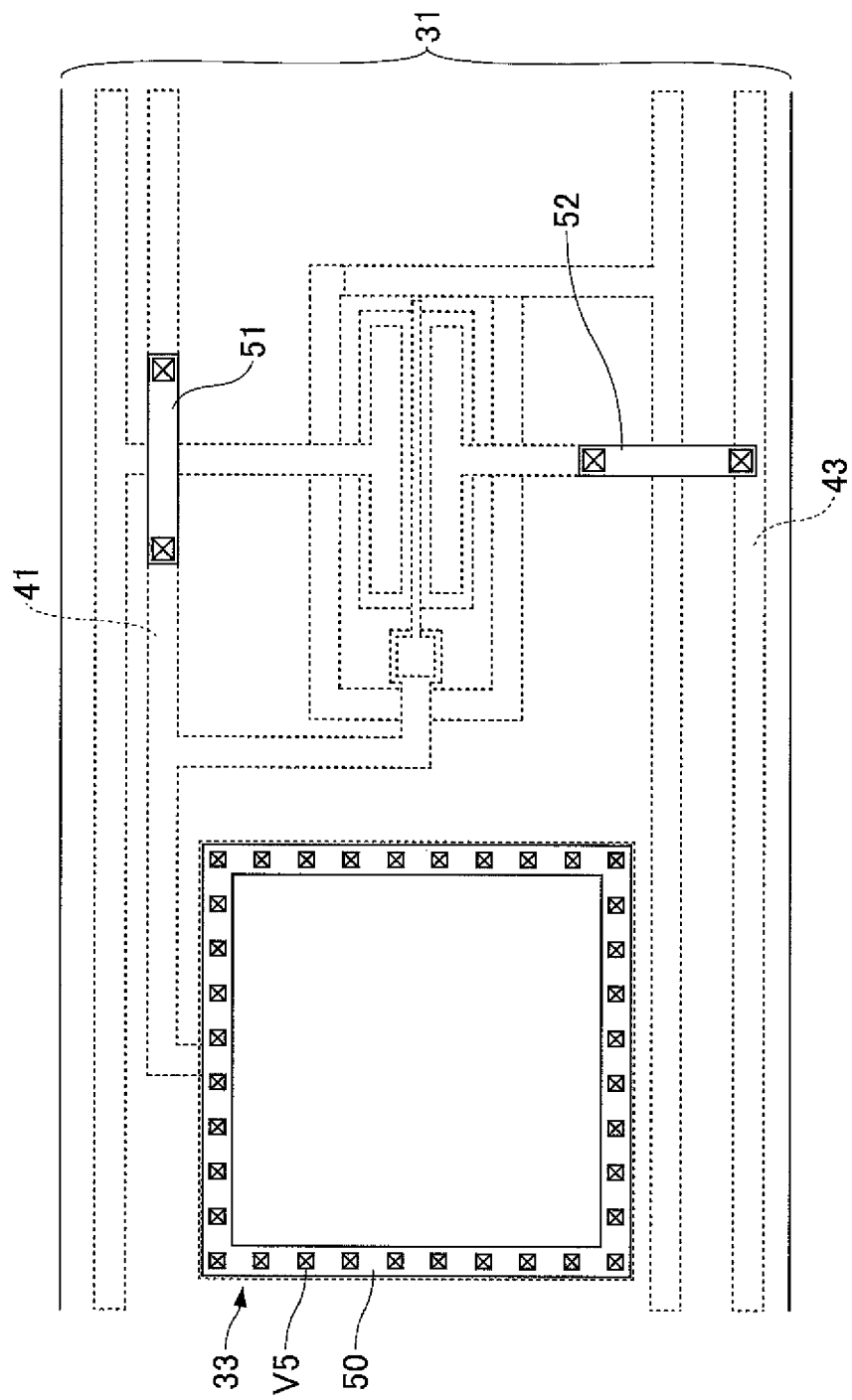

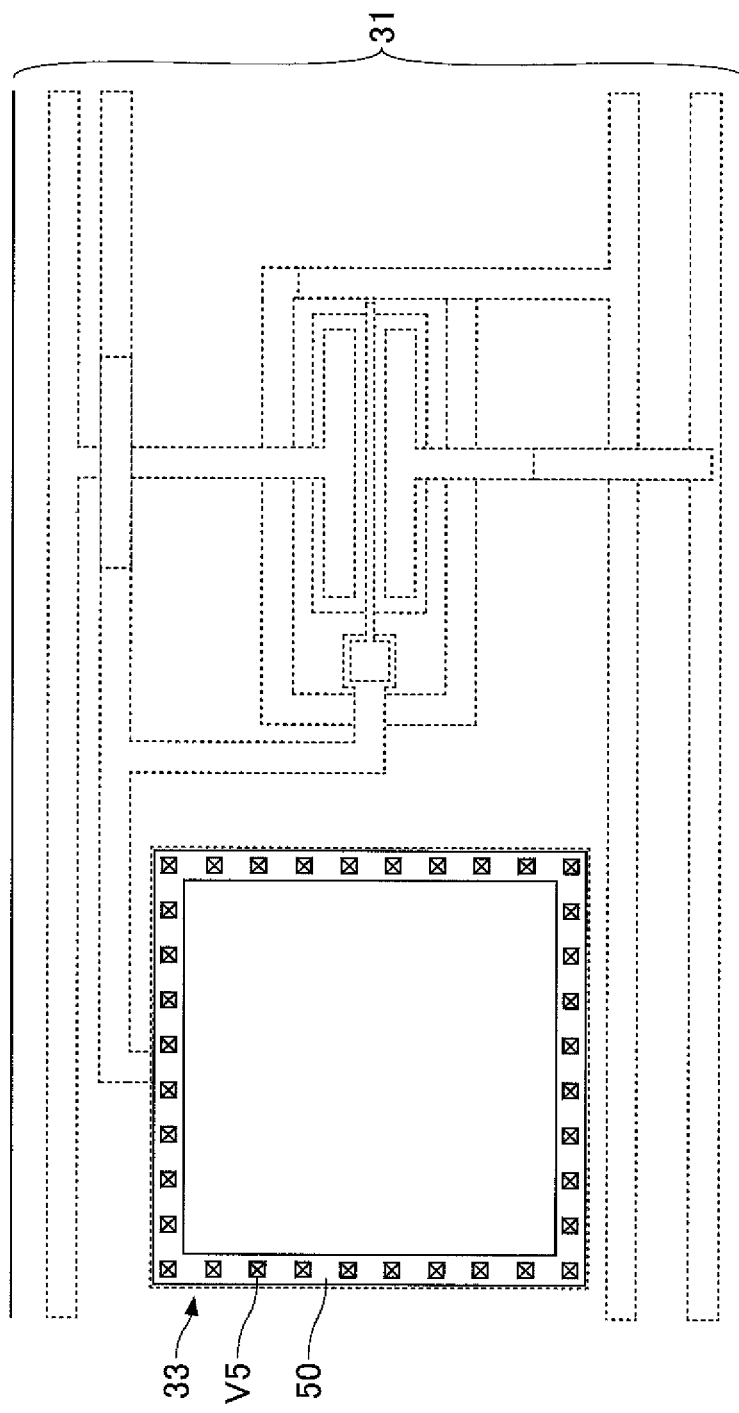

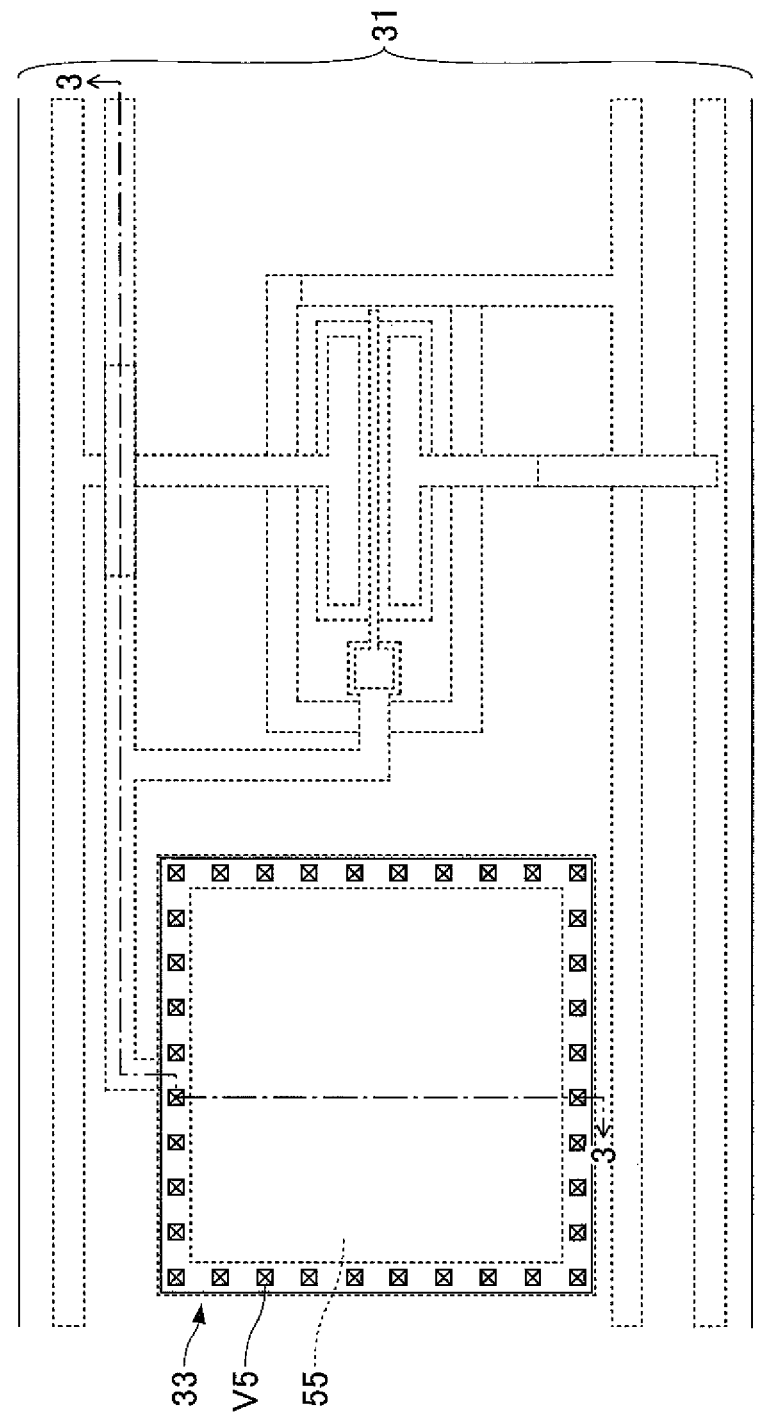

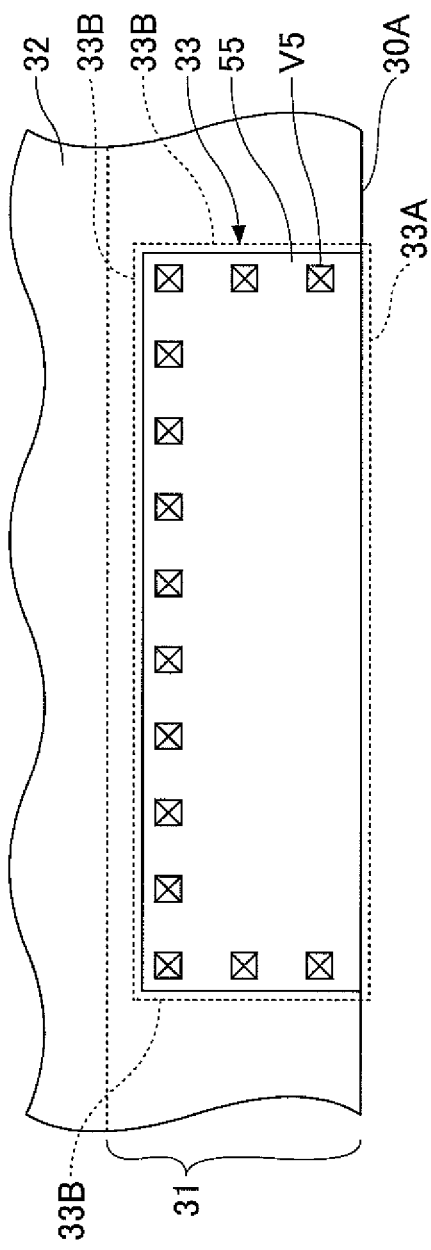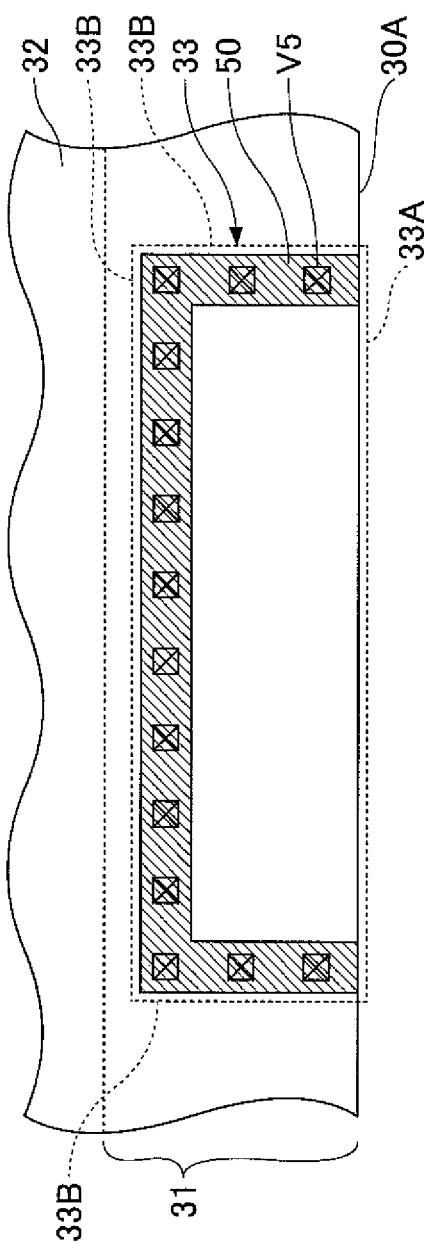

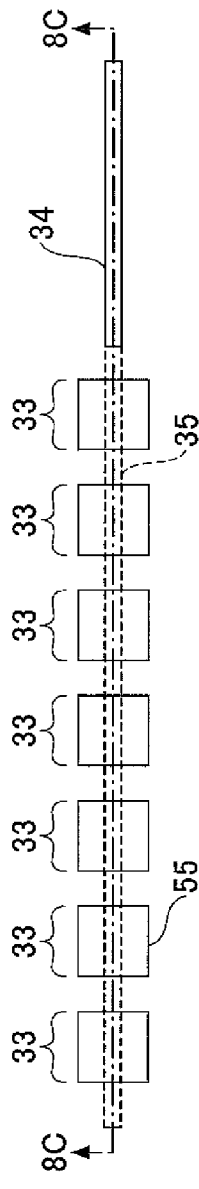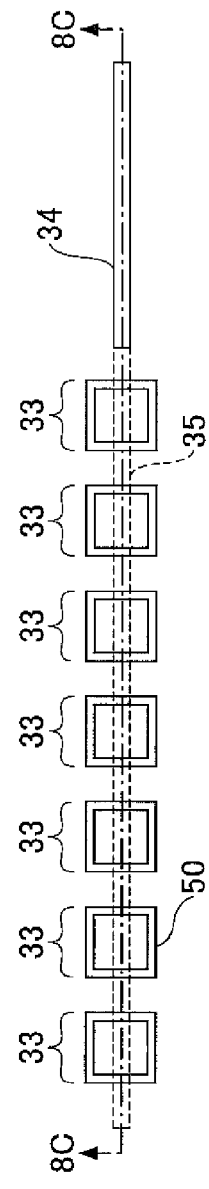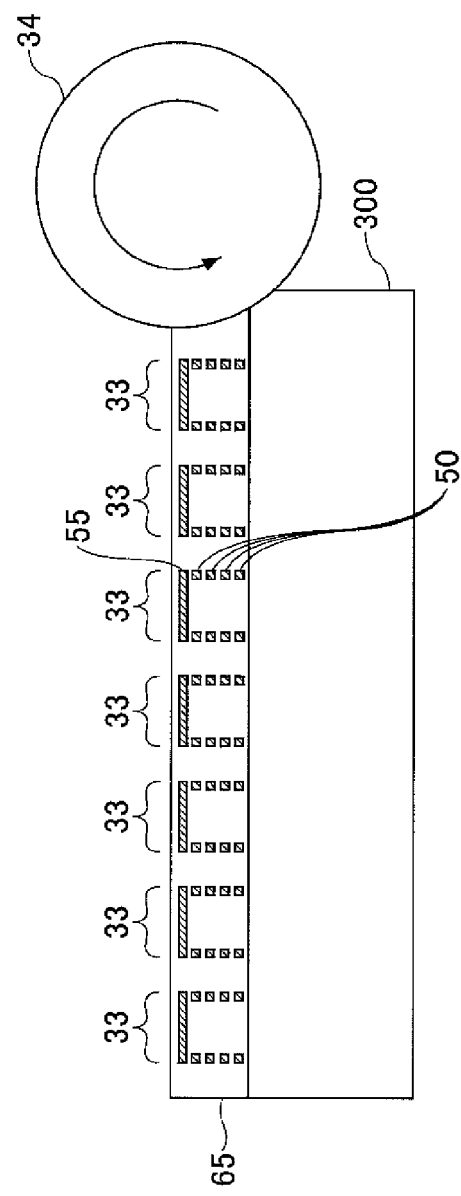

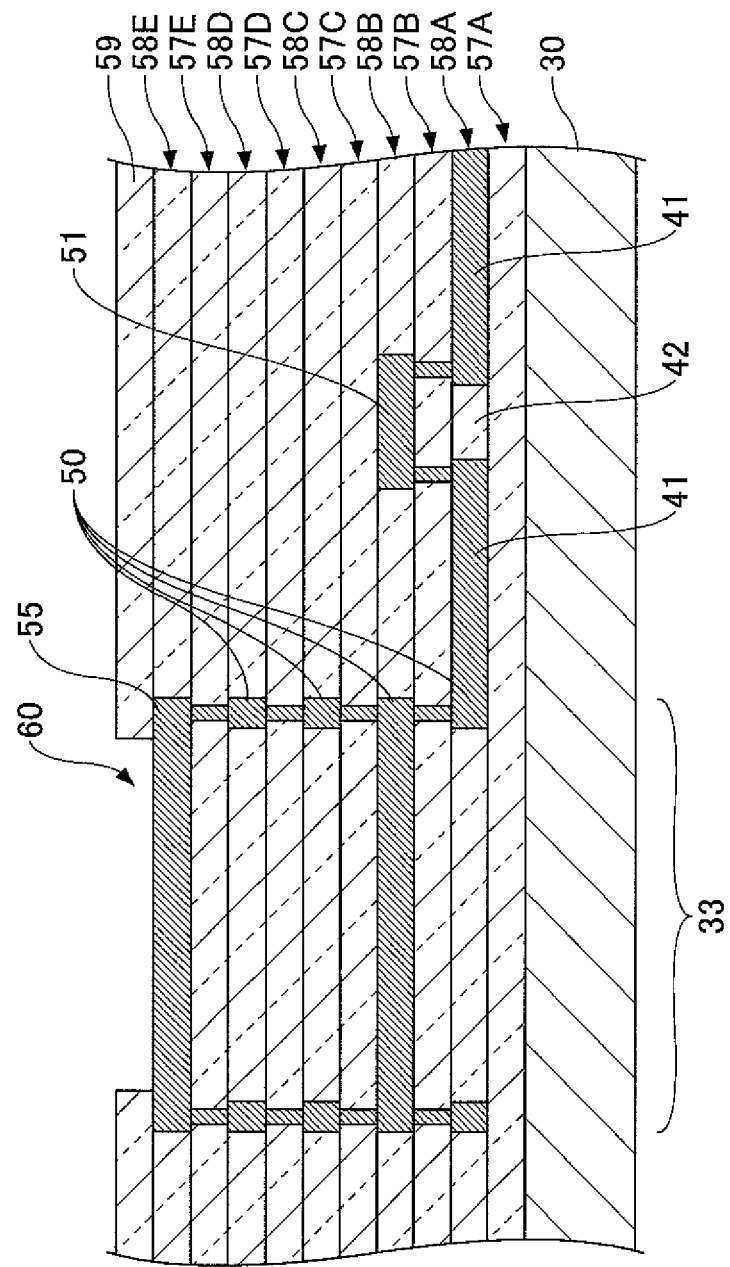

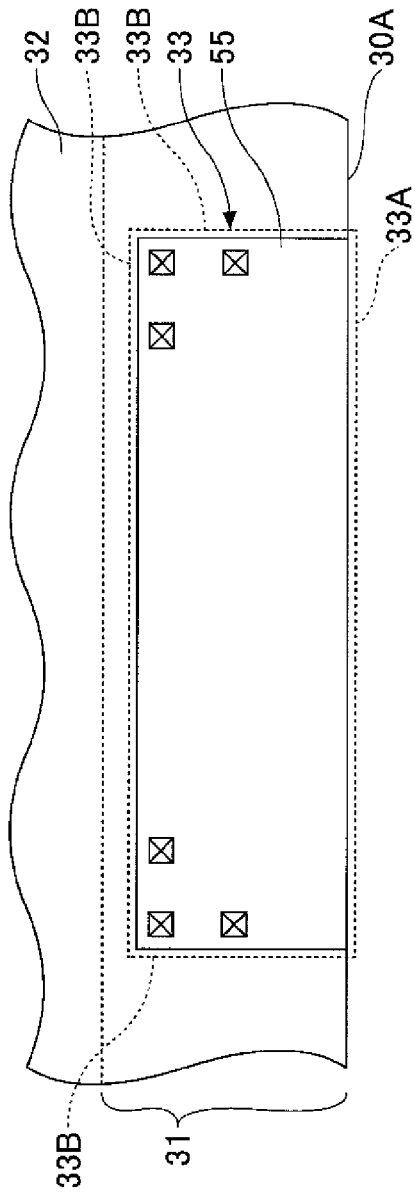
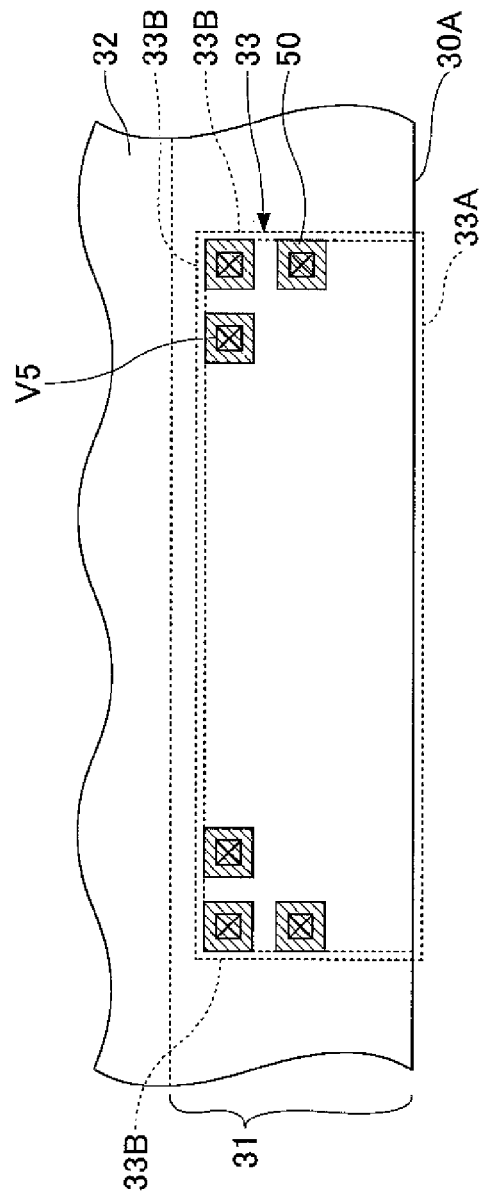
FIG.21B
FIG.21C

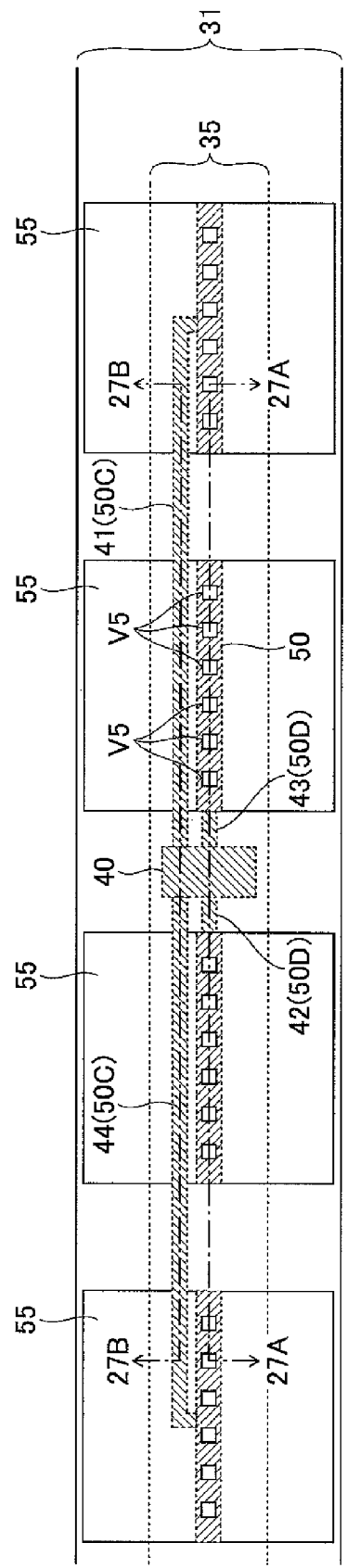

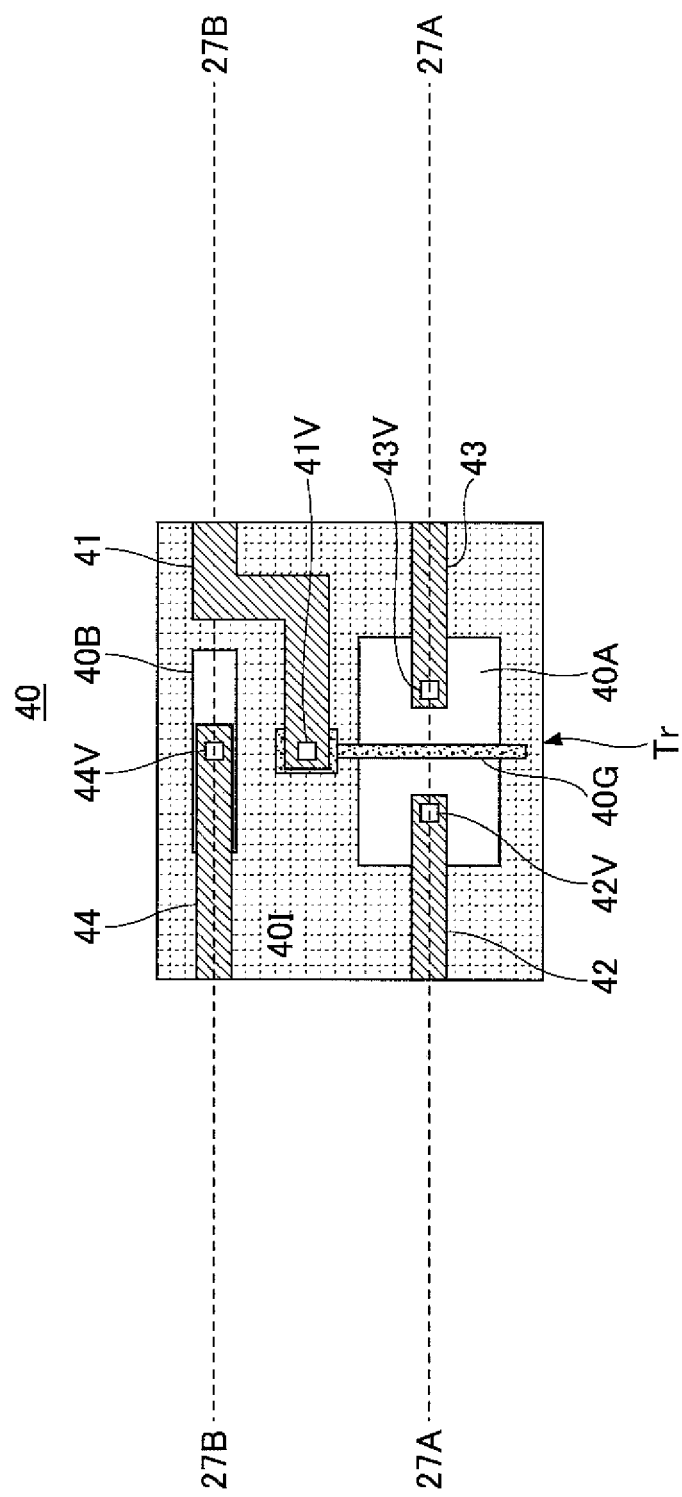

SEMICONDUCTOR DEVICE, SEMICONDUCTOR WAFER AND MANUFACTURING METHOD OF SEMICONDUCTOR DEVICE

CROSS-REFERENCE TO RELATED APPLICATIONS

The present application is based upon and claims the benefit of priority from the prior Japanese Patent Applications No. 2011-201321 filed on Sep. 15, 2011 and No. 2012-141392 filed on Jun. 22, 2012, with the Japanese Patent Office, the entire contents of which are incorporated herein by reference.

FIELD

The embodiments to be described hereinafter relate to a semiconductor device diced along a scribe line, a semiconductor device and a wafer having a pad disposed in a scribe line, and a manufacturing method of a semiconductor device.

BACKGROUND

In a scribe line of a semiconductor wafer, there are disposed pads (contact pads) for process monitoring. Thus, when a semiconductor wafer is diced along a scribe line, there can be a case in which burr is formed as a result of breaking of the pads. In order to reduce the occurrence of such burrs, there is proposed a structure in which via-plugs interconnecting an upper pad and a lower pad are formed such that only one via-plug is located at each of the four corners of each pad. Further, there is proposed a structure that includes at least three wiring layers wherein the pads are formed by two of the wiring layers except for the lowermost wiring layer.

Further, in order to extend the lifetime of the dicing blade, there is proposed a structure in which only the pad of the uppermost wiring layer is formed over the entire area used for the electrode formation while the pads other than those formed in the uppermost wiring layer are formed only at four corners of the area used for the electrode formation.

RELATED-ART DOCUMENTS

Patent Document

Patent Reference 1 Japanese Laid-Open Patent Application 2008-34783

Patent Reference 2 Japanese Laid-Open Patent Application 2007-173752

Patent Reference 3 Japanese Laid-Open Patent Application 2002-190456

Patent Reference 4 Japanese Laid-Open Patent Application 2005-158832

With increasing number of the wiring layers, there increases the number of the pads disposed in the scribe lines. When the number of the pads is increased, there increases the chance that cracks are formed at the time of the dicing and that the cracks thus formed extend from the scribe line toward the area where device formation is made. Now, when the width of the scribe line is narrowed, there can be a case in which such a crack reaches the area inside the seal ring and causes adversary effect on the operation of the electronic circuits.

Thus, there is a demand for a semiconductor device and a manufacturing method thereof capable of suppressing the formation of cracks even when the width of the scribe line is narrowed and the number of the wiring layers is increased.

SUMMARY

In an aspect, there is provided a semiconductor device comprising: a semiconductor substrate, the semiconductor substrate having a scribe region and a chip region; a plurality of wiring layers formed over the semiconductor wafer; a via-layer interposed between the plurality of wiring layers; conductive films formed respectively in the plurality of wiring layers; and a via-plug disposed in the via-layer such that the via-plug connects the conductive films of the wiring layers respectively above and below the via-layer with each other, wherein said scribe region is located at an outer periphery of the chip region along an edge of the semiconductor substrate, the scribe region including a pad region in the vicinity of the edge, the pad region overlapping with the conductive films of the plurality of wiring layers in a plan view as viewed perpendicularly to the substrate, the plurality of wiring layers including a first wiring layer and a second wiring layer, the conductive film of the first wiring layer including a first conductive pattern formed over an entire surface of the pad region in a plan view as viewed perpendicularly to the substrate, and the conductive film of the second wiring layer includes a second conductive pattern formed in a part of the pad region in a plan view as viewed perpendicularly to the substrate.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1A is a plan view diagram of a semiconductor wafer before dicing to form a semiconductor device of a first embodiment while FIG. 1B is an enlarged plan view diagram representing a chip region and a scribe line of the semiconductor wafer of FIG. 1A;

FIGS. 2A and 2B are plan view diagrams respectively representing the wiring patterns of a first wiring layer and a second wiring layer before the dicing to form the semiconductor device of the first embodiment;

FIG. 3A is a plan view diagram representing the wiring patterns in the scribe lines of a third wiring layer and a fourth wiring layer before the dicing to form the semiconductor device of the first embodiment while FIG. 3B is a plan view diagram representing the wiring pattern in the scribe line of a fifth wiring layer before the dicing to form the semiconductor device of the first embodiment;

FIG. 5B is a plan view diagram representing the neighborhood of the pad region of the semiconductor device of the first embodiment, while FIG. 5C is a horizontal sectional diagram representing the pad region of a wiring layer lower than the uppermost wiring layer;

FIG. 7B is a cross-sectional diagram taken along a one-dotted line 7B-7B represented in the plan view diagram of FIG. 7A, while

FIG. 8A is a plan view diagram of the scribe line and the dicing blade before the dicing to form the semiconductor device of the first embodiment, FIG. 8B is a horizontal sectional diagram representing the scribe line and the wiring layer lower than the uppermost wiring layer before the dicing to form the semiconductor device of the first embodiment, FIG. 8C is a cross-sectional diagram taken along a one-dotted line 8C-8C represented in FIGS. 8A and 8B, while

FIG. 9A is a plan view diagram representing the patterns corresponding to the pattern data of a conductive pattern and a wiring pattern formed inside the pad region for the semiconductor device of the comparative example, while

FIG. 10A is a cross-sectional diagram representing the neighborhood of the pad before the dicing to form a semiconductor device according to a second embodiment, while

FIG. 12A is a plan view diagram representing a layout of a pad region before the dicing to form a semiconductor device of a reference, while

FIG. 14B is a plan view diagram representing the neighborhood of the pad region of the semiconductor device of the modification, while

FIG. 16B is a plan view diagram representing the neighborhood of the pad region for the semiconductor device of the fourth embodiment, while

FIG. 17A is a plan view diagram representing another pad region for the semiconductor device of the fourth embodiment while

FIG. 19B is a plan view diagram representing the neighborhood of the pad region for the semiconductor device of the fifth embodiment, while

FIG. 21B is a plan view diagram representing the neighborhood of the pad region for the semiconductor device of the sixth embodiment, while FIG. 21C is a horizontal sectional diagram representing the pad region of a wiring layer lower than the uppermost wiring layer;

FIG. 24B is a plan view diagram representing the neighborhood of the pad region for the semiconductor device of the seventh embodiment, while

FIGS. 26A and 26B are horizontal sectional diagram of a conductive pattern inside a pad region for a wiring layer lower than the uppermost wiring layer for a semiconductor device of a comparative example, while

FIG. 28B is a plan view diagram representing the neighborhood of the pad region for the semiconductor device of the eighth embodiment, while

FIG. 31B is a plan view diagram representing the neighborhood of the pad region for the semiconductor device of the ninth embodiment, while

FIG. 33B is a plan view diagram representing the neighborhood of the pad region for the semiconductor device of the tenth embodiment, while

FIG. 35A is a plan view diagram representing an example of a semiconductor wafer according to the tenth embodiment while FIG. 35B is a plan view diagram representing an example of a monitoring device used with the semiconductor wafer of FIG. 35A;

FIG. 36A is a cross-sectional diagram taken along a line 27A-27A of the semiconductor wafer of FIG. 35A while

DESCRIPTION OF EMBODIMENTS

In the following, embodiments will be described with reference to the accompanying drawings.

First Embodiment

Figure 1A:
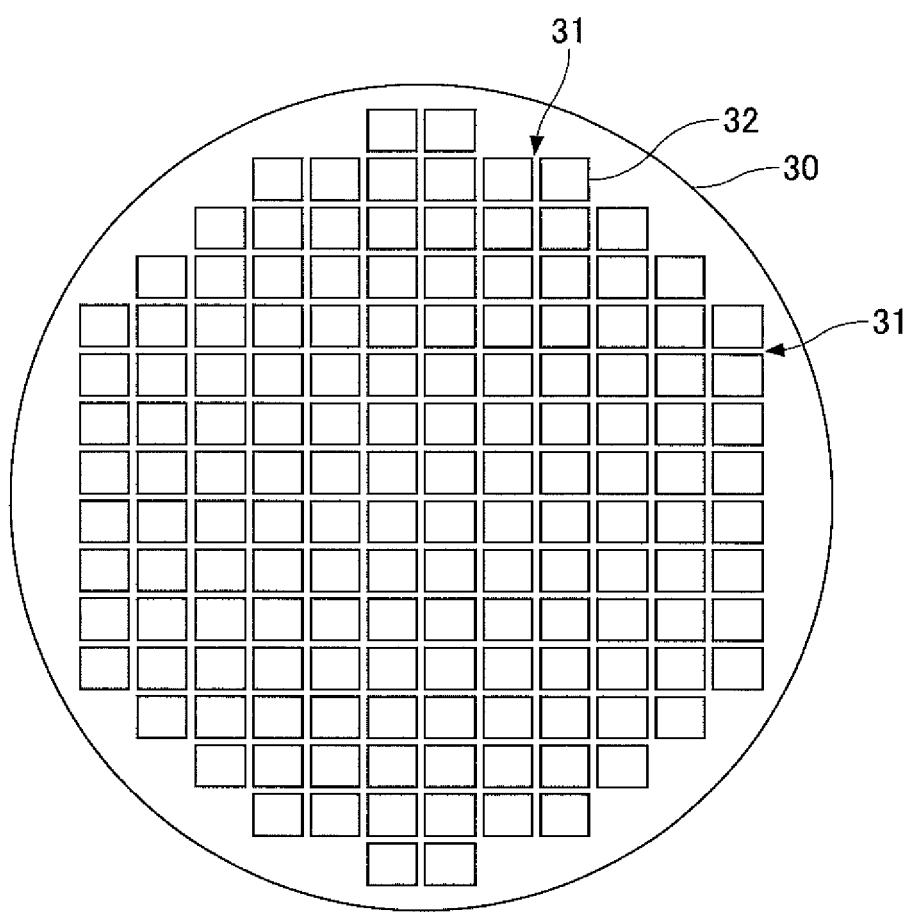

FIG. 1A is a plan view diagram representing a semiconductor wafer 30 according to a first embodiment in a state before dicing.

Referring to FIG. 1A, it can be seen that, in the first embodiment, there are disposed a plurality of chip regions 32 on the surface of the semiconductor wafer 30 in a row and column formation. Further, it can be seen that there are formed scribe lines 31 between the chip regions 32. The scribe lines 31 form together a lattice shape in the plan view.

FIG. 1B is an enlarged plan view diagram representing a part of a chip region 32 and a scribe line 31.

Referring to FIG. 1B, it can be seen that, with the first embodiment, there are formed seal rings 36 along the respective outer peripheries of the chip regions 32. Further, it can be seen that scribe lines 31 are defined between adjacent chip regions 32. Inside the scribe line 31, a plurality of pad regions 33 are disposed for the purpose of inspection or monitoring. On the wafer 30, there is formed a multi layer wiring structure by a plurality of wiring layers, and the pad regions 33 are formed at the same location in the respective wiring layers. In other words, the pad regions 33 of all the wiring layers are located to overlap with each other in a plan view.

The semiconductor wafer 30 is diced into individual semiconductor chips by a dicing blade 34 along the scribe lines 31. It should be noted that the dicing blade 34 removes a region 35 (referred hereinafter as "removal region"), wherein it should be noted that the removal region 35 has a width narrower than the width of the scribe line 31. Further, each pad region 33 has a size in the width direction larger than the width of the removal region 35. Thus, each pad region 33 is divided at the removal region 35, and thus, a fragment of the pad region 33 remains in the semiconductor chip thus obtained by the dicing process.

The scribe line 31 may have a width in the range of 30 µm to 120 µm, for example. In the dicing process, a suitable dicing blade 34 may be selected from a group of dicing blades of various thicknesses based on the width of the scribe line 31. When the width of the scribe line 31 falls in the foregoing range, the thickness of the dicing blade 34, and hence the width of the removal region 35 removed by the dicing blade

34, may fall in the range of 15 μm-50 μm. The width of the removal region 35 may not exceed the width of the scribe line 31. For example, a dicing blade having a thickness of 35 μm-40 μm may be used for the dicing blade 34 when the scribe line 31 has a width of 80 μm. It should be noted that the width of the removal region 35 may become slightly broader than the thickness of the dicing blade 34. The width of the removal region 35 may become 35 μm or more.

The pad region 33 may have a square or rectangular shape and may have an edge length determined based upon the width of the scribe line 31. For example, the size of the pad region 33 in the width direction may be set to about 35 μm in the case the scribe line 31 has a width of 40 μm, while in the case the scribe line 31 has a width of 120 μm, the size of the pad region 33 in the width direction may be set to about 80 μm.

Figure 2A:
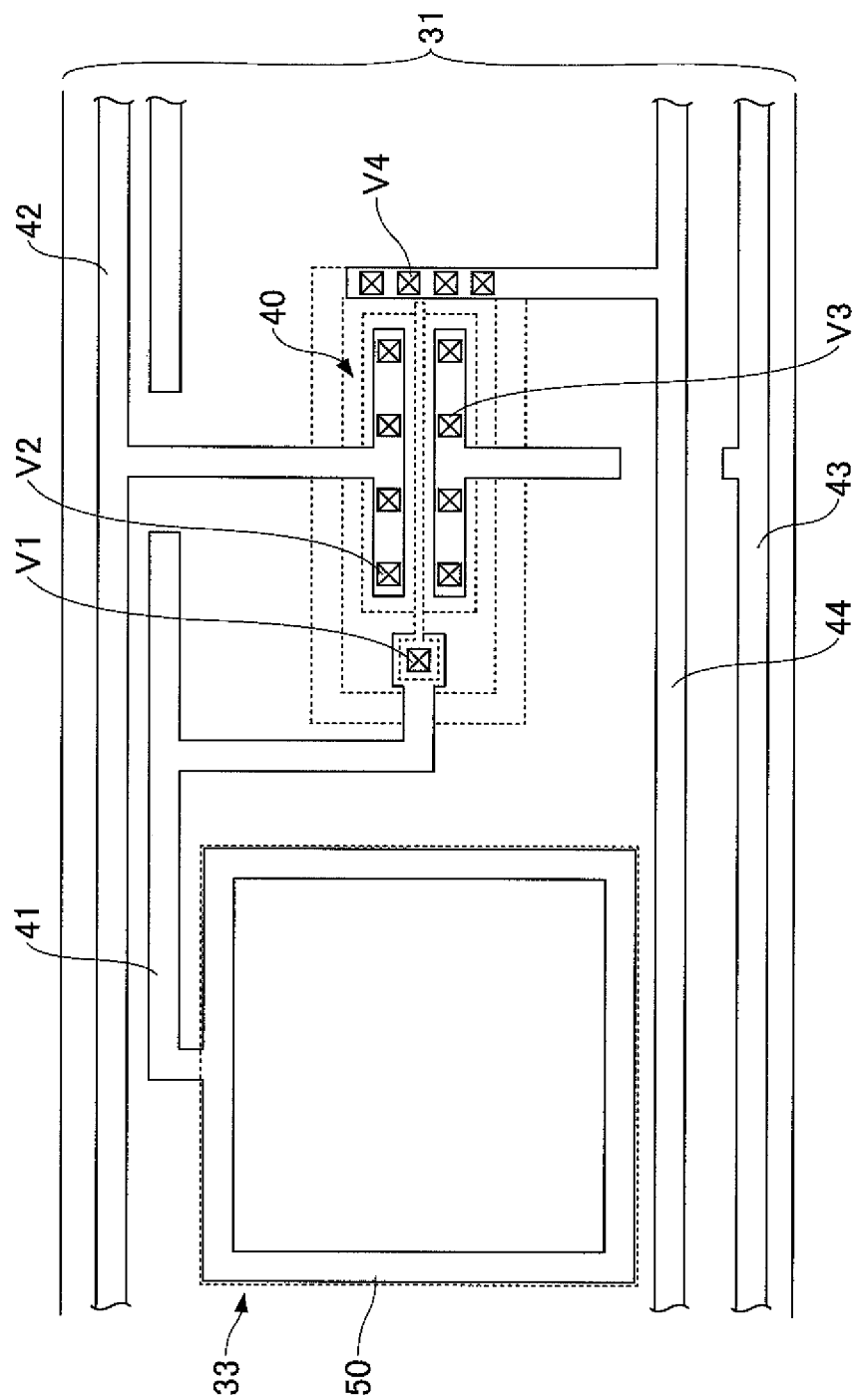

FIG. 2A is a plan view diagram representing a process control monitoring device 40 and a wiring pattern of the first layer formed inside the scribe line 31.

The plan view diagram of FIG. 2A represents that the monitoring device 40 is formed inside the scribe line 31 on the surface of the semiconductor wafer 30 (reference should be made to FIG. 1A). In the illustrated example, the monitoring 40 may be a MOS transistor, for example. It should be noted, however, that the monitoring device 40 is not limited to a MOS transistor. For example, a resistance element formed of a polysilicon pattern or capacitor may also be used for such a monitoring device 40.

Referring to FIG. 2A, it can be seen that there is defined a pad region 33 of generally square shape inside the scribe line 31. Inside the pad region 33, there is formed a conductive pattern 50 of a ring shape (or loop shape) along the outer periphery of the pad region 33, wherein the conductor pattern 50 may be formed by a metal film, for example. A conductor pattern 50 of the same shape is formed also in those pad regions 33 not illustrated in FIG. 2A.

Further, in the illustrated example, there is disposed a source wiring 42 along a first edge of the scribe line 31 but offset slightly inward from the first edge, and it can be seen that there is further disposed a gate wiring 41 with a slight offset further inward from the source wiring 42. Further, there is disposed a drain wiring 43 along a second edge opposite to the first edge of the scribe line 31 with a slight offset inward from the second edge, and there is further disposed a well wiring 44 with a slight offset further inward from the drain wiring 43. The source wiring 42, the gate wiring 41, the drain wiring 43 and the well wiring 44 all extend in an elongating direction of the scribe line 31. Further, the pad region 33 is defined between the gate wiring 41 and the well wiring 44.

Further, it can be seen that there is formed a branched wiring branched out from the gate wiring 41 in the width direction of the scribe line 31, wherein the branched wiring thus branched out from the gate wiring 41 is connected to a gate electrode of the monitoring device 40 via a via-plug V1. Further, there is formed a branched wiring branched out from the source wiring 42, wherein the branched wiring thus branched out from the source wiring 42 is connected to a source of the monitoring device 40 via a via-plug V2. Thereby, the gate wiring 41 is interrupted at the location where the branched wiring branched out from the source wiring 42 intersects the gate wiring 41. Further, there is formed a branched wiring branched out from the well wiring 44, wherein the branched wiring thus branched out from the well wiring 44 is connected via a via-plug V2 to a well in which the monitoring device 40 is disposed. Further, there is formed a branched wiring branched out from the drain wiring 43, wherein the branched wiring thus branched out from the drain wiring 43 is connected to a drain of the monitoring device 40 via a via-plug V3. Thereby, the branched wiring branched out from the drain wiring 43 is interrupted at the location where the branched wiring from the drain wiring 43 intersects with the well wiring 44.

Further, the gate wiring 41 is bent toward the width direction of the scribe line 31 in a region located between the first edge of the scribe line 31 and the pad region 33 and is connected to the conductive patter 50. The source wiring 42, the drain wiring 43 and the well wiring 44 are connected to the conductive pattern 50 of a pad region 33 not illustrated in FIG. 2A. Further, the gate wiring 41, the source wiring 42, the drain wiring 43 and the well wiring 44 are respectively connected to the gate electrode, the source, the drain and the well of the monitoring device not illustrated in FIG. 2A.

FIG. 2B is a plan view diagram representing a wiring pattern of the second wiring layer formed inside the scribe line 31. Therein, the wiring pattern of the first wiring layer is illustrated with a broken line.

Referring to FIG. 2B, it can be seen that there is defined a pad region 33 of the second wiring layer at the same location to the pad region 33 of the first wiring layer illustrated in FIG. 2A. Thus, there is formed a ring shaped conductive pattern 50 inside the pad region 33 along the outer periphery thereof. This conductive pattern 50 of the second wiring layer has the same plan view shape as the conductive pattern 50 of the first wiring layer. The conductive pattern 50 is connected to the conductive pattern 50 of the first wiring layer via via-plugs V5.

Thereby, the gate wirings 41 interrupted in the first wiring layer are connected with each other by a wiring 51 of the second wiring layer. Likewise, the drain wirings 43 interrupted in the first wiring layer are connected with each other by a wiring 52 of the second wiring layer.

FIG. 3A is a plan view diagram representing a wiring pattern of the third and fourth wiring layers formed inside the scribe line 31. Therein, the wiring patterns of the first and second wiring layers are illustrated with a broken line.

Referring to FIG. 3A, it can be seen that there are defined pad regions 33 of the third and fourth wiring layers at the same location to the pad region 33 of the first wiring layer illustrated in FIG. 2A. Thus, there is formed a ring shaped conductive pattern 50 inside the pad region 33 along the outer periphery thereof. This conductive pattern 50 has the same plan view shape as the conductive pattern 50 of the first wiring layer. The conductive pattern 50 is connected to an underlying conductive pattern 50 via via-plugs V5.

FIG. 3B is a plan view diagram representing a wiring pattern of the fifth (uppermost) wiring layer formed inside the scribe line 31. Therein, the wiring patterns of the first through fourth wiring layers are illustrated with a broken line.

Referring to FIG. 3B, it can be seen that there is defined a pad region 33 of the fifth wiring layer at the same location to the pad region 33 of the first wiring layer illustrated in FIG. 2A. A pad 55 is formed inside the pad region 33. The pad 55 may be formed of a conductive film such as a metal film formed continuously over the entire area of the pad region 33. The pad 55 is connected to the conductive pattern 50 of the fourth wiring layer (see FIG. 3A) via via-plugs V5.

The wirings 41-44, 51, 52, the conductive pattern 50, the pad 55 and the via-plugs V1-V5 may be formed of a metal material such as aluminum, copper, and the like.

Figure 4:
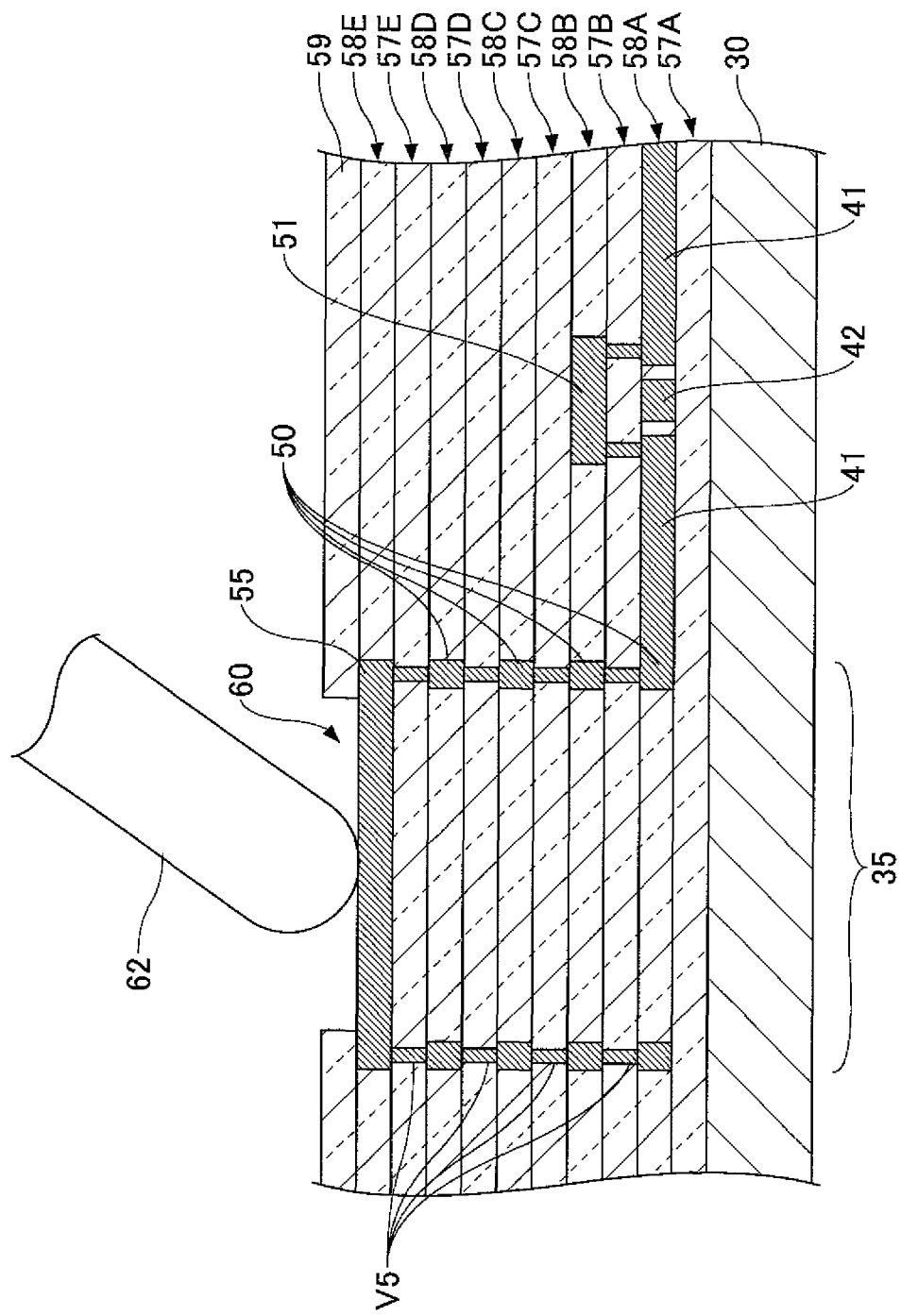
FIG. 4 is a cross-sectional diagram representing the neighborhood of a pad before the dicing to form the semiconductor device of the first embodiment.

FIG. 4 is a cross-sectional diagram taken alone a one-dotted line 3-3 in FIG. 3B.

Referring to FIG. 4, it can be seen that the via layers 57A-57E and the wiring layers 58A-58E are stacked alternately over the semiconductor wafer 30. Each of the via-layers 57A-57E includes an insulation film and one or more via-plugs formed in the insulation film. On the other hand, each of the via-layers 58A-58E includes an insulation film and one or more conductive patterns such as a wiring disposed in the insulation film.

Referring to FIG. 4, the first wiring layer 58A includes the gate wiring 41 and the source wiring 42. The gate wiring 41 is interrupted by the source wiring 42. Further, each of the pad regions 33 formed in the first through fourth wiring layers 58A-58D includes a ring-shaped conductive pattern 50. Further, the pad region 33 of the uppermost wiring layer 58E includes the pad 55 formed of a solid and thus continuous conductive film. The via-layers 57B-57E of the second through fifth layers are formed with the via-plugs V5. On the other hand, no via-plug is formed in the pad region 33 for the first via-layer 57A.

The second wiring layer 58B includes the wiring 51 that connects the interrupted gate wirings 41.

Each of the via-plugs V5 of the second through fourth layers functions to connect two conductive patterns 50 adjacent with each other in the thickness direction. The via-plugs V5 of the fifth wiring layer connect the conductive pattern 50 of the fourth wiring layer to the pad 55 of the uppermost wiring layer.

Further, a protective film 59 of an insulating material is formed over the wiring layer 58E of the fifth layer. An opening 60 is formed in the protective film 59 for exposing the top surface of the pad 55.

By contacting a probe 62 to the pad 55, it becomes possible to measure the electric characteristics of the monitoring device 40 (see FIG. 2A). After measuring the electric characteristics of the monitoring device 40, the semiconductor wafer 30 is diced along the scribe lines 31 (see FIGS. 2A-2B, FIGS. 3A-3B). If necessary, there may be provided a protection to the surface of the semiconductor wafer 30 before the dicing process by polyimide or the like.

Figure 5A:
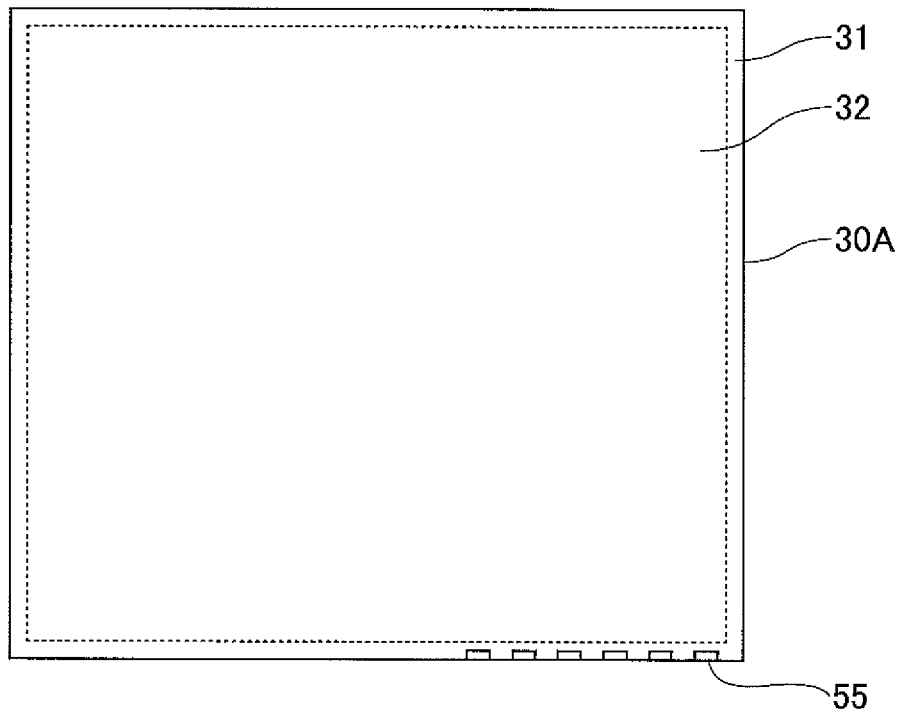
FIG. 5A is a plan view diagram of the semiconductor device of the first embodiment.

FIG. 5A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

FIG. 5B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. Further, there are disposed a plurality of via-pugs V5 in a row along a part 33B of the outer periphery of the pad 55 wherein the part 33B is offset slightly inward from the edge of the semiconductor substrate 30A.

FIG. 5C is a horizontal sectional diagram representing the wiring layers 58B-58D (see FIG. 4) of the second through fourth wiring layers.

Referring to FIG. 5C, there remains a part of the conductive pattern 50 in the form of a line shaped pattern along the part 33B of the outer periphery of the pad region 33 offset from the edge of the semiconductor substrate 30A. Further, there are disposed a plurality of via-plugs V5 so as to overlap the conductive pattern 50.

Before explaining the effect of the first embodiment, a comparative example will be explained.

Figure 6:
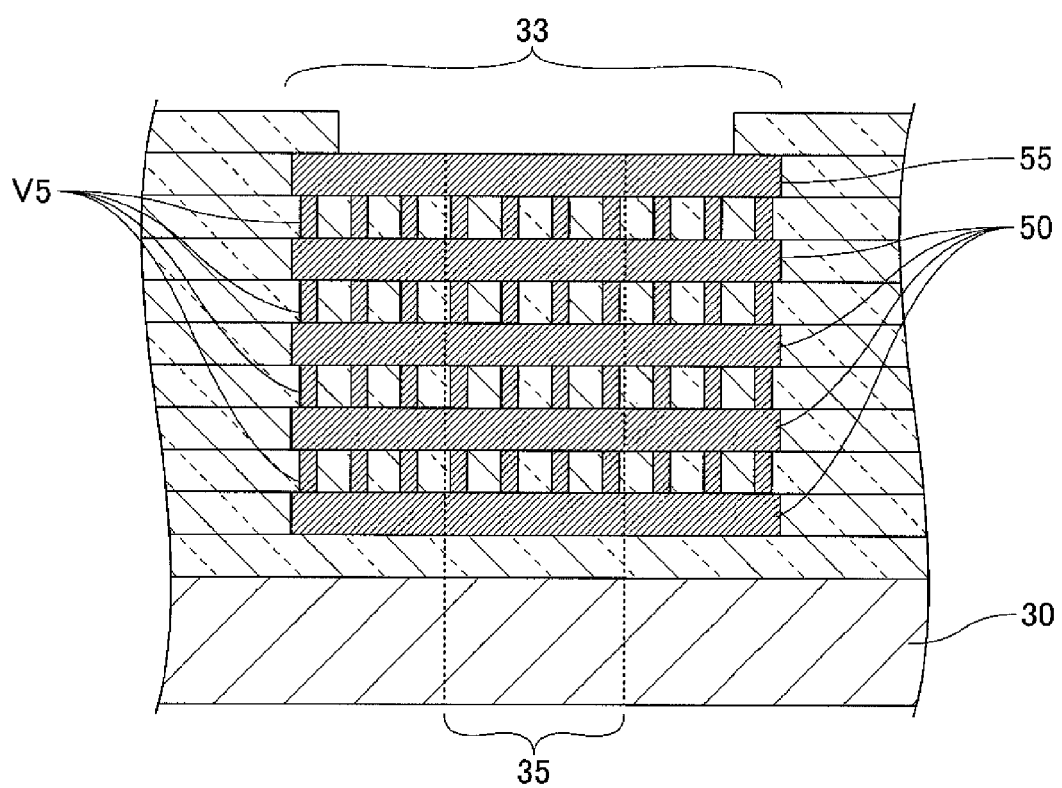
FIG. 6 is a cross-sectional diagram representing a pad region of a semiconductor device according to a comparative example.

FIG. 6 is a cross-sectional diagram of the pad region of the semiconductor device according to the comparative example.

Referring to FIG. 6, with the illustrated comparative example, it will be noted that all the conductive patterns 50 of the first through fourth layers and the pad 55 of the fifth wiring layer are formed of a solid conductive film. Further, the conductive patterns 50 and further the via-plugs V5 constituting the pad 55 are distributed generally uniformly over the pad region 33. Thus, at the time of the dicing process, the dicing blade removes the removal region 35 including the central part of the pad region 33.

Figure 7A:
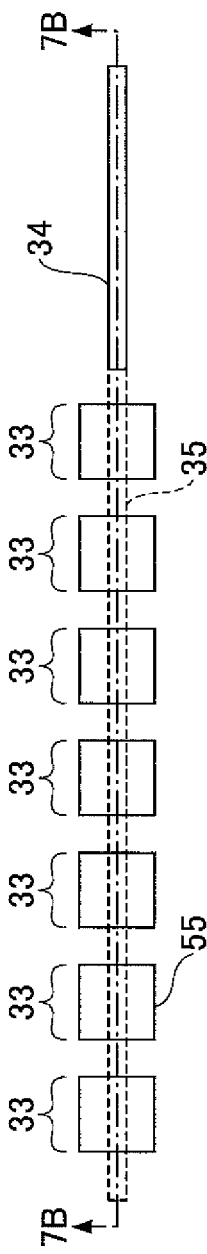
FIG. 7A is a plan view diagram representing a scribe line and a dicing blade before the dicing to form the semiconductor device of the comparative example.

FIG. 7A is a plan view diagram representing the pad region 33, the dicing blade 34 and the removal region 35 for a semiconductor wafer 300 according to the comparative example.

Referring to FIG. 7A, it can be seen that the removal region 35 passes generally through the respective centers of the plurality of pad regions 33. It should be noted that each of the pad regions 33 includes the pad 55 formed of the solid conductive film.

Figure 7B:
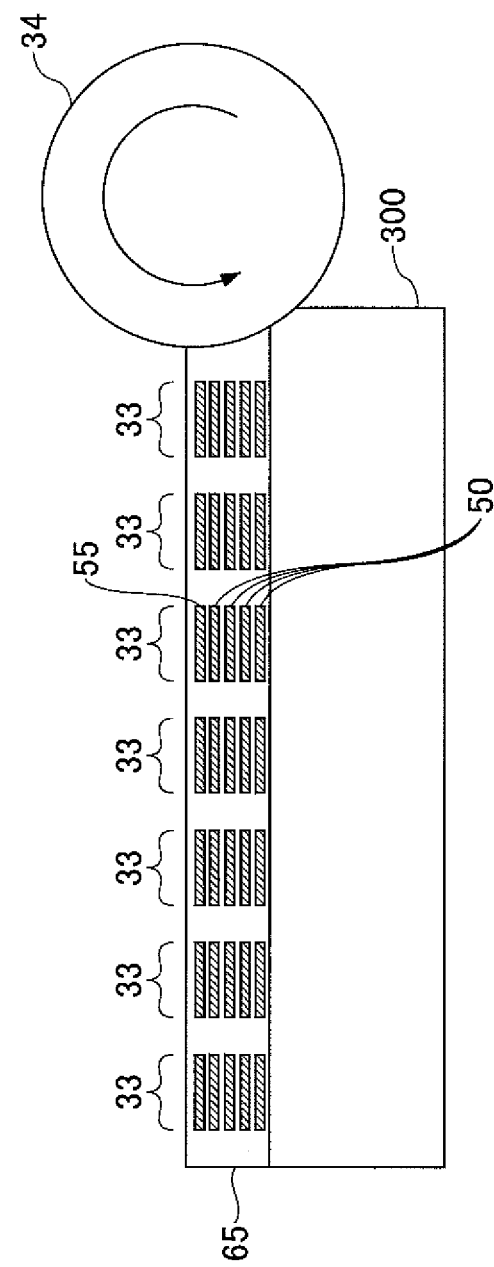

FIG. 7B is a cross-sectional diagram taken along a line 7B-7B of FIG. 7A. Referring to FIG. 7B, there are formed multilayer interconnection structures 55 each including via-layers and wiring layer s over the semiconductor wafer 30. The multilayer wiring structure 65 includes the pad 55 and the conductive patterns 50. The dicing process is conducted by moving the rotating dicing blade 34 from the right edge to the left edge of FIG. 6B.

Figure 7C:
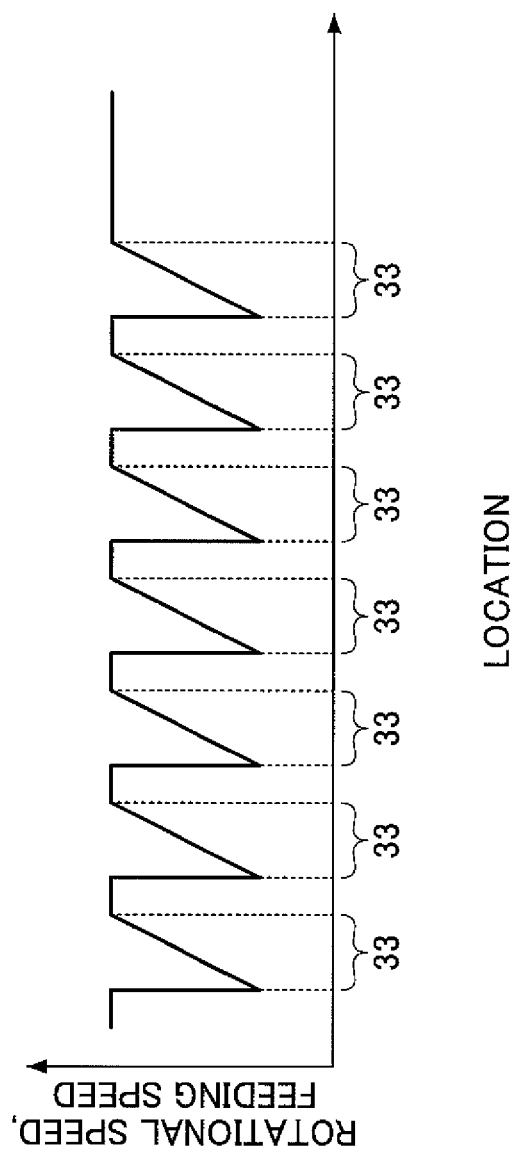
FIG. 7C is a graph representing the relationship between a rotational speed or feeding speed and a location of the dicing blade.

FIG. 7C represents an example of the rotational speed or feeding speed of the dicing blade 34 at the time of the dicing process. In FIG. 7C, the horizontal axis represents a location of the dicing blade along the scribe line while the vertical axis represents the rotational speed or feeding speed of the dicing blade 34.

Referring to FIG. 7C, it will be noted that there arises a situation in which the rotational speed and the feeding speed of the dicing blade 34 become lower than a preset value because of the ductility of the metal constituting the pad 55 and the conductive patterns 50 when the dicing blade 34 (see FIG. 7B) has been moved in the left direction and the tip end of the dicing blade 34 has reached the pad region 33.

Further, when the tip end of the dicing blade 34 moved out from the pad region 33, the dicing blade 34 no longer experiences the effect of ductility of the metal. Thus, the rotational speed and the feeding speed of the dicing blade 34 recover the preset values. Now, when the rotational speed and the feeding speed of the dicing blade 34 are changed suddenly to recover the preset values, there can be a case in which cracks develop in the semiconductor wafer 30.

According to the experiments made by the inventors, it was discovered that the frequency of crack formation increases sharply when the total number of stacking of the conductive patterns 50 and the pad 55, respectively formed of a solid aluminum film and disposed in the pad region 33, has reached 5. In the case the total number of stacking of the conductive patterns 50 and the pad 55 is three, no crack formation was observed. These results indicate that the problem of crack formation can be effectively suppressed by reducing the volume of metals disposed in the region passed by the dicing blade 34 (the removal region 35) or by employing a metal distribution that reduces the effect of the metals upon the dicing blade 34.

FIG. 8A is a plan view diagram representing the pad region 33, the dicing blade 34 and the removal region 35 for the semiconductor wafer 30 of the first embodiment.

Referring to FIG. 8A, it can be seen that the removal region 35 passes generally through the respective centers of the plurality of pad regions 33. Further, it should be noted that each of the pad regions 33 includes the pad 55 formed of the solid conductive film.

FIG. 8B is a horizontal sectional diagram representing the wiring layer 58C or 58D (see FIG. 4) of the third or fourth wiring layers.

Referring to FIG. 8B, it can be seen that the conductor pattern 50 of the ring shape is formed in each of the pad regions 33.

FIG. 8C is a cross-sectional diagram taken along a line 8B-8B of FIGS. 8A and 8B. In FIG. 8C, it should be noted that the illustration of the wirings of the first and second layers represented in FIGS. 2A and 2B is omitted.

Referring to FIG. 8C, because the conductive patterns 50 of the first through fourth wiring layers have the ring-shaped plan view shape, the conductive film appears at the right edge and left edge of the respective pad regions 33 in the cross-section of FIG. 8C while no conductive film appears in the inner part the pad region 33.

Figure 8D:
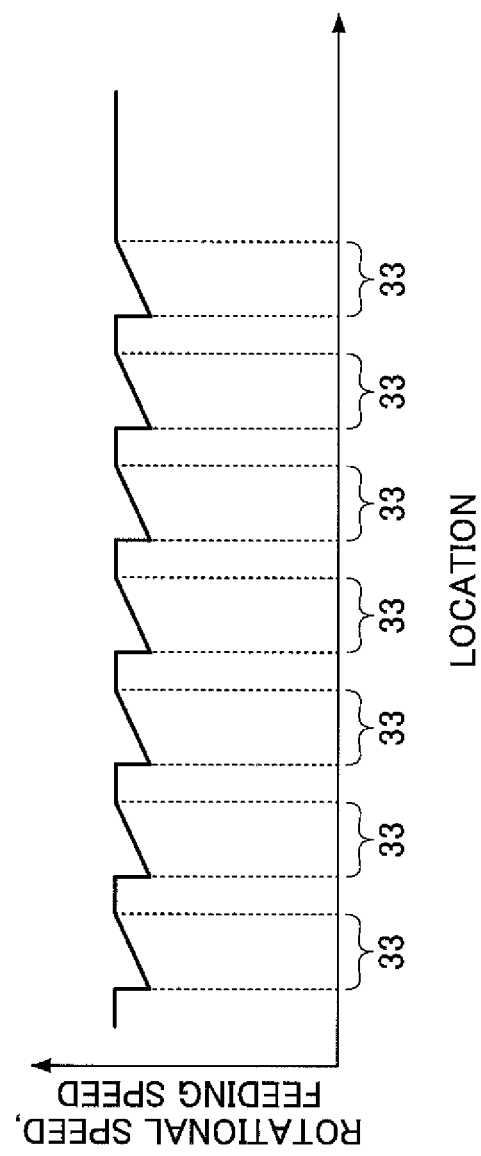
FIG. 8D is a graph representing the relationship between the rotational speed or feeding speed and the location of the dicing blade.

FIG. 8D represents an example of the rotational speed or feeding speed of the dicing blade 34 at the time of the dicing process. It should be noted that the horizontal axis and the vertical axis of FIG. 8D correspond to those of FIG. 7C.

Referring to FIG. 8D, it will be noted that there arises a situation in which the rotational speed and the feeding speed of the dicing blade 34 become lower than a preset value because of the ductility of the metal constituting the pad 55 and the conductive patterns 50 when the dicing blade 34 (FIG. 8C) has been moved in the left direction and the tip end of the dicing blade 34 has reached the pad region 33. In the present embodiment, however, because the conductive patterns 50 of the first through fourth wiring layers have the ring-shaped plan view shape, the effect of the ductility of the metals exerted upon the dicing blade 34 is reduced substantially as compared with the comparative example. Thus, the range of dropping of the rotational speed and the feeding speed of the dicing blade 34 is much smaller than the case of the comparative example represented in FIG. 7C. Likewise, the range of change of the rotational speed and the feeding speed at the time of recovering the present values as the tip end of the dicing blade 34 has moved out the pad region 33 is much smaller than the case of the comparative example represented in FIG. 7C. Thus, the risk of the crack formation in the semiconductor wafer 30 is reduced substantially as compared with the comparative example.

In order to reduce the effect of ductility of the conductive patterns 50 of the first through fourth wiring layers upon the dicing blade 34 further, it is preferable to set the width of the region surrounded by the inner peripheral line of the conductive patterns 50 (the size of the scribe line 31 in the width direction) to be larger than the width of the removal region 35.

Next, the effect of forming the conductive pattern 50 in the pad region 33 to have the ring shaped pattern upon the pattern layout designing will be explained with reference to FIGS. 9A and 9B.

Figure 9A:
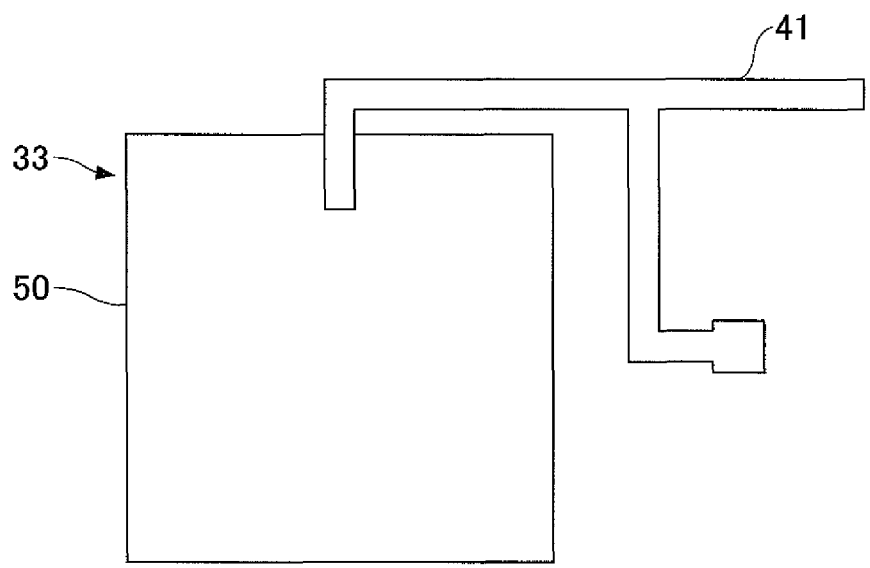

FIG. 9A is a plan view diagram of the pattern represented by the pattern data of the conductive pattern 50 formed in the pad region 33 and the wiring 41 for the comparative example represented in FIG. 6.

Referring to FIG. 9A, the conductive pattern 50 is formed of a solid conductive film formed continuously over the entire area of the pad region 33. The layout of the conductive pattern 50 is designed in advance to the layout design of the wiring 41 or the like used for connecting to the monitoring device 40 (see FIG. 2A). At the time of the layout designing of the wiring 41 or the like, the shape and the layout of the wiring 41 is determined such that a part of the wiring 41 overlaps with the pad region 33. Further, by synthesizing the pattern data of the wiring 41 and the pattern data of the conductive pattern 50, the pattern data of the wiring layer in which the wiring 41 and the conductive pattern 50 are disposed is obtained.

Figure 9B:
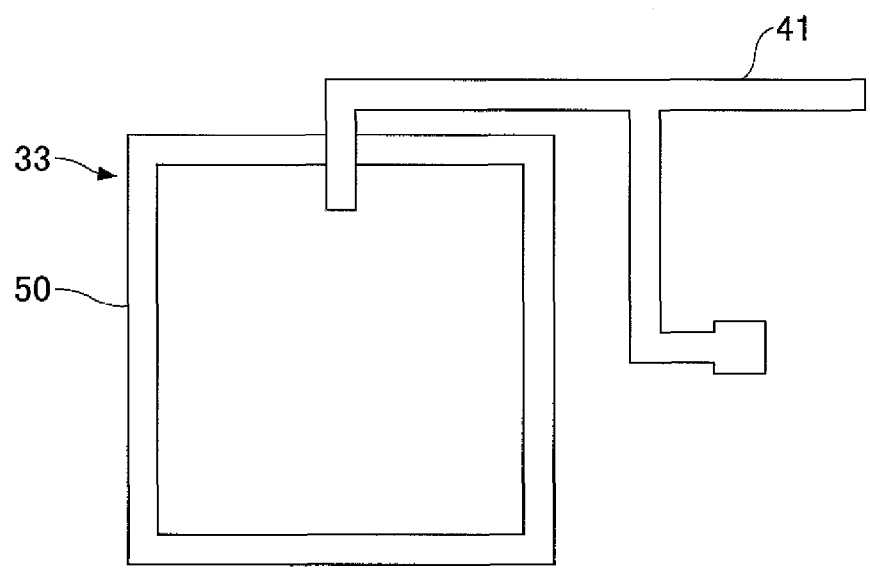
FIG. 9B is a plan view diagram representing the patterns corresponding to the pattern data of the conductive pattern and the wiring pattern formed inside the pad region for the semiconductor device of the first embodiment.

FIG. 9B is a plan view diagram of the pattern represented by the pattern data of the conductive pattern 50 and the wiring 41 of the semiconductor device of the first embodiment.

Referring to FIG. 9B, the conductive pattern 50 is formed of a ring-shaped conductive film formed along the outer periphery of the pad region 33. At the time of the layout designing of the wiring 41, the shape and the layout of the wiring 41 is determined such that a part of the wiring 41 overlaps with the pad region 33 similarly to the case of FIG. 9A. When the wiring 41 overlaps the pad region 33, the wiring 41 inevitably overlaps the ring-shaped conductive pattern 50. Thus, for the layout designing of the wiring 41, a procedure similar to the one applied to the structure (see FIG. 6) in which the conductive pattern 50 is formed of a solid conductive film.

While the foregoing description has been made for the example in which there are five wiring layers, the present embodiment and the embodiments to be described hereinafter are not limited to such five wiring layers or a specific number of the wiring layers but is applicable also to the cases in which the number of the wiring layers is smaller or larger than five.

According to the present embodiment, it becomes possible to reduce, at the time of dicing, the adversary effect of ductility of the metal material constituting the conductive pattern on the dicing blade used for the dicing. With this, it becomes possible to suppress the formation of cracks in the semiconductor substrate.

Second Embodiment

Next, a second embodiment will be described. Hereinafter, only the difference to the first embodiment will be described and the explanation for those parts of the same construction will be omitted.

FIG. 10A is a cross-sectional diagram of the semiconductor wafer 30 including the stacked structure formed thereon according to a second embodiment. It should be noted that the cross-sectional diagram of FIG. 10A corresponds to the cross-sectional diagram of FIG. 4 for the first embodiment. The members represented in the cross-section of FIG. 10A are designated by the same reference numerals used for the corresponding members of FIG. 4.

In the first embodiment, all of the conductive patterns 50 of the first through fourth layers have the ring-shaped plan view shape. With the second embodiment, the conductive pattern 50 for the second wiring layer 58B is formed by a solid or continuous conductive film. According to the experiments of the inventors, it was discovered that there occurs no cracking at the time of the dicing process when the number of the solid conductive films disposed in the pad region 33 is three or less. Thus, the second embodiment is also effective for preventing the crack formation.

Figure 10B:
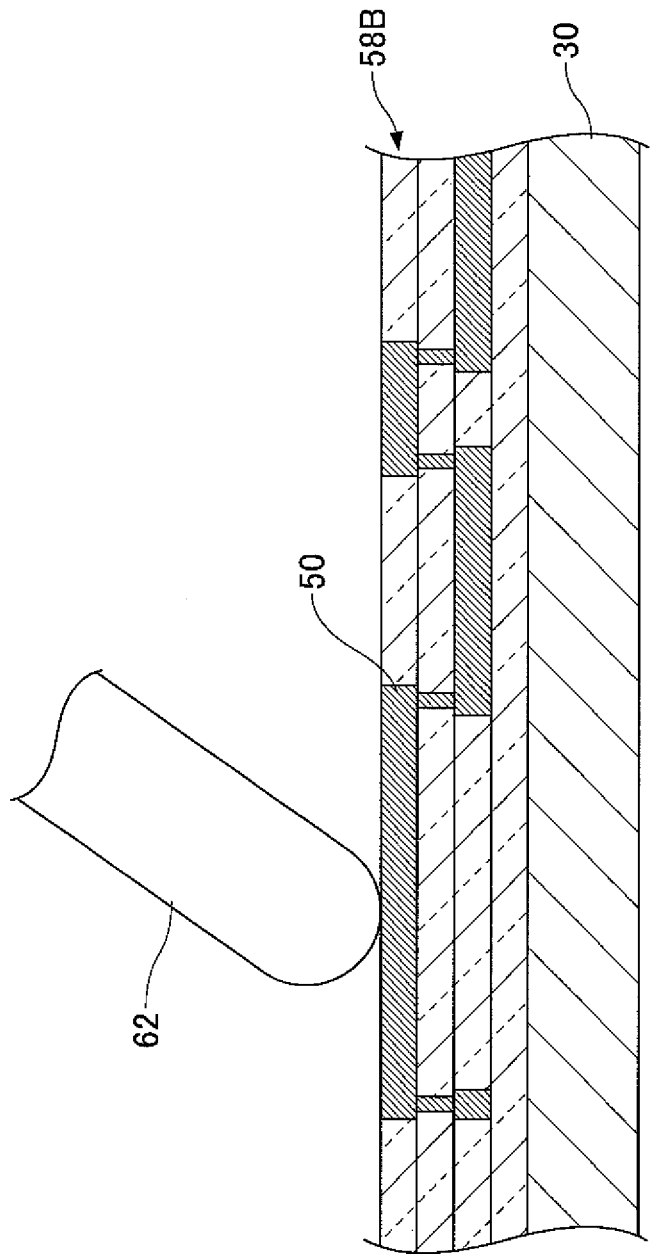
FIG. 10B is a cross-sectional diagram representing a stage in which the second layer wiring layer is formed in the semiconductor device of the second embodiment.

FIG. 10B is a cross-sectional diagram at the time the second layer wiring layer 58B is formed.

As represented in FIG. 10B, the connection between the conductive pattern 50 and the monitoring device 40 is completed at the moment when the second wiring layer 58B is formed. Thereby, it becomes possible to measure the electric characteristics of the monitoring device 40 by contacting a probe 62 to the pad 2 (see FIG. 2A).

According to the present embodiment, it becomes possible to measure the electric characteristics of the monitoring device 40 before forming the uppermost wiring layer 58E by forming the conductive pattern 50 located in the wiring layer lower than the uppermost wiring layer in the form of a solid or continuous conductive film. It should be noted, however, at the moment the first wiring layer 58A is formed, the interconnection between the conductive pattern 50 and the monitoring device 40 is not yet established as represented in FIG. 2A. It is preferable to form the conductive pattern 50 of the wiring layer formed in the step of completing the connection between the conductive pattern 50 and the monitoring device 40 in the form of a solid or continuous conductive film.

Further, it is possible to form the conductive pattern 50 of the wiring layer above the second wiring layer in the form of the solid or continuous conductive film. In order to suppress the crack formation, it is preferable that the number of the solid or continuous films in the stack does not exceed three including the pad 55 of the uppermost wiring layer.

At the time the wafer processing is completed, it is preferable to form the pad 55 of the solid or continuous conductive film in the pad region 33 of the uppermost wiring layer for the measurement of the electric characteristics of the monitoring device 40.

While the foregoing description has been made for the example in which there are five wiring layers, the present embodiment and the embodiments to be described hereinafter are not limited to such five wiring layers or a specific number of the wiring layers but is applicable also to the cases in which the number of the wiring layers is smaller or larger than five.

Because the semiconductor device obtained with the present embodiment after the dicing process is similar to those explained previously with reference to FIGS. 5A-5C, further explanation thereof will be omitted.

Third Embodiment

Next, a third embodiment will be described. Hereinafter, only the difference to the semiconductor device of the first embodiment will be described and the explanation for those parts of the same construction will be omitted.

Figure 11A:
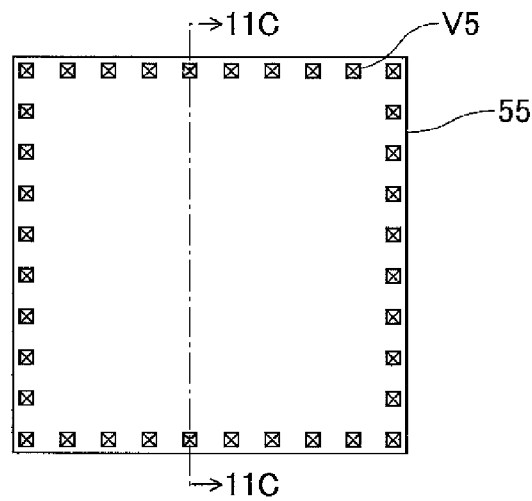
FIG. 11A is a plan view diagram representing the uppermost pad before the dicing to form a semiconductor device according to a third embodiment.

FIG. 11A is a plan view diagram representing the pad 55 on the semiconductor wafer 30 according to the third embodiment in a state before a dicing process.

Referring to FIG. 11A, the semiconductor device of the third embodiment has the pad 55 and the via-plugs V5 underneath respectively constructed identically to the pad 55 and the via-plugs V5 of the first embodiment. It should be noted, however, that the arrangement of the via-plugs V5 may not be necessarily identical to the arrangement of the via-plugs V5 of the first embodiment.

Figure 11B:
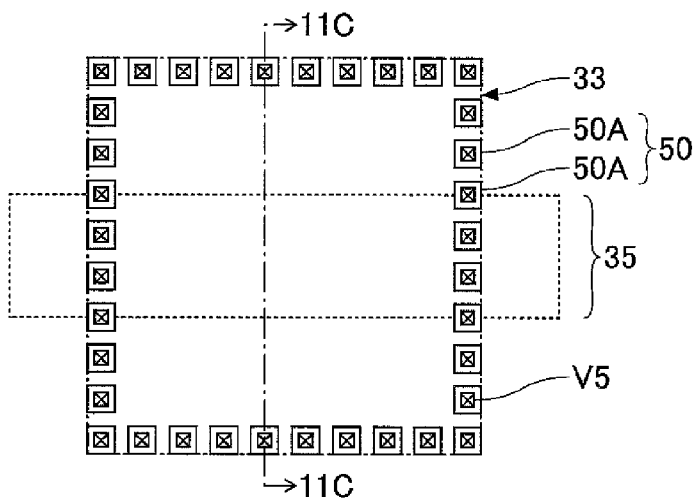
FIG. 11B is a horizontal sectional diagram of a conductive pattern inside the pad region in a wiring layer lower than the uppermost wiring layer in the state before the dicing for the semiconductor device of the third embodiment.

FIG. 11B is a plan view diagram representing the conductive patterns 50 of the first through fourth layers.

Referring to FIG. 11B, the conductive pattern 50 is formed of a plurality of dot patterns 50A. The dot patterns 50A are disposed in the pad region 33 so as to align along the outer periphery thereof. In one dot pattern 50A, there is disposed one via-plug V5. However, it should be noted that the number of the via-plug V5 disposed in one dot pattern 50A is not limited to one and it is also possible to dispose a plurality of via-plugs V5 as long as such arrangement is possible.

In the semiconductor device obtained after the dicing at the removal region 35, an arrangement is obtained for the dot patterns 50A such that the dot patterns 50A are aligned along a part of the outer periphery of the pad region 33 not coincident to the edge of the semiconductor substrate formed which is formed after the dicing. By disposing the dot patterns 50A like this, it becomes possible to reduce the effect of ductility of the metals upon the dicing blade 34.

Preferably, the dot patterns 50A are formed smaller than the thickness of the dicing blade 34. By reducing the size of the dot patterns 50A to be smaller than the thickness of the dicing blade 34, it becomes possible to reduce the problem of dropping of the rotational speed or feeding speed of the dicing blade 34 caused by the ductility of the metals. Thereby, occurrence of cracking is suppressed.

Further, in the case the plurality of dot patterns 50A are separated from each other by an insulation film such as a silicon oxide film or silicon nitride film, the effect of the ductility of metals upon the rotational speed or feeding speed of the dicing blade 34 is reduced. Such an arrangement in which the metals disposed in the scribe line 31 are divided into a plurality of dot patterns of the size smaller than the thickness of the dicing blade 34 is preferable also from the view point of dicing into chips.

Figure 11C:
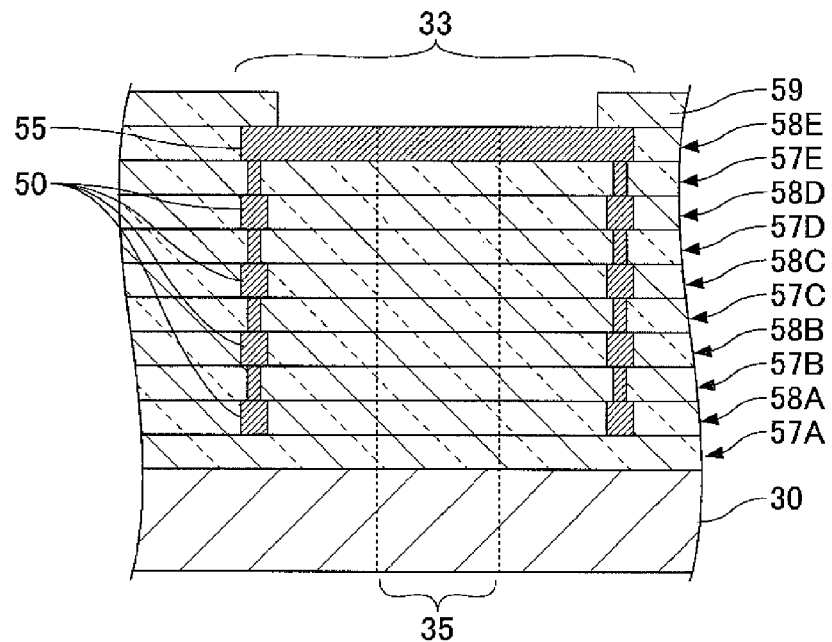
FIG. 11C is a cross-sectional diagram of the semiconductor device taken along a one-dotted line 11C-11C represented in FIGS. 11A and 11B.

FIG. 11C is a cross-sectional diagram taken along a line 11C-11C of FIGS. 11A and 11B.

Referring to FIG. 11C, only the pad 55 of the uppermost wiring layer is formed by a solid or continuous conductive film, while the conductive patterns of the first through fourth wiring layers are formed of a plurality of dot patterns 50A (see FIG. 11B).

Next, the effect of forming the conductive pattern 50 in the pad region 33 in the form of plurality of dot patterns 50A upon the pattern layout designing will be explained with reference to FIGS. 12A-12C.

Figure 12A:
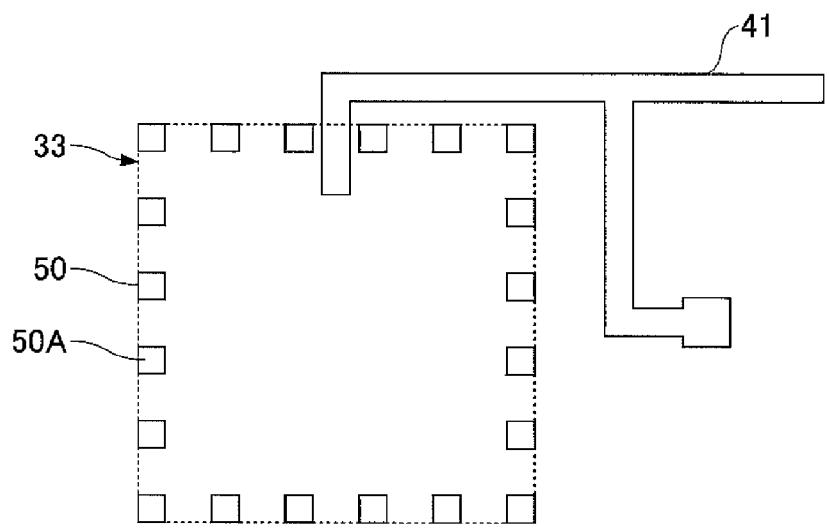

FIG. 12A represents an example in which the wiring 41 is designed to have a layout in which a part of the wiring 41 overlaps the pad region 33.

Referring to FIG. 12A, it can be seen that the wiring 41 invades into the pad region 33 by passing between a pair of dot patterns 50A. In this example, the wiring 41 is not connected to the conductive pattern 50.

Figure 12B:
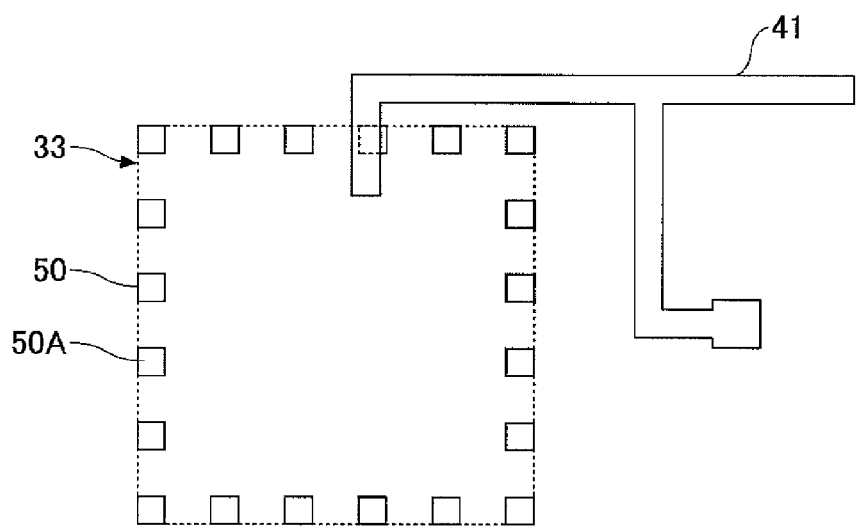
FIGS. 12B and 12C are respectively plan view diagrams representing the layout of the pad region before the dicing to form the semiconductor device of the third embodiment.

FIG. 12B represents an example in which the wiring 41 is designed to have a layout in which a part of the wiring 41 overlaps one dot pattern 50A. In this example, the wiring 41 is connected to the conductive pattern 50.

Referring to FIG. 12B, the condition that a part of the wiring 41 overlaps the pad region 33 is not enough at the time of layout of the wiring when the interval between the dot patterns 50A is larger than the width of the wiring 41. In such a case, the layout of the wiring 41 has to be determined under the condition that a part of the wiring 41 overlaps at least one dot pattern 50A.

Figure 12C:
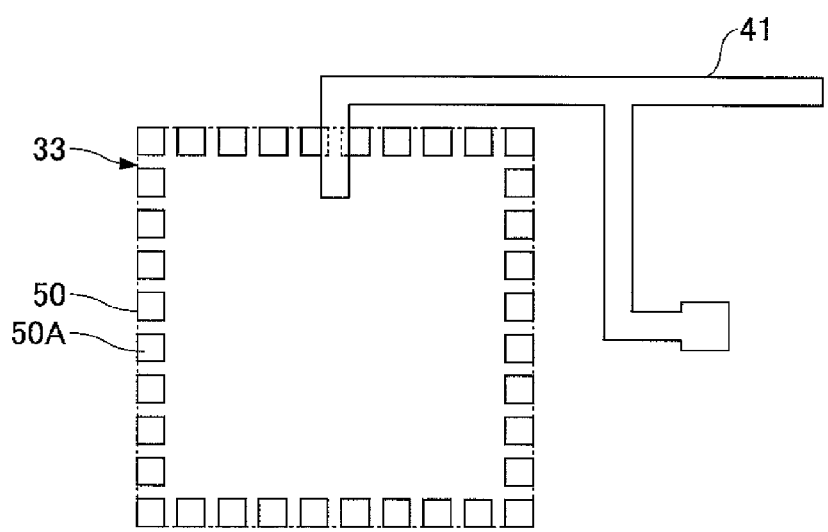

FIG. 12C represents an example of the layout for the case the interval between the dot patterns 50A is narrower than the width of the wiring 41. In such a case, the wiring 41 overlaps at least one dot pattern 50A when the layout designing is made for the wiring 41 such that a part of the wiring 41 overlaps the pad region 33. Thus, in such a case, the layout of the wiring 41 may be determined at the time of layout designing of the wiring 41 under the condition such that a part of the wiring 41 overlaps the pad region 33.

Figure 13:
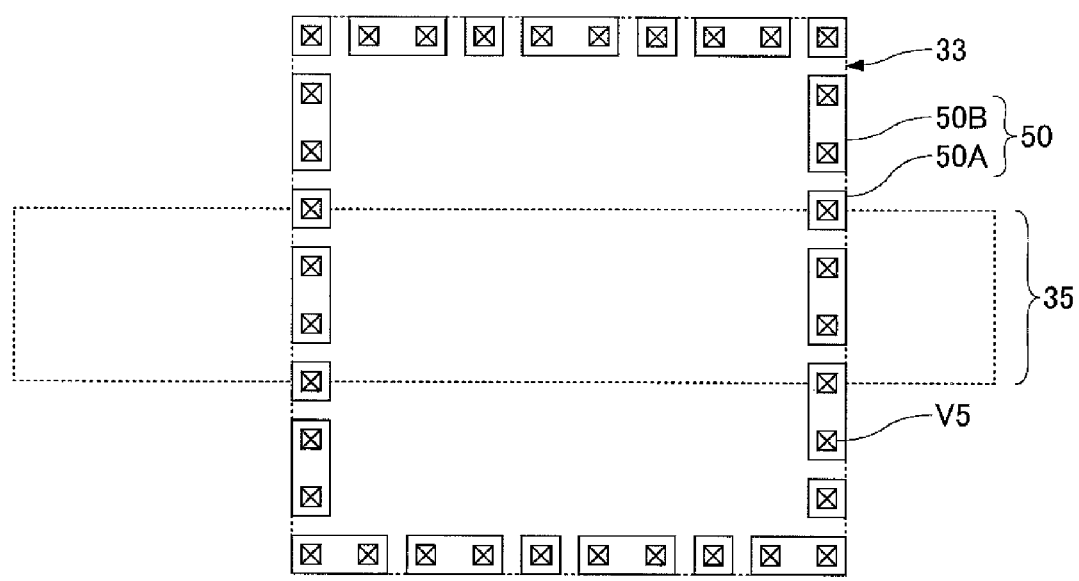
FIG. 13 is a horizontal cross-sectional diagram representing a conductive pattern inside the pad region of the wiring layer lower than the uppermost wiring layer before the dicing to form a semiconductor device according to a modification of the third embodiment.

FIG. 13 is a plan view diagram of the conductive patterns 50 of the first through fourth wiring layers before the dicing for a semiconductor device according to a modification of the third embodiment.

In the example represented in FIG. 11B, the conductive pattern 50 is formed only by the dot patterns 50A. In the modification of FIG. 13, the conductive pattern 50 is formed by the dot patterns 50A and also by rectangular patterns 50B. The rectangular patterns 50B are disposed such that a longer edge thereof extends along the outer periphery of the pad region 33. In one rectangular pattern 50B, there are disposed a plurality of via-plugs V5, two for example.

With the third embodiment or the foregoing modification thereof, it becomes possible to further reduce the effect of the ductility of the metals constituting the conductive patterns 50 at the time of the dicing as compared with the first embodiment. With this, crack formation in the semiconductor wafer 30 is suppressed further.

Further, it is possible to form the conductive pattern 30 of some wiring layers by a solid or continuous conductive film also in the third embodiment or in the modification thereof similarly to the second embodiment represented in FIG. 10A.

Figure 14A:
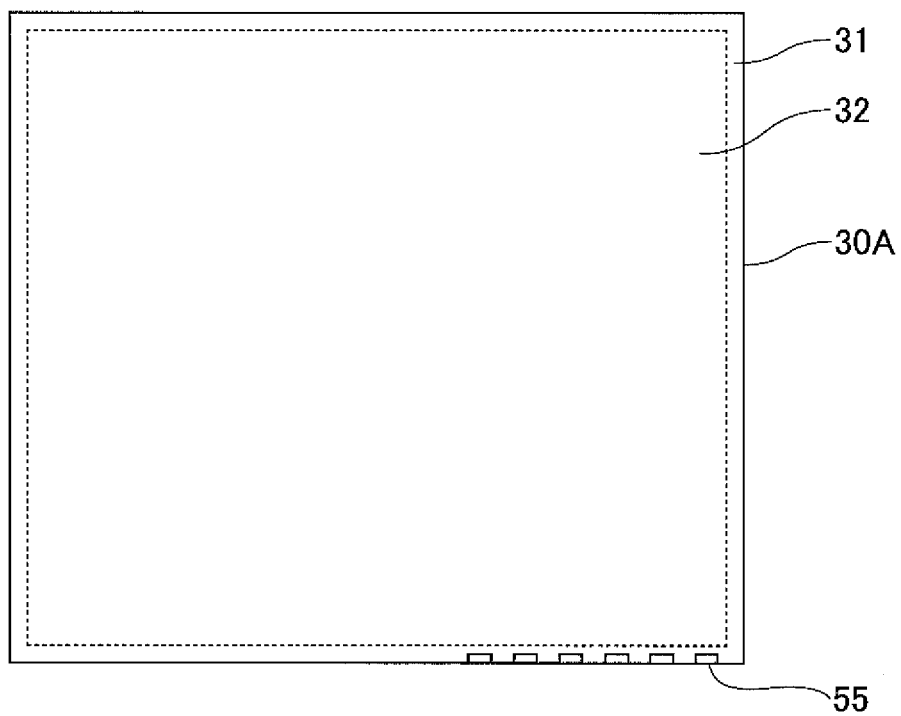
FIG. 14A is a plan view diagram of the semiconductor device according to the modification of FIG. 13.

FIG. 14A is a schematic plan view diagram of the semiconductor device of the present embodiment obtained by the dicing process. In the present embodiment, too, the semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

Figure 14B:
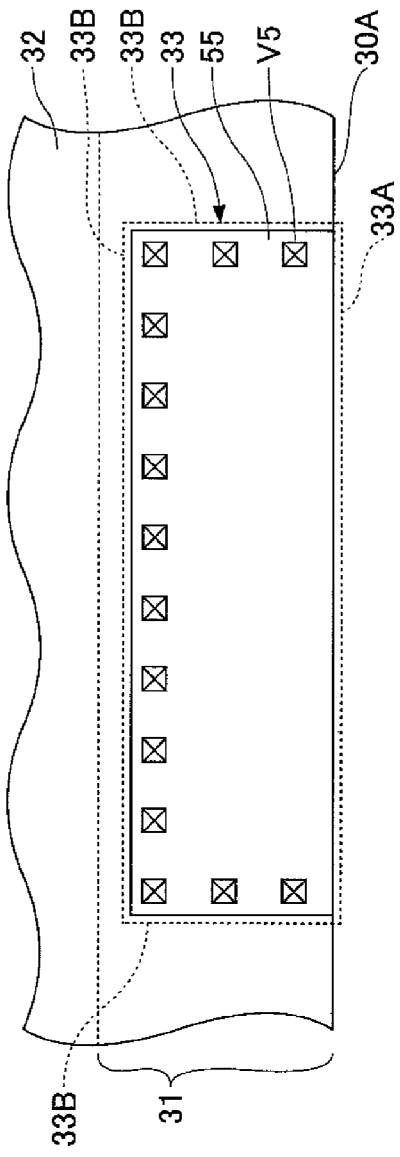

FIG. 14B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. Further, there are disposed a plurality of via-pugs V5 in a row along a part 33B of the outer periphery of the pad 55 wherein the part 33B is offset slightly inward from the edge of the semiconductor substrate 30A FIG. 14C is a horizontal sectional diagram representing the wiring layers 58B-58D (see FIG. 4) of the second through fourth wiring layers.

Figure 14C:
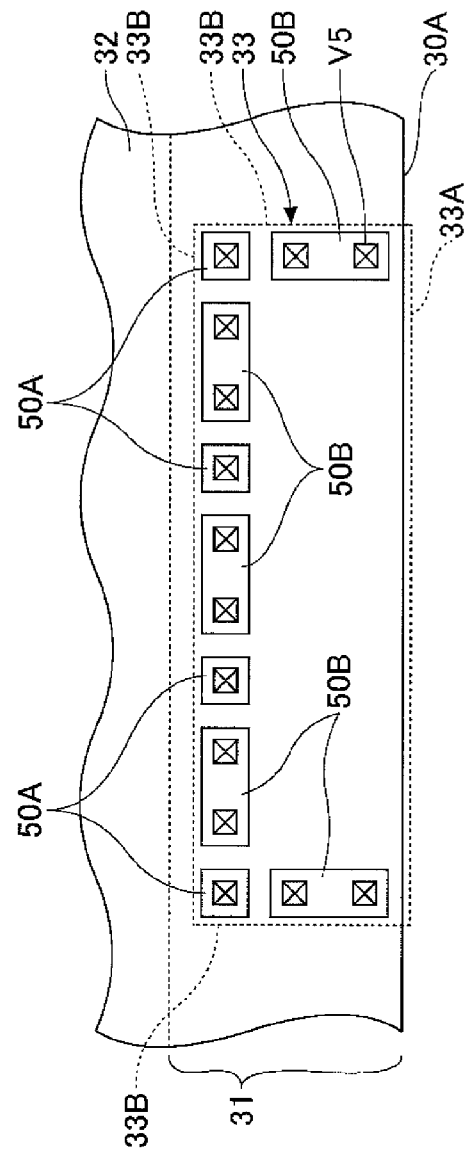
FIG. 14C is a horizontal sectional diagram representing the pad region of a wiring layer lower than the uppermost wiring layer.

Referring to FIG. 14C, there remain conductive patterns 50A and 50B along the part 33B of the outer periphery of the pad region 33 offset from the edge of the semiconductor substrate 30A. The conductive pattern 50A is provided with a single via-plug V5 while the conductive pattern 50B is provided with a pair of neighboring via-plugs V5. The conductive patterns 50A and 50B are disposed in a row along the outer periphery 33B of the pad region 22.

Fourth Embodiment

Next, a fourth embodiment will be described. Hereinafter, only the difference to the first embodiment will be described and the explanation for those parts of the same construction will be omitted.

Figure 15A:
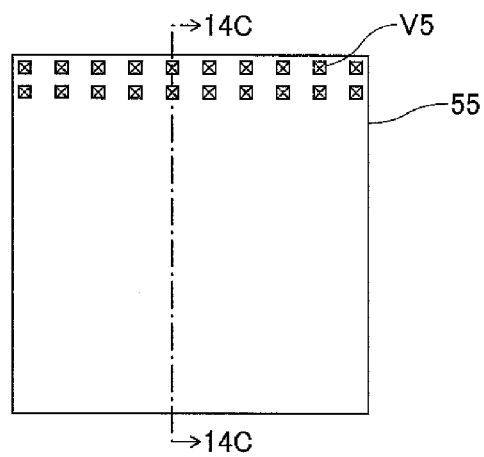
FIG. 15A is a plan view diagram representing the uppermost pad before the dicing to form a semiconductor device according to a fourth embodiment.

FIG. 15A is a plan view diagram representing the pad 55 on the semiconductor wafer 30 according to the fourth embodiment in a state before the dicing process.

FIG. 15A represents that the plan view shape of the uppermost pad 55 of the present embodiment is identical to that of the pad 55 of the first embodiment represented in FIG. 3B.

Figure 15B:
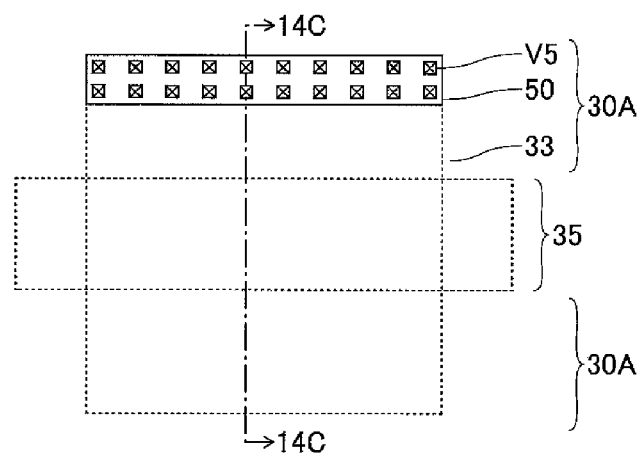
FIG. 15B is a horizontal sectional diagram of a conductive pattern inside the pad region in a wiring layer lower than the uppermost wiring layer in the state before the dicing to form the semiconductor device of the fourth embodiment.

FIG. 15B is a plan view diagram representing the conductive patterns 50 of the first and third and fourth wiring layers.

Referring to FIG. 15B, it can be seen that the conductive pattern 50 is disposed only in one of the two regions formed by dividing the pad region 33 by the removal region 35 (the upper region of the removal region 35 in the example of FIG. 13B). The conductive pattern 50 is formed by a conductive film of a rectangular shape disposed along a part of the outer periphery of the pad region extending parallel with the removal region 35. The conductive pattern 50 is thereby disposed with offset from the removal region 35. After the dicing process, the conductive pattern is disposed with an offset from the edge of the individual semiconductor substrates 30A formed as a result of the dicing.

In FIG. 15B, it should be noted that there remains no conductive pattern in the pad region 33 after the dicing for those semiconductor substrates 30A that are located at a lower side of the removal region 35 in the sheet of FIG. 15B.

Figure 15C:
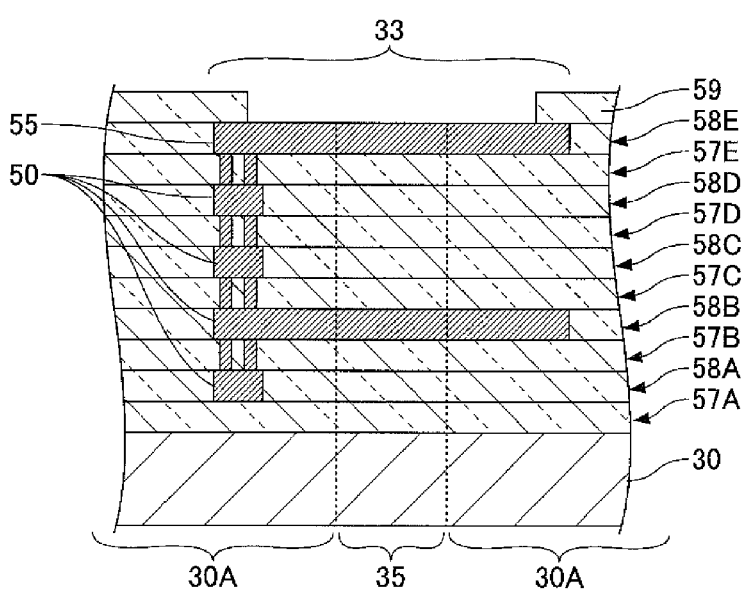
FIG. 15C is a cross-sectional diagram of the semiconductor device taken along a one-dotted line 14C-14C represented in FIGS. 15A and 15B.

FIG. 15C is a cross-sectional diagram taken along a line 14C-14C of FIGS. 15A and 15B.

Referring to FIG. 15C, it can be seen that, in the case of the present embodiment, the conductive pattern 50 of the second wiring layer and the pad 55 of the uppermost wiring layer are formed of the solid or continuous conductive film formed over the entire pad region 33. Further, the conductive patterns 50 of the first, third and fourth wiring layers are disposed only at one side in the pad region 33 with regard to the removal region 35. While the conductive patterns 50 of the first, third and fourth wiring layers are disposed at the left side of the removal region 35 in the example of FIG. 13C, it is possible to dispose the conductive pattern 50 of the first layer at the right side of the removal region or it is possible to dispose the conductive patterns 50 of the third and fourth wiring layers at the right side of the removal region 35. In any case, the conductive patterns 50 are disposed at a location offset from the edge of the semiconductor substrate 30A obtained as a result of the dicing process.

In the fourth embodiment, the ductility of the conductive films of the two wiring layers, the conductive pattern 50 of the second wiring layer and the pad 55 of the uppermost wiring layer, exerts an effect upon the rotation of the dicing blade, while the conductive patterns 50 of the first, third and fourth wiring layers exert no effect upon the rotation of the dicing blade. Thus, it becomes possible to suppress the formation of cracks in the semiconductor wafer 30. As noted, the conductive pattern 50 of the second wiring layer is formed of the solid or continuous conductive film that is formed over the entire pad region 33. Thus, it becomes possible to measure the electric characteristics of the monitoring device 40 (see FIG. 2A) in the stage in which the second wiring layer 58B is formed similarly to the second embodiment represented in FIG. 9B.

Figure 16A:
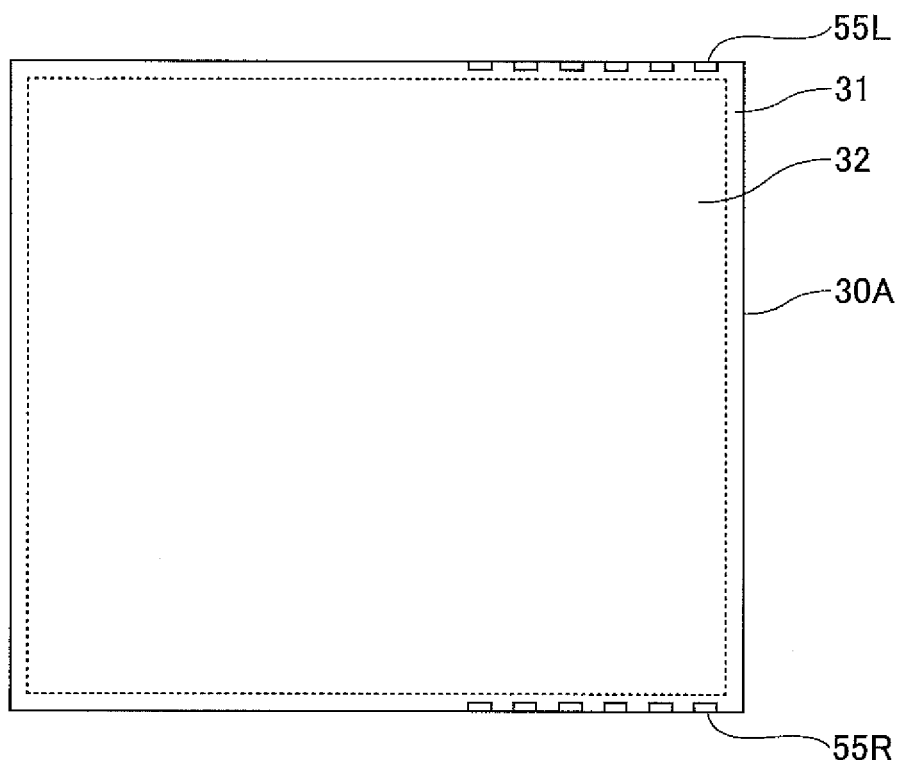
FIG. 16A is a plan view diagram of the semiconductor device of the fourth embodiment.

FIG. 16A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55. In the present embodiment, the pads 55 remaining on the semiconductor substrate 30A includes a series of pads 50R formed along one edge and a series of pads 50L formed along an opposite edge, wherein the pads 55R and 55L are not identical as will be explained later.

Figure 16B:
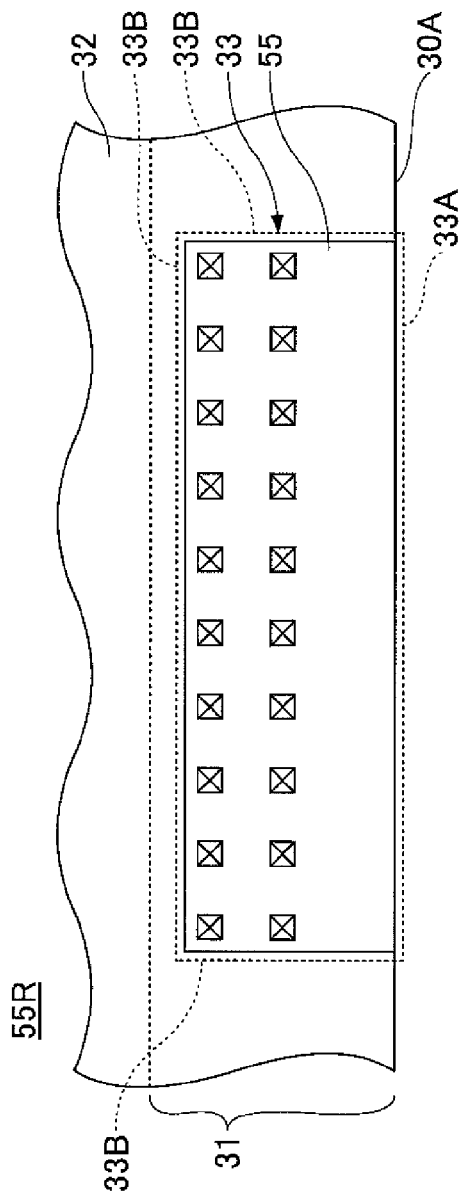

FIG. 16B is a plan view diagram of the remaining pads 55R. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. Further, there are disposed a plurality of via-pugs V5 in two rows along a part 33B of the outer periphery of the pad 55 wherein the part 33B is offset slightly inward from the edge of the semiconductor substrate 30A FIG. 16C is a horizontal sectional diagram representing the wiring layers 58B-58D (see FIG. 4) of the second through fourth wiring layers.

Figure 16C:
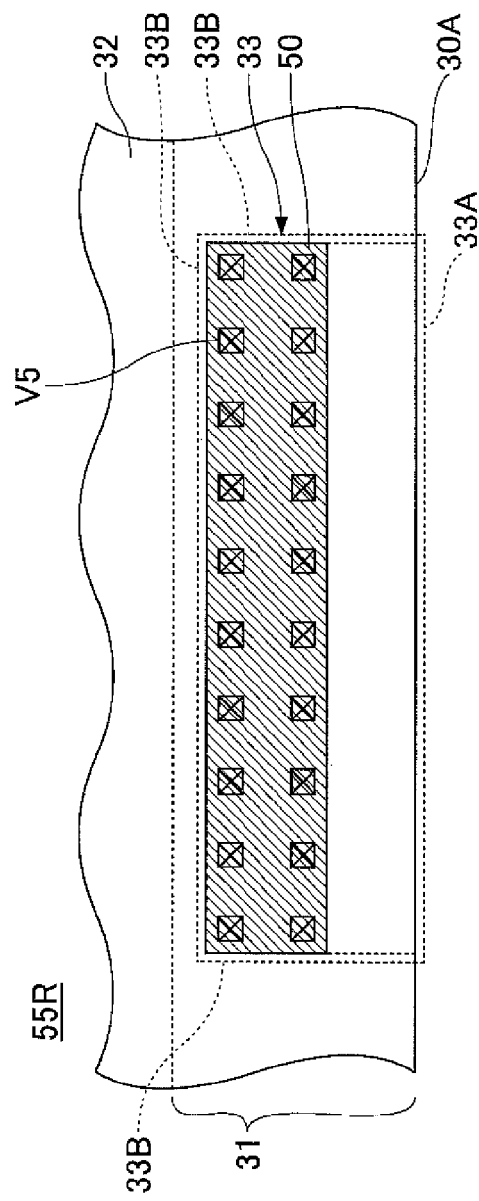
FIG. 16C is a horizontal sectional diagram representing the pad region of a wiring layer lower than the uppermost wiring layer.

Referring to FIG. 16C, there extends the conductive pattern 50 in the form of a line shaped pattern along the part 33B of the outer periphery of the pad region 33 offset from the edge of the semiconductor substrate 30A. Further, there are disposed a plurality of via-plugs V5 in two rows so as to overlap the conductive pattern 50.

Figure 17A:
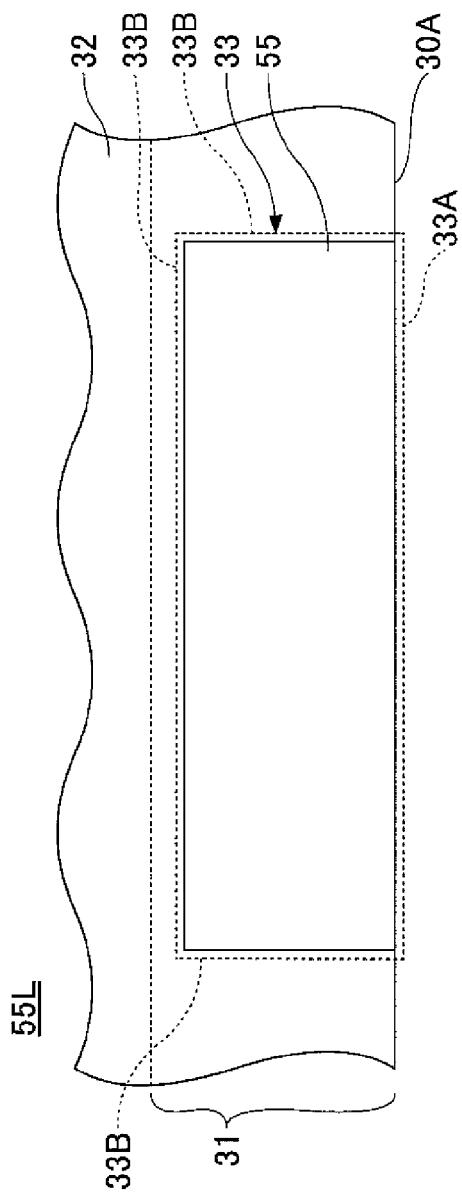
Figure 17B:
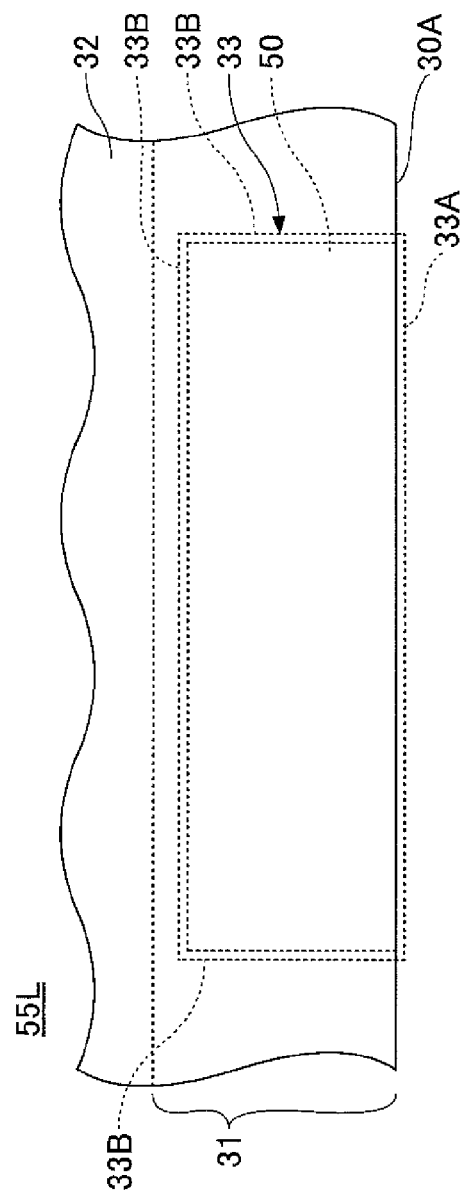
FIG. 17B is a horizontal sectional diagram of the pad region corresponding to FIG. 17A for the wiring layer lower than the uppermost wiring layer.

FIG. 17A is a plan view diagram of the remaining pads 55L. In the pad 55L, too, a part 33A of the outer periphery of the pad 33 is formed coincident to the edge of the semiconductor substrate 30A after the dicing process. Further, the pad 55 is formed of a solid conductive film such as a metal film formed continuously within the pad region 33. It should be noted however, that no via-plugs V5 are disposed upon the pad 55L.

Fifth Embodiment

Next, a fifth embodiment will be described. Hereinafter, only the difference to the first embodiment will be described and the explanation for those parts of the same construction will be omitted.

Figure 18A:
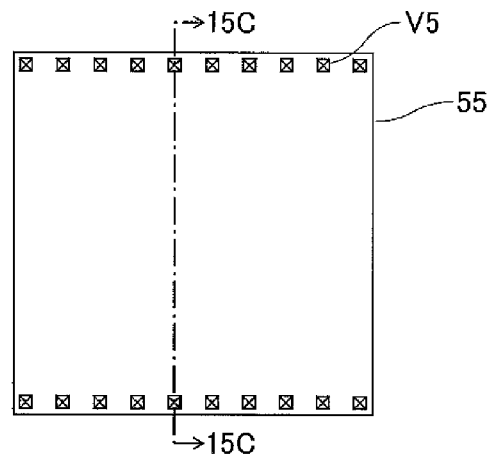
FIG. 18A is a plan view diagram representing the uppermost pad before the dicing to form a semiconductor device according to a fifth embodiment.

FIG. 18A is a plan view diagram representing the pad 55 on the semiconductor wafer 30 according to the fifth embodiment in a state before the dicing process.

In FIG. 18A, the plan view shape of the uppermost pad 55 of the present embodiment is identical to that of the pad 55 of the first embodiment represented in FIG. 3B.

Figure 18B:
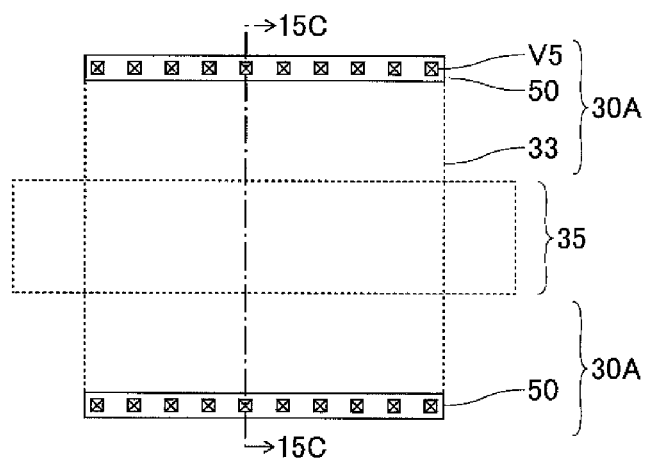
FIG. 18B is a horizontal sectional diagram of a conductive pattern inside the pad region in a wiring layer lower than the uppermost wiring layer in the state before the dicing to form the semiconductor device of the fifth embodiment.

FIG. 18B is a plan view diagram representing the conductive patterns 50 of the first, third and fourth wiring layers.

Referring to FIG. 18B, the conductive patterns 50 are disposed to the respective two regions of the pad region 33 that is divided by the removal region 35. The conductive pattern 50 is formed by a conductive film of a rectangular shape disposed along a part of the outer periphery of the pad region extending parallel with the removal region 35. The conductive pattern 50 is thereby disposed with offset from the removal region 35. After the dicing process, the conductive pattern is disposed with an offset from the edge of the individual semiconductor substrates 30A formed as a result of the dicing.

Figure 18C:
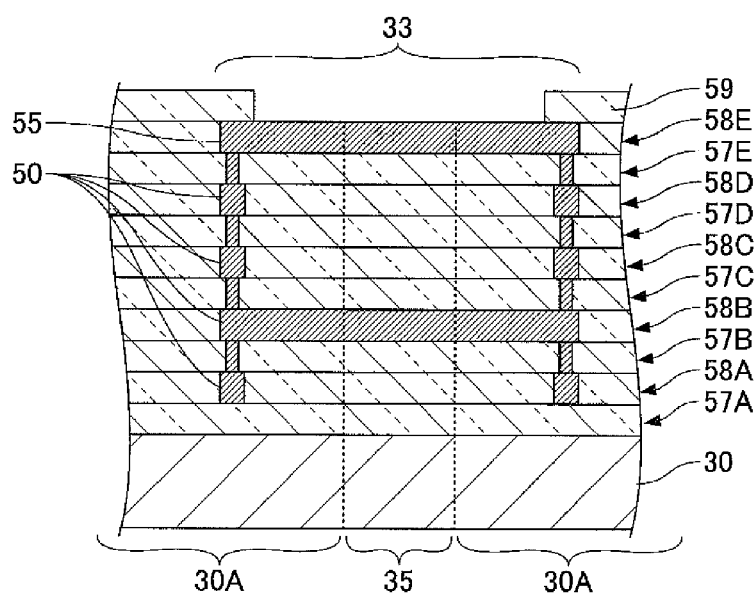
FIG. 18C is a cross-sectional diagram of the semiconductor device taken along a one-dotted line 15C-15C represented in FIGS. 18A and 18B.

FIG. 18C is a cross-sectional diagram taken along a line 15C-15C of FIGS. 18A and 18B.

Referring to FIG. 18C, it will be noted that the conductive pattern 50 of the second wiring layer and the pad 55 of the uppermost wiring layer are formed of the solid or continuous conductive film formed over the entire pad region 33. Further, the conductive patterns 50 of the first, third and fourth wiring layers are disposed at a location offset from the removal region 35.

In the fifth embodiment, too, the conductive patterns 50 of the first, third and fourth wiring layers do not exert any effect upon the rotation of the dicing blade similarly to the fourth embodiment. Thus, it becomes possible to suppress the formation of cracks in the semiconductor wafer 30. Further, the conductive pattern 50 of the second wiring layer is formed of the solid or continuous conductive film that is formed over the entire pad region 33. Thus, it becomes possible to measure the electric characteristics of the monitoring device 40 (see FIG. 2A) in the stage in which the second wiring layer 58B is formed similarly to the second embodiment represented in FIG. 10B.

Figure 19A:
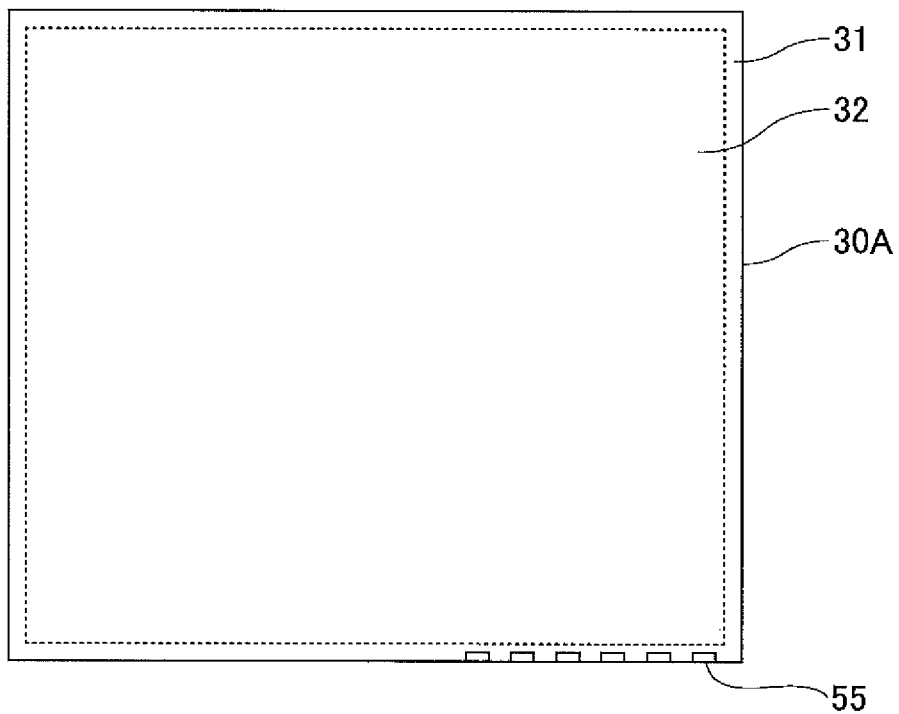
FIG. 19A is a plan view diagram of the semiconductor device of the fifth embodiment.

FIG. 19A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

Figure 19B:
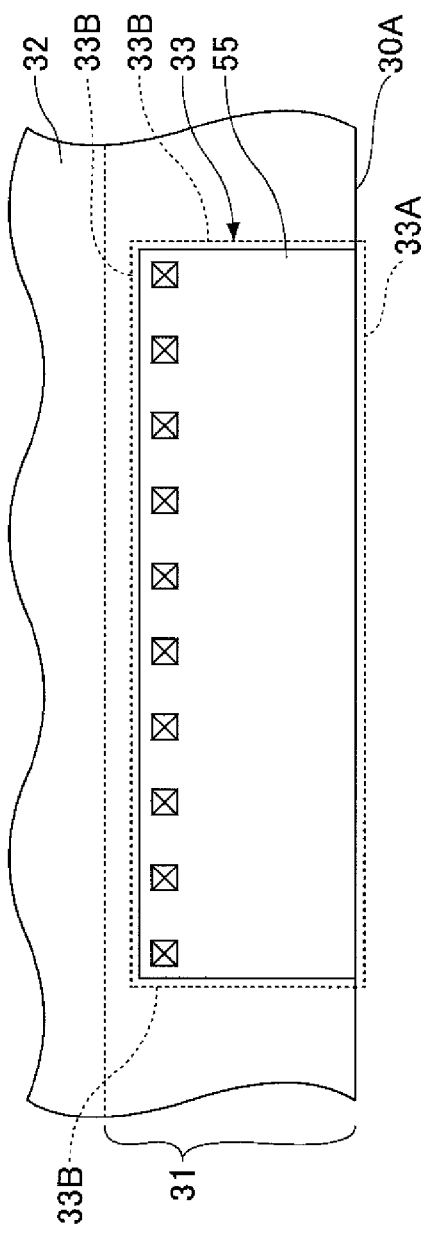

FIG. 19B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. Further, there are disposed a plurality of via-pugs V5 in a row along a part 33B of the outer periphery of the pad 55 wherein the part 33B is offset slightly inward from the edge of the semiconductor substrate 30A FIG. 19C is a horizontal sectional diagram representing the wiring layers 58B-58D (see FIG. 4) of the second through fourth wiring layers.

Figure 19C:
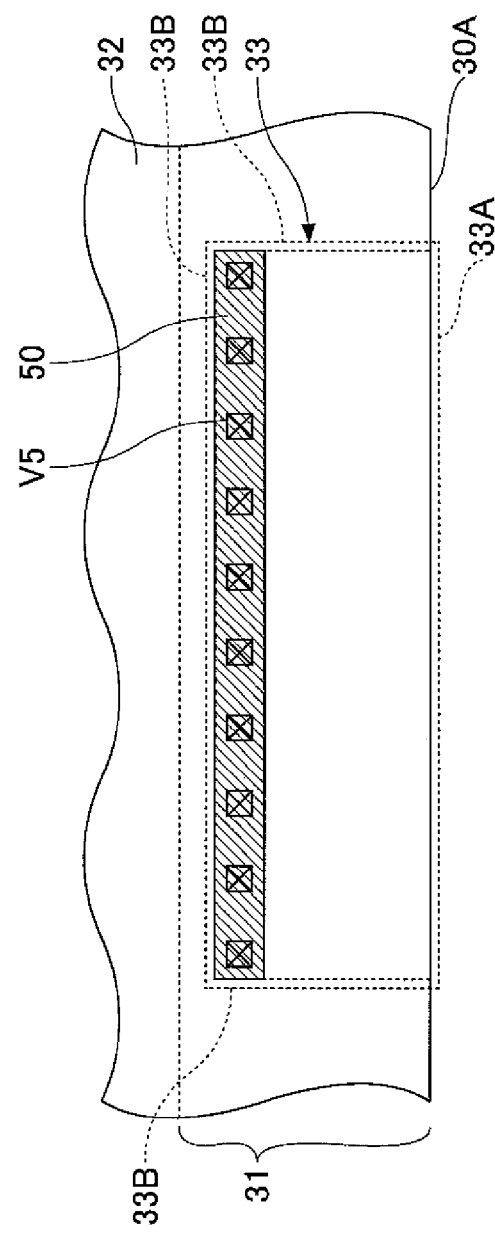
FIG. 19C is a horizontal sectional diagram representing the pad region of a wiring layer lower than the uppermost wiring layer.

Referring to FIG. 19C, there remains a part of the conductive pattern 50 in the form of a line shaped pattern along the part 33B of the outer periphery of the pad region 33 offset from the edge of the semiconductor substrate 30A. It will be noted that there are disposed a plurality of via-plugs V5 so as to overlap the conductive pattern 50.

Sixth Embodiment

Next, a sixth embodiment will be described. Hereinafter, only the difference to the first embodiment will be described and the explanation for those parts of the same construction will be omitted.

Figure 20A:
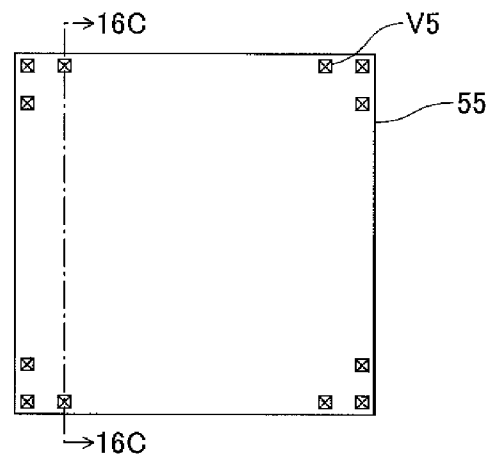
FIG. 20A is a plan view diagram representing the uppermost pad before the dicing to form a semiconductor device according to a sixth embodiment.

FIG. 20A is a plan view diagram representing the pad 55 on the semiconductor wafer 30 according to the sixth embodiment in a state before the dicing process.

FIG. 20A represents that the plan view shape of the uppermost pad 55 of the present embodiment is identical to that of the pad 55 of the first embodiment represented in FIG. 3B.

Figure 20B:
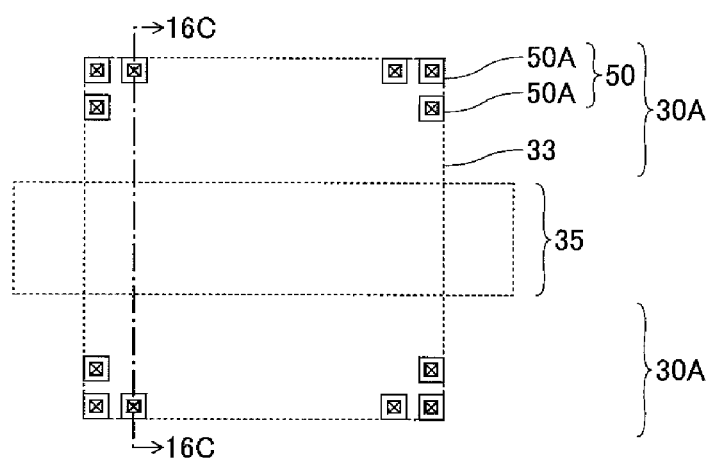
FIG. 20B is a horizontal sectional diagram of a conductive pattern inside the pad region in a wiring layer lower than the uppermost wiring layer in the state before the dicing to form the semiconductor device of the sixth embodiment.

FIG. 20B is a horizontal sectional diagram of the conductive patterns 50 of the wiring layers other than the uppermost wiring layer.

In FIG. 20B, the conductive pattern 50 is formed by dot patterns 50A that are disposed in the vicinity of the four corners of the pad region 33. In the illustrated example, there are disposed three dot patterns 50A in each of the four corners. Thereby, one of the three dot patterns 50A is disposed at a location corresponding to an apex of the pad region 33. The other two dot patterns 50A are disposed at the respective locations that are offset from the apex in two directions along the respective outer peripheries of the pad region 33. It should be noted that any of the dot patterns 50A is formed with offset from the removal region 35. After the dicing, the conductive patterns 50 of the first through fourth layers remain at the respective locations corresponding to those apexes of the pad region 33 offset from the edge of the semiconductor substrate 30A formed as a result of the dicing.

Figure 20C:
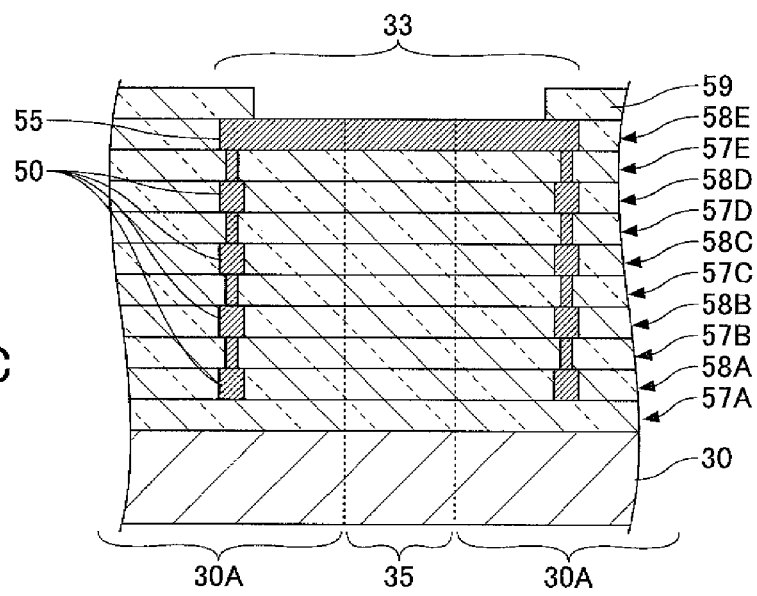
FIG. 20C is a cross-sectional diagram of the semiconductor device taken along a one-dotted line 16C-16C represented in FIGS. 20A and 20B.

FIG. 20C is a cross-sectional diagram taken along a line 16C-16C of FIGS. 20A and 20B.

Referring to FIG. 20C, it can be seen that the conductive patterns 50 of the first through fourth wiring layers are disposed at the respective sides of the removal region 35 with offset therefrom.

Figure 21A:
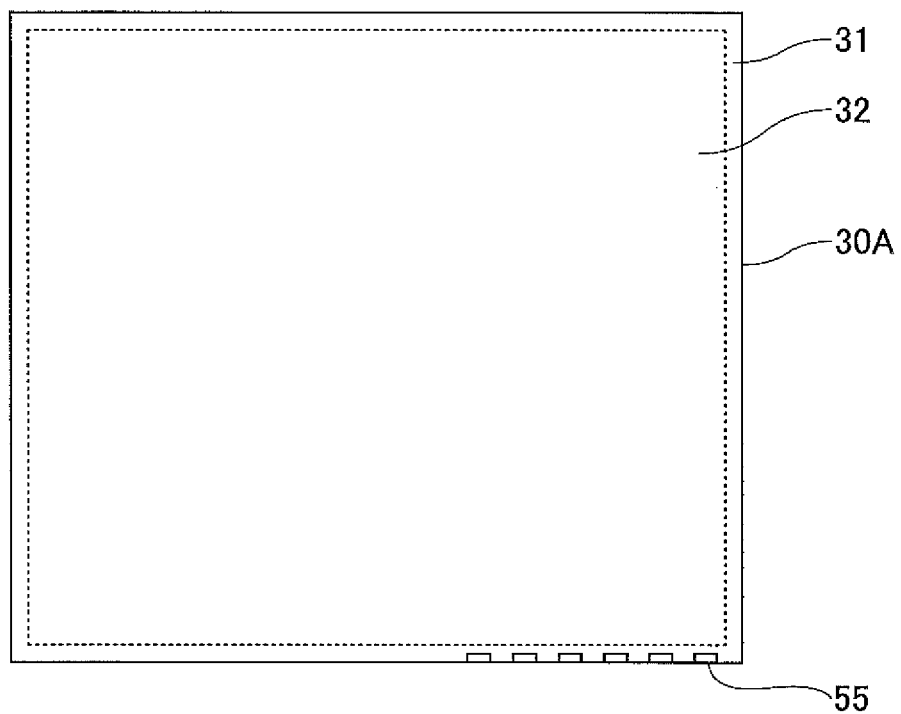
FIG. 21A is a plan view diagram of the semiconductor device of the sixth embodiment.

FIG. 21A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

FIG. 21B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. Further in correspondence to the apexes of the pad 55 located at the inner side of the outer periphery 11A, it can be seen that there are disposed an array of the via-plugs V5, three in the illustrated example.

FIG. 21C is a horizontal sectional diagram representing the wiring layers 58B-58D (see FIG. 4) of the second through fourth wiring layers.

Referring to FIG. 21C, there remain three conductive patterns 50 at the corners of the outer periphery of the pad region 33, and thus at the apexes of the pad region 33, that are offset from the edge of the semiconductor substrate 30A. Further, there are disposed three via-plugs V5 to overlap the three conductive patterns 50 respectively.

Figure 22:
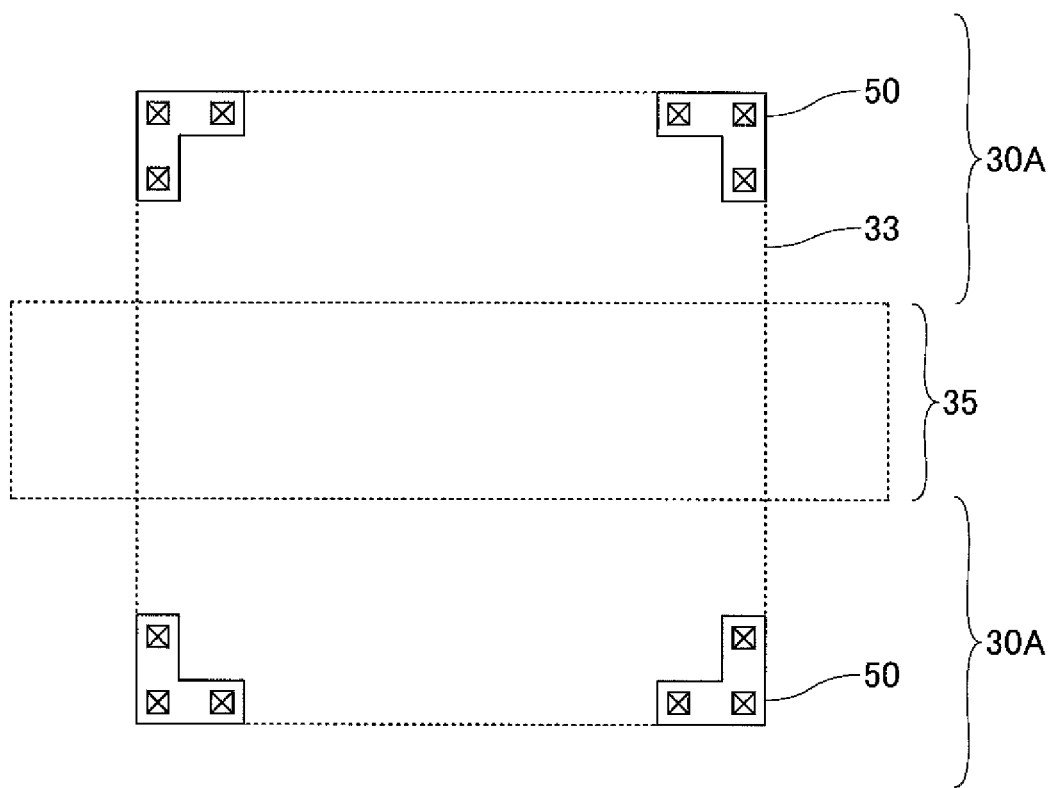
FIG. 22 is a horizontal cross-sectional diagram representing a conductive pattern inside the pad region of the wiring layer lower than the uppermost wiring layer before the dicing to form a semiconductor device according to a modification of the sixth embodiment.

FIG. 22 is a horizontal sectional view diagram representing the conductive patterns 50 in the stage before the dicing process for a semiconductor device according to a modification of the third embodiment.

In the modification of FIG. 22, there are disposed hook shaped patterns at the four corners of the pad region 33. The hook shaped pattern has a plan view shape that extends from an apex of the pad region 33 along the two edges. After the dicing, the hook shaped conductive patterns 50 remain at two of the apexes of the pad region 33 that are not adjacent to the edge of the diced semiconductor substrate 30A.

Similarly to the first embodiment, the conductive patterns 50 of the wiring layers 58A-58D excluding the uppermost wiring layer 58E do not exert an influence upon the rotation of the dicing blade with the sixth embodiment and also with the modification of the sixth embodiment. Thus, it becomes possible to suppress the formation of cracks in the semiconductor wafer 30.

With the sixth embodiment and the modification thereof, it is also possible to form the conductive patterns 50 of one or two of the wiring layers 58A-58D excluding the uppermost wiring layer 58E with a solid or continuous conductive film formed over the entire area of the pad region 33. According to such a construction, it becomes possible to measure the electric characteristics of the monitoring device 40 (see FIG. 2A) at the moment when the wiring layer including the conductive pattern 50 formed of the solid continuous conductive film is formed.

The plan view construction of the semiconductor device according to the modification of FIG. 22 is obvious from the explanation of FIG. 21 and the explanation thereof will be omitted.

Seventh Embodiment

Next, a seventh embodiment will be described. Hereinafter, only the difference to the semiconductor device of the first embodiment will be described and the explanation for those parts of the same construction will be omitted.

Figure 23A:
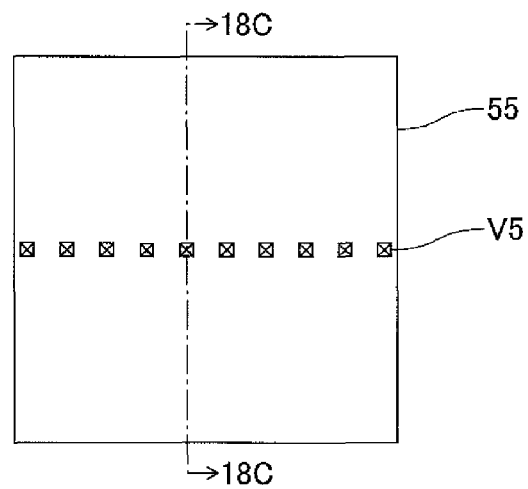
FIG. 23A is a plan view diagram representing the uppermost pad before the dicing to form a semiconductor device according to a seventh embodiment.

FIG. 23A is a plan view diagram representing the uppermost pad 55 of the semiconductor device according to the seventh embodiment. In FIG. 23A, the plan view shape of the uppermost pad 55 is identical to that of the pad 55 of the first embodiment represented in FIG. 3B.

Figure 23B:
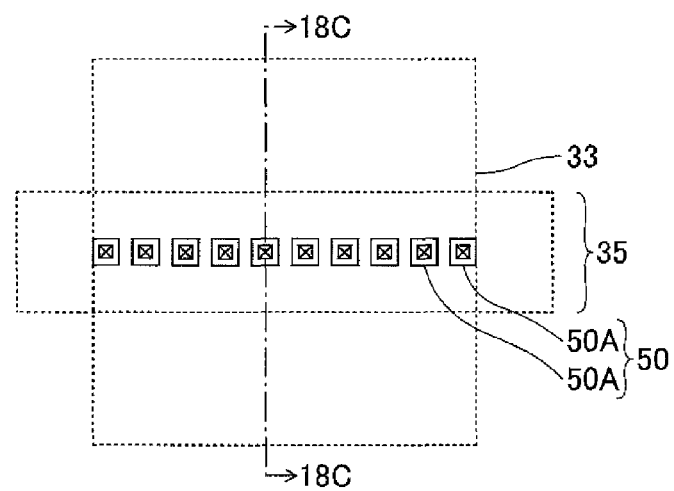
FIG. 23B is a horizontal sectional diagram of a conductive pattern inside the pad region of a wiring layer lower than the uppermost wiring layer in the state before the dicing to form the semiconductor device of the seventh embodiment.

FIG. 23B is a horizontal sectional diagram of the conductive patterns 50 disposed in the wiring layers other than the uppermost wiring layer. In FIG. 23B, each conductive pattern 50 is formed of a plurality of dot patterns 50A disposed within the removal region 35. Thereby, it will be noted that the dot patterns 50A are aligned in a row along the central line of the removal region 35. Each dot pattern 50A may be formed with a single via-plug V5 or a plurality of via-plugs V5.

Figure 23C:
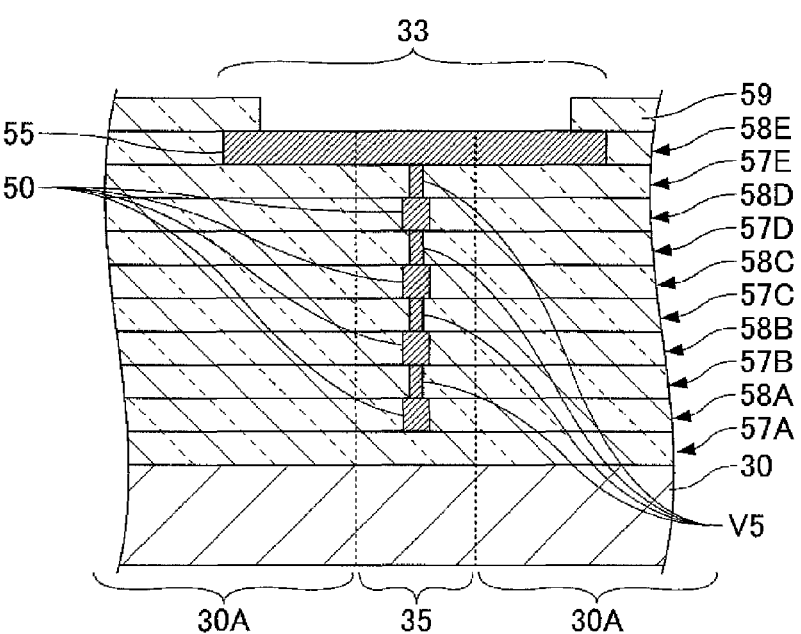
FIG. 23C is a cross-sectional diagram of the semiconductor device taken along a one-dotted line 18C-18C represented in FIGS. 23A and 23B.

FIG. 23C is a cross-sectional diagram taken along a line 18C-18C of FIGS. 23A and 23B.

Referring to FIG. 23C, it can be seen that the conductive patterns 50 of the first through fourth wiring layers and the via-plugs V5 of the second through fifth layers are disposed within the removal region 35. Thus, the dot patterns 50A has a size smaller than the width of the removal region 35. After the dicing, a part of the pad 55 of the uppermost wiring layer remains in the semiconductor device, while it should be noted that none of the conductive patterns of the wiring layers 58A-58D or the via-plugs of the via-layers 57A-57B remains in the semiconductor device after the dicing.

Thus, with the seventh embodiment, there is little influence of the ductility of the metals transmitted to the dicing blade 34 by the conductive patterns 50 of the wiring layers 58A-58D except for the uppermost wiring layer 58E similarly to the first embodiment, and little effect is exerted upon the rotational speed or feeding speed of the dicing blade. Thus, it becomes possible to suppress the formation of cracks in the semiconductor wafer 30.

With the seventh embodiment, too, it is also possible to form the conductive patterns 50 of one or two of the wiring layers 58A-58D excluding the uppermost wiring layer 58E with a solid or continuous conductive film formed over the entire area of the pad region 33. At the moment when the wiring layer including the conductive pattern 50, formed of the solid continuous conductive film, is formed, it becomes possible to measure the electric characteristics of the monitoring device 40 (see FIG. 2A).

Figure 24A:
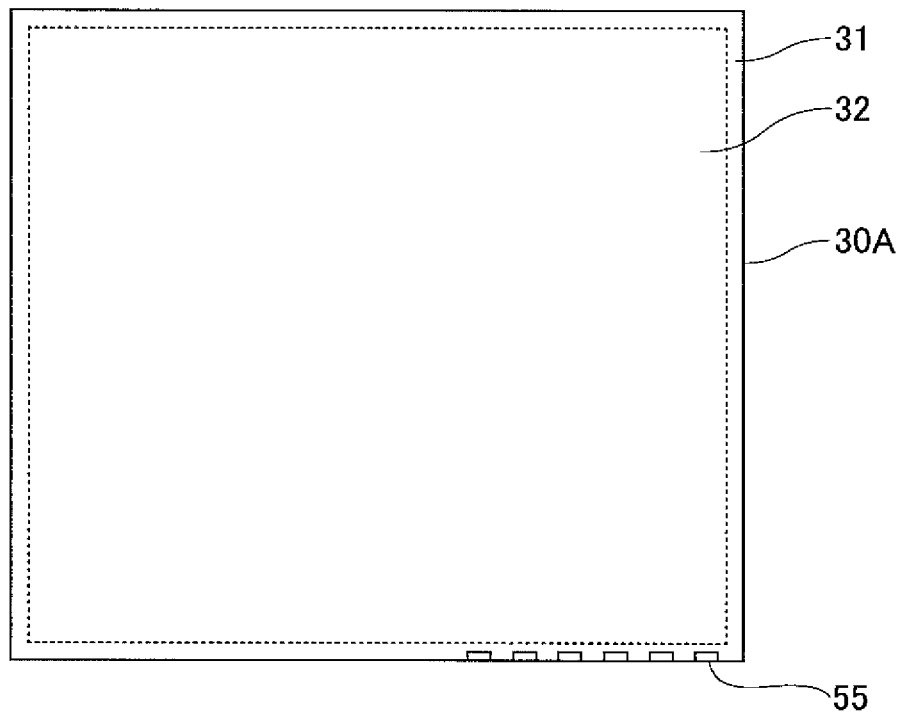
FIG. 24A is a plan view diagram of the semiconductor device of the seventh embodiment.

FIG. 24A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

Figure 24B:
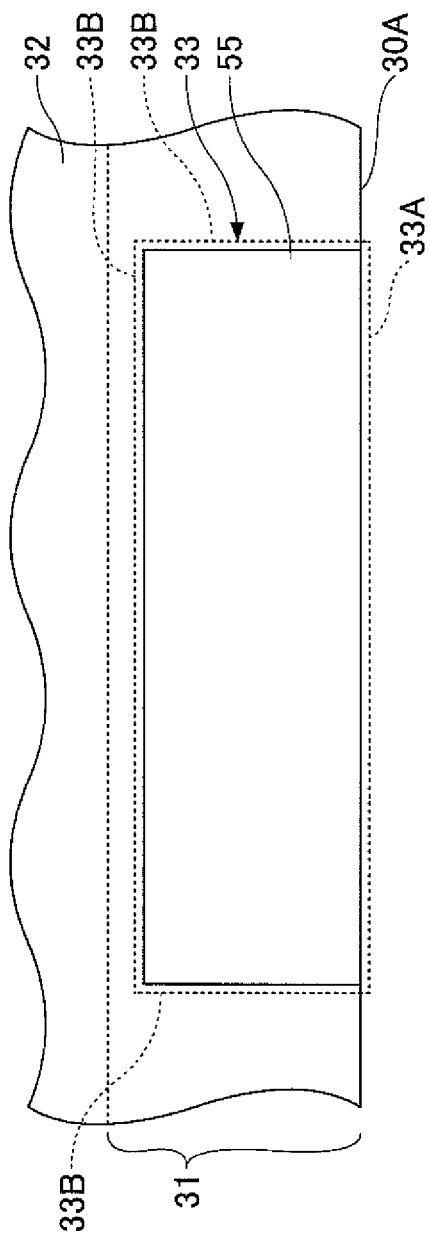

FIG. 24B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. With the present embodiment, no via-plug is formed upon the remaining pad 55.

Figure 24C:
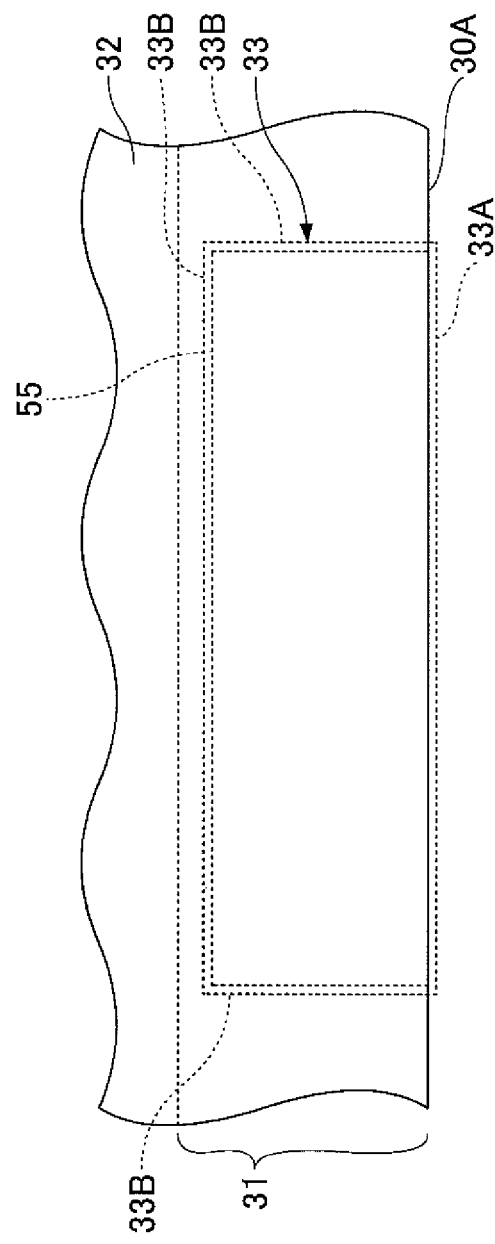
FIG. 24C is a horizontal sectional diagram representing the pad region of a wiring layer lower than the uppermost wiring layer.

FIG. 24C is a horizontal sectional diagram representing the wiring layers 58B-58D (see FIG. 4) of the second through fourth wiring layers.

Referring to FIG. 24C, it will be noted that the conductive pattern 50 does not remain in the pad region 50, and thus, there arises no such a situation in which a plurality of via-plugs V5 are disposed to overlap the conductive pattern 50.

Figure 25A:
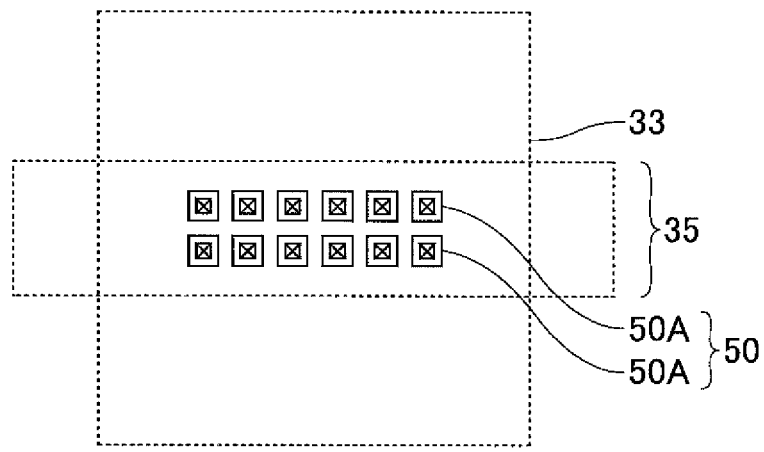
FIGS. 25A-25C are horizontal sectional diagrams representing a conductive pattern inside the pad region and in the wiring layer lower than the uppermost wiring layer before the dicing to form a semiconductor device according to a modification of the seventh embodiment.
Figure 25B:
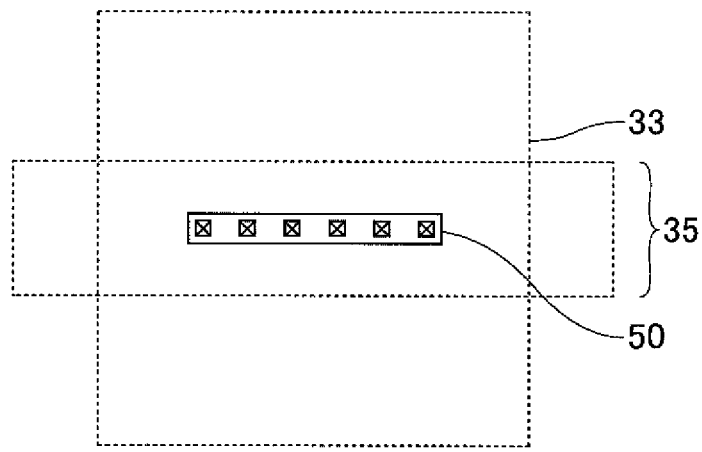
Figure 25C:
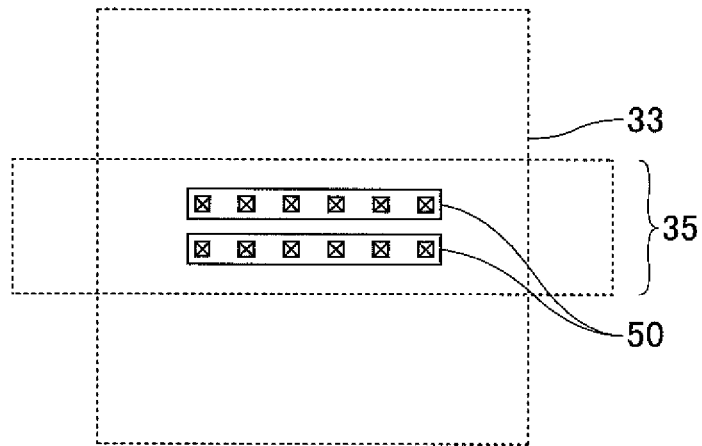

In the present embodiment, it is possible to dispose the dot patterns 50A constituting the conductive pattern 50 in tow rows as represented in FIG. 25A. Further, as represented in FIG. 25B, the conductive pattern 50 may be formed of a linear pattern extending along the central line of the removal region 35 in place of the plurality of dot patterns. Further, as represented in FIG. 25C, such linear patterns may be disposed in two rows. The length of the conductive pattern 50 in the feeding direction of the dicing blade 34 may be set arbitrarily as long as it does not exceed an upper limit value provided by the size of the pad 55 of the uppermost wiring layer.

Hereinafter, the effect of employing the construction of the seventh embodiment will be explained with reference to FIGS. 26A-26D.

Figure 26A:
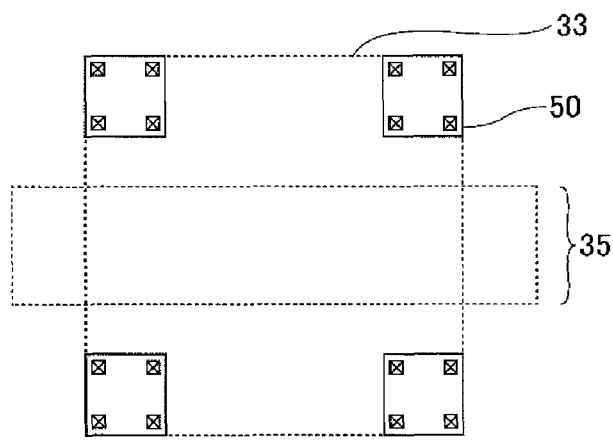

FIG. 26A represents a layout of the conductive patterns 50 inside the pad region 33 for a semiconductor device according to a comparative example.

Referring to FIG. 26A, the conductive patterns 50 of the comparative example are disposed at the four corners of the pad region 33 with an offset from the removal region 35. Because the removal region 35 does not touch the conductive patterns 50, it is possible to suppress the crack formation at the time of the dicing process. It should be noted, however, that with reducing width of the scribe line, the size of the pad region 33 is reduced correspondingly.

Figure 26B:
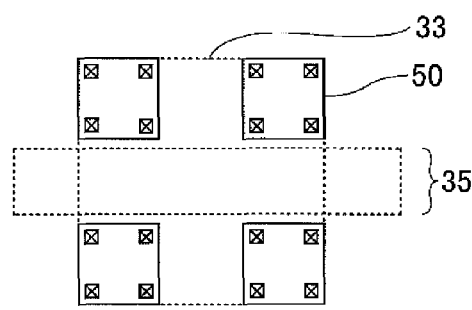

FIG. 26B represents the positional relationship between the removal region 35 and the conductive patterns 50 for the case the size of the pad region 33 has become smaller than the pad region 33 of FIG. 26A.

Referring to FIG. 26B, it can be seen that, because of the shrinkage of the pad region 33, there is caused a corresponding narrowing of the intervals between the conductive patterns 50 is posed at the four corners of the pad region 33. Thus, there arises a problem, with this comparative example, to narrow the removal region 35 in correspondence thereto.

Figure 26C:
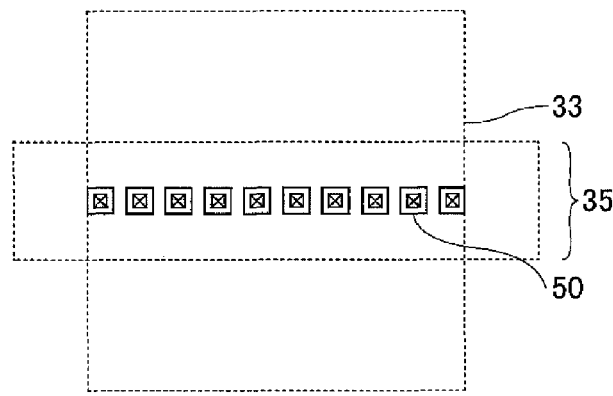
FIGS. 26C and 26D are horizontal sectional diagrams of a conductive pattern inside the pad region for a wiring layer lower than the uppermost wiring layer of a semiconductor device of the seventh embodiment.

FIG. 26C is a reproduction of the positional relationship between the conductive patterns 50 and the removal region 35 for the semiconductor device of the seventh embodiment. Further, FIG. 26D represents the positional relationship between the conductive patterns 50 and the removal region 35 for the case the size of the pad region 33 has become smaller than the pad region 33 of FIG. 26C.

Figure 26D:
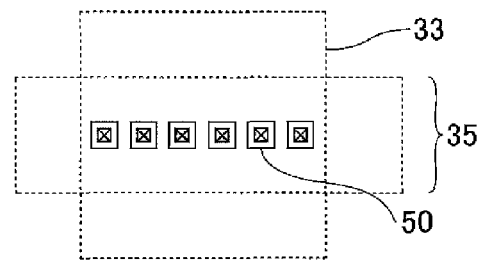

Referring to FIG. 26D, it will be noted that, because the conductive patterns 50 are disposed inside the removal region 35 with the seventh embodiment, there is no need of narrowing the removal region 35 excessively as compared with the case of FIG. 26C.

As noted above, it is not necessary with the construction of the seventh embodiment to narrow the width of the removal region 35 even when the width of the scribe line is narrowed.

Eighth Embodiment

Next, an eighth embodiment will be described. Hereinafter, only the difference to the first embodiment will be described and the explanation for those parts of the same construction will be omitted.

Figure 27A:
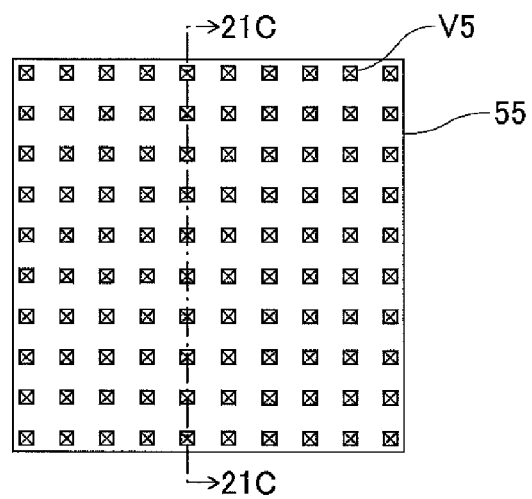
FIG. 27A is a plan view diagram representing the pad of the uppermost wiring layer before the dicing to form a semiconductor device according to an eighth embodiment.

FIG. 27A is a plan view diagram representing the uppermost wiring layer pad 55 formed in the scribe line 31 of the semiconductor wafer according to the eighth embodiment.

FIG. 27A represents that the plan view shape of the uppermost pad 55 of the present embodiment is identical to that of the pad 55 of the first embodiment represented in FIG. 3B aforementioned.

Figure 27B:
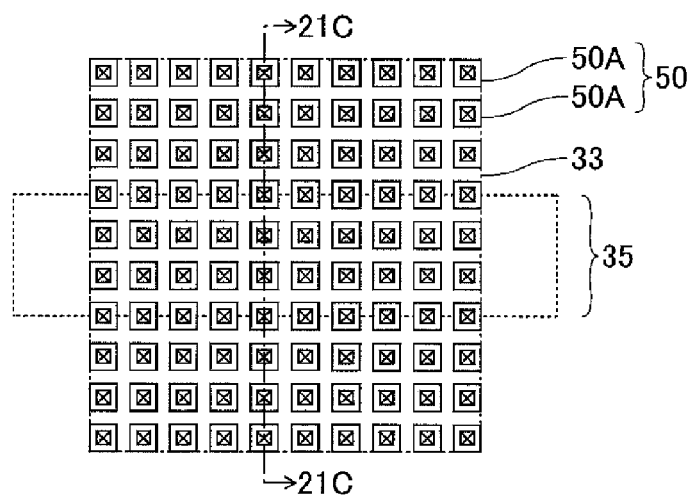
FIG. 27B is a horizontal sectional diagram of a conductive pattern inside the pad region in a wiring layer lower than the uppermost wiring layer in the state before the dicing to form the semiconductor device of the eighth embodiment.

FIG. 27B is a horizontal sectional diagram of the conductive patterns 50 disposed in the wiring layers other than the uppermost wiring layer.

Referring to FIG. 27B, the conductive patterns 50 of the eight embodiment are formed by the plurality of discrete dot patterns 50A distributed within the pad region 33. In the illustrated example, the dot patterns 50A are distributed uniformly in a row and column formation wherein the row direction is coincident to the elongating edge of the removal region and the column direction is coincident to the width direction of the removal region 35. Within one dot pattern 50A, there is disposed one via-plug V5. However, a plurality of via-plugs V5 may be disposed within one dot pattern 50A.

Figure 27C:
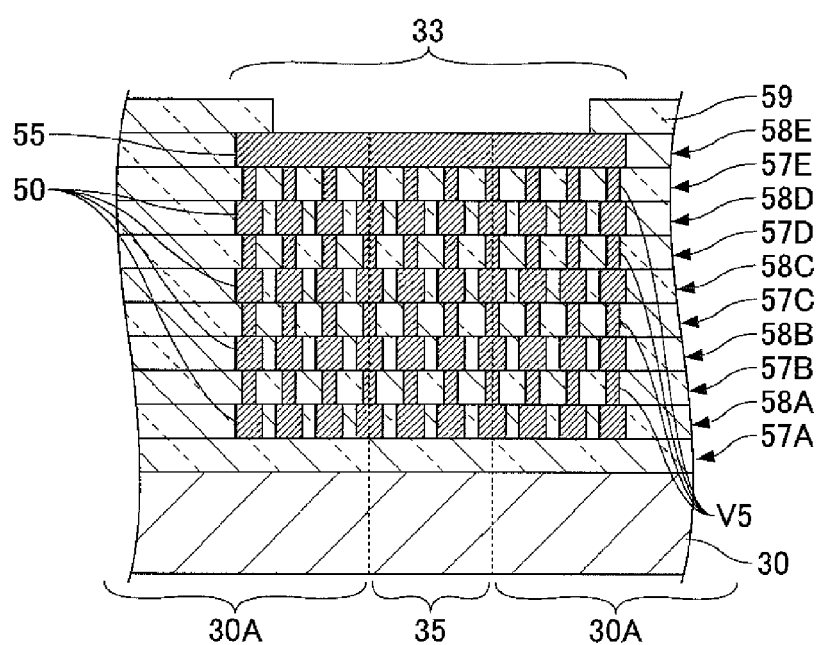
FIG. 27C is a cross-sectional diagram of the semiconductor device taken along a one-dotted line 21C-21C represented in FIGS. 27A and 27B.

FIG. 27C is a cross-sectional diagram taken along a line 20C-20C of FIGS. 27A and 27B.

Referring to FIG. 27C, it will be noted that the conductive patterns 50 adjacent with each other in the thickness direction are connected by a via-plug V5 disposed therebetween. Further, it will be noted that the conductive patterns 50 of the fourth wiring layer and the pad 55 of the uppermost wiring layer are connected with each other by the via-plugs V5 of the fifth layer.

Figure 28A:
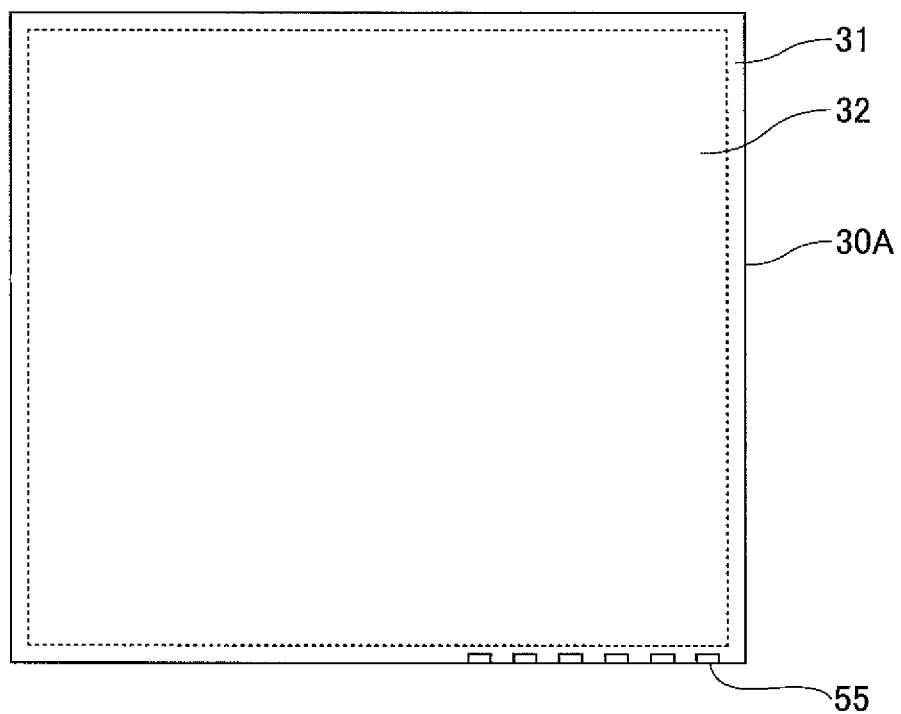
FIG. 28A is a plan view diagram of the semiconductor device of the eighth embodiment.

FIG. 28A is a schematic plan view diagram of the semiconductor device of obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

Figure 28B:
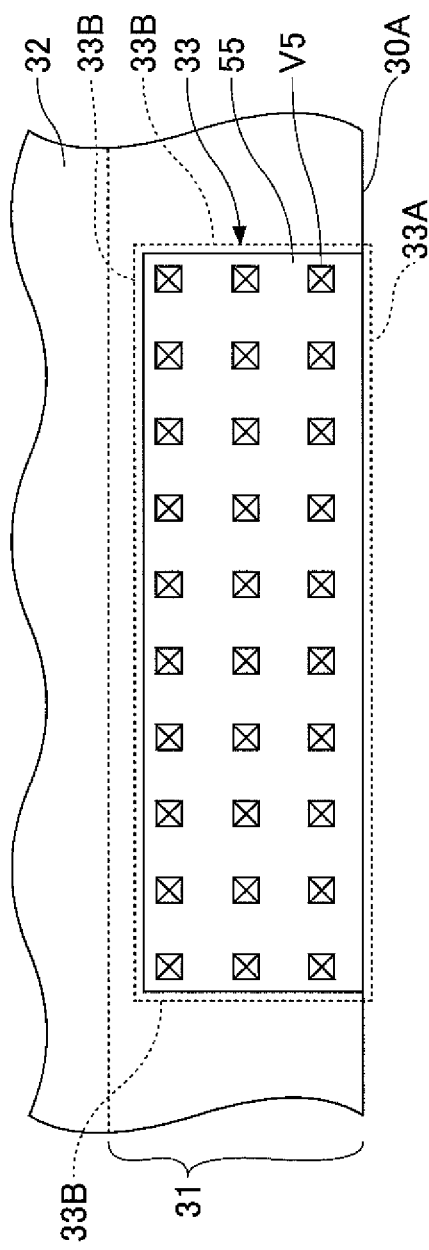

FIG. 28B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. The pad 55 is formed of a solid conductive film such as a metal film formed continuously within the pad region 33. In the region between the outer periphery 33A and the part 33B of the outer periphery of the pad 55, it can be seen that there exists a matrix array of a large number of the via-plugs V5.

Figure 28C:
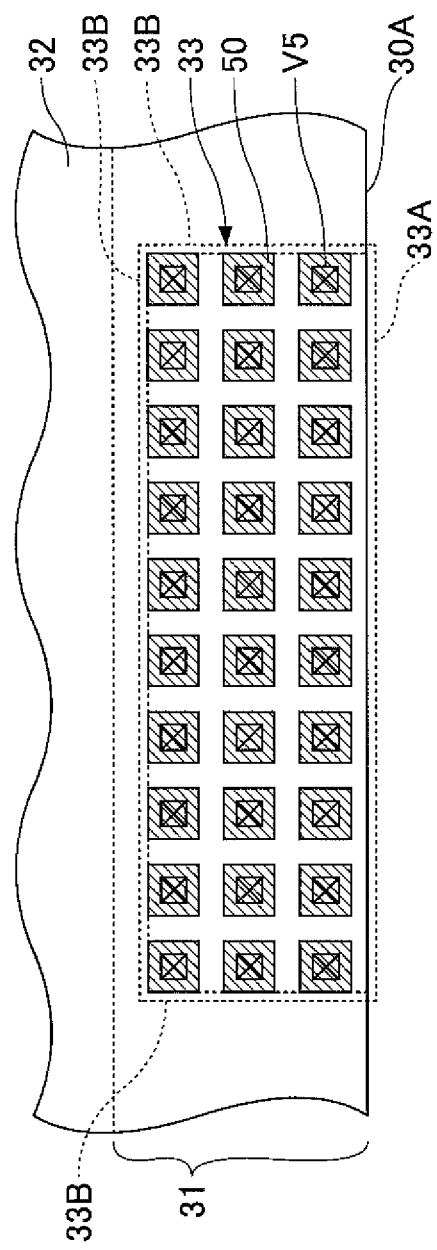
FIG. 28C is a horizontal sectional diagram representing the pad region of a wiring layer lower than the uppermost wiring layer.

FIG. 28C is a horizontal sectional diagram representing the wiring layers 58B-58D (see FIG. 4) of the second through fourth wiring layers.

Referring to FIG. 28C, it will be noted that there remain a large number of mutually isolated conductive patterns 50 in the region between the outer peripheral part 33A and the outer peripheral part of the pad region 33 in the form of a matrix array. Further, there are disposed a large number of via-plugs V5 so as to overlap the respective conductive patterns 50.

Similarly to the first embodiment, the conductive patterns 50 of the wiring layers 58A-58D excluding the uppermost wiring layer 58E exert little influence upon the rotational speed or feeding speed of the dicing blade with the eighth embodiment. Thus, it becomes possible to suppress the formation of cracks in the semiconductor wafer 30.

With the eighth embodiment, it is also possible to form the conductive patterns 50 of one or two of the wiring layers 58A-58D excluding the uppermost wiring layer 58E with a solid or continuous conductive film formed over the entire area of the pad region 33. At the moment when the wiring layer including the conductive pattern 50, formed of the solid continuous conductive film, is formed, it becomes possible to measure the electric characteristics of the monitoring device 40 (FIG. 2A).

Figure 29A:
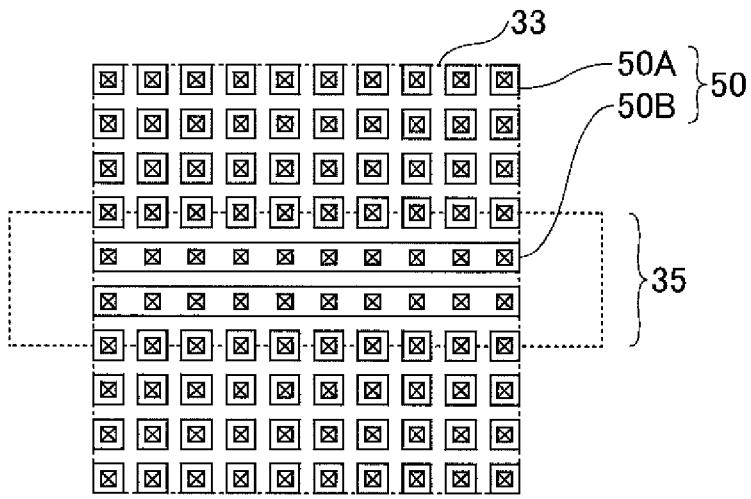
FIGS. 29A-29C are horizontal sectional diagrams representing a conductive pattern inside the pad region of the wiring layer lower than the uppermost wiring layer before the dicing for a semiconductor device according to a modification of the eighth embodiment.

Further, with the present embodiment, it is also possible to form a part of the dot patterns 50A to be extend continuously in the row direction (elongating direction of the removal region 35) as represented in FIG. 29A such that there are formed line patterns 50B. It is preferable to dispose such line patterns 50B at the locations included within the removal region 35. Such line patterns 50B disposed inside the removal region 35 exert little influence upon the rotation of the dicing blade at the time of the dicing process.

Meanwhile, one may think of a possibility to use the conductive pattern 50 represented by FIG. 29A as the pad for probe contact by increasing the width of the line pattern 50B. However, it should be noted that, when the width of the scribe line is decreased and the size of the pad region 33 is decreased, there is decreased also the width of the removal region 35. In such a case, it becomes necessary to decrease the width of the line pattern 50B also. For example, when the width of the scribe line is decreased to about 40 μm and the edge length of the pad region 33 has been decreased to about 35 μm, it becomes necessary to decrease the width of the removal region 35 to about 10 μm. In such a case, it is necessary to form the line pattern 50B to have a width of 10 μm or less. However, it is difficult to contact a probe to a line pattern having a width of 10 μm or less with good reproducibility. Thus, it is preferable to dispose the pad 55 formed of the solid or continuous film in the pad region 33 of the uppermost wiring layer.

Figure 29B:
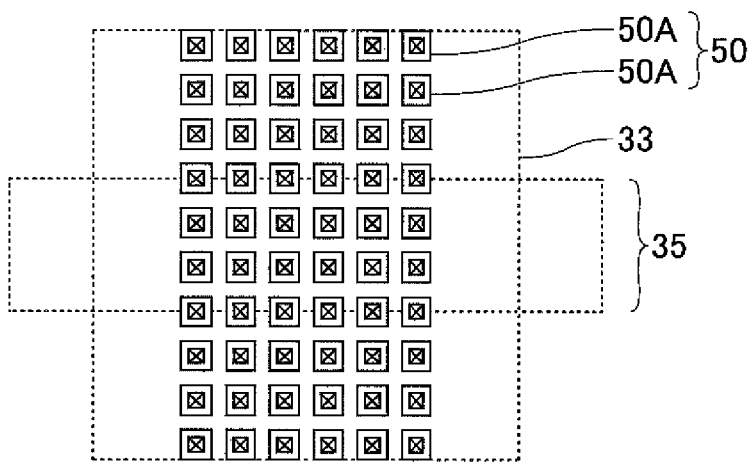

Meanwhile, in the present embodiment, it is not necessary to form the dot patterns 50A uniformly over the entire pad region 33 as represented in FIG. 29B. Thus, it is possible to form the region where no dot patterns 50A are formed in a part of the pad region 33 in the vicinity of the edge crossing perpendicular to the elongating direction of the removal region 35, for example.

Figure 29C:
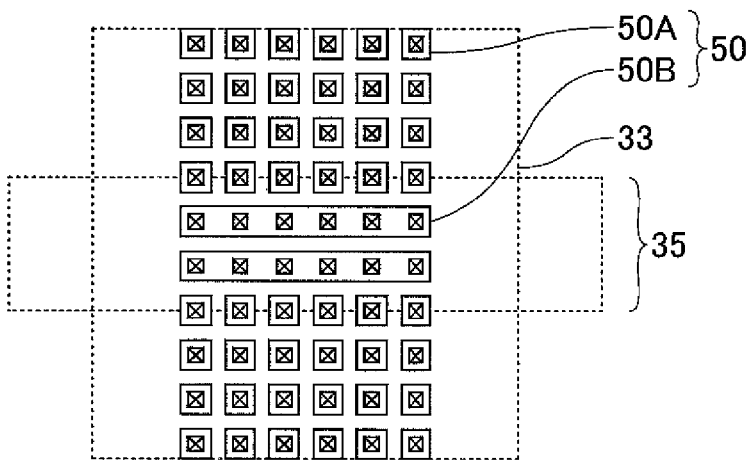

Further, with the present embodiment, it is also possible to form a part of the dot patterns 50A of FIG. 29B in continuation in the row direction to form line patterns 50B as represented in FIG. 29C.

Ninth Embodiment

Next, a ninth embodiment will be described. Hereinafter, only the difference to the first embodiment will be described and the explanation for those parts of the same construction will be omitted.

Figure 30A:
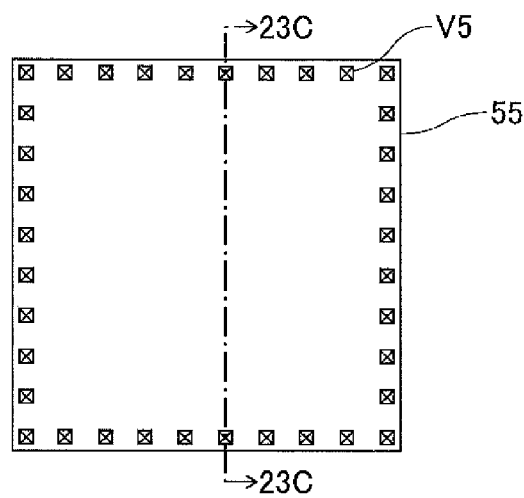
FIG. 30A is a plan view diagram representing the pad of the uppermost wiring layer before the dicing to form a semiconductor device according to a ninth embodiment.

FIG. 30A is a plan view diagram representing the uppermost wiring layer pad 55 formed in the scribe line 31 of the semiconductor wafer 30 according to the ninth embodiment. In FIG. 30A, the plan view shape of the uppermost pad 55 is identical to that of the pad 55 of the first embodiment represented in FIG. 3B.

Figure 30B:
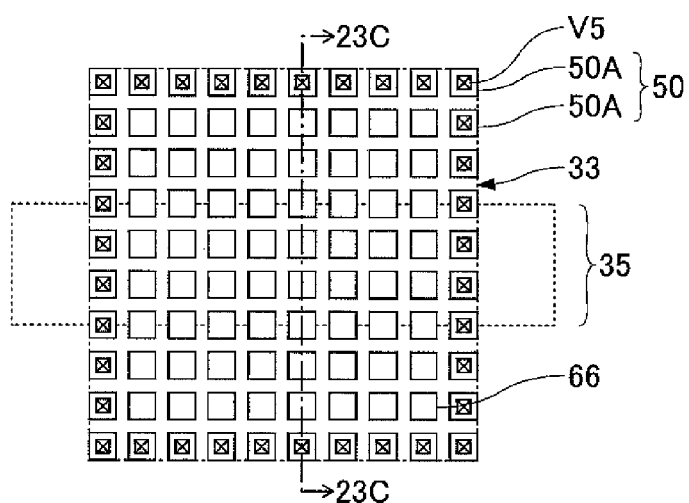
FIG. 30B is a horizontal sectional diagram of a conductive pattern inside the pad region in a wiring layer lower than the uppermost wiring layer in the state before the dicing to form the semiconductor device of the ninth embodiment.

FIG. 30B is a horizontal sectional diagram of the conductive patterns 50 disposed in the wiring layers other than the uppermost wiring layer.

Referring to FIG. 30B, the conductive patterns 50 of the present embodiment are formed by the plurality of discrete dot patterns 50A distributed along the outer periphery of the pad region 33. Deep inside the pad region 33, there are disposed dummy patterns 66 in place of the dot patterns 50A. Within one dot pattern 50A, there is disposed one via-plug V5. In the case of the dummy patterns 66, on the other hand, there are disposed no via-plug.

Figure 30C:
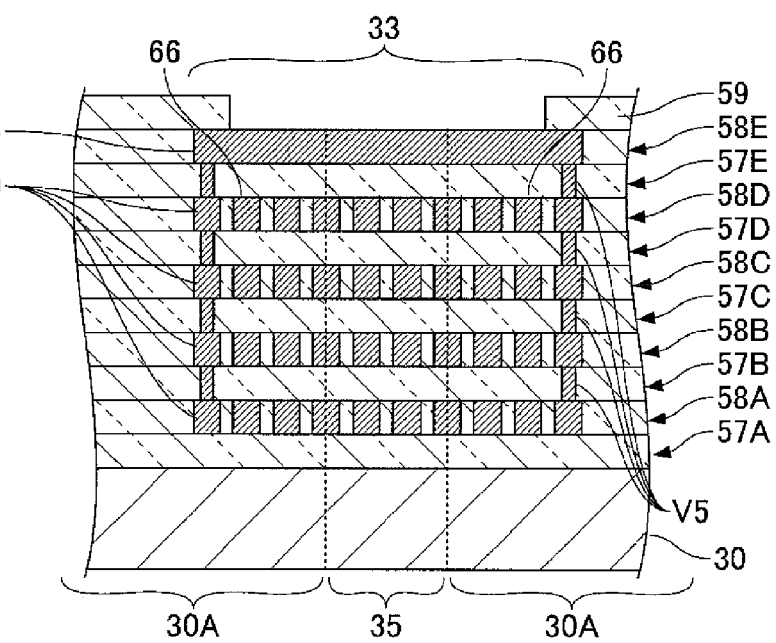
FIG. 30C is a cross-sectional diagram of the semiconductor device taken along a one-dotted line 23C-23C represented in FIGS. 30A and 30B.

FIG. 30C is a cross-sectional diagram taken along a line 23C-23C of FIGS. 30A and 30B.

Referring to FIG. 30C, the conductive patterns 50 and the pad 55 of the wiring layers 58A-58E are connected with each other via the via-plugs V5. At the location corresponding to the dummy patterns 66, however, there are disposed no via-plug V5. Thus, the dummy patterns 66 are electrically isolated. Such dummy patterns 66 works, however, to suppress the formation of dishing or erosion at the time of formation of the wiring layers by a damascene process, for example.

Figure 31A:
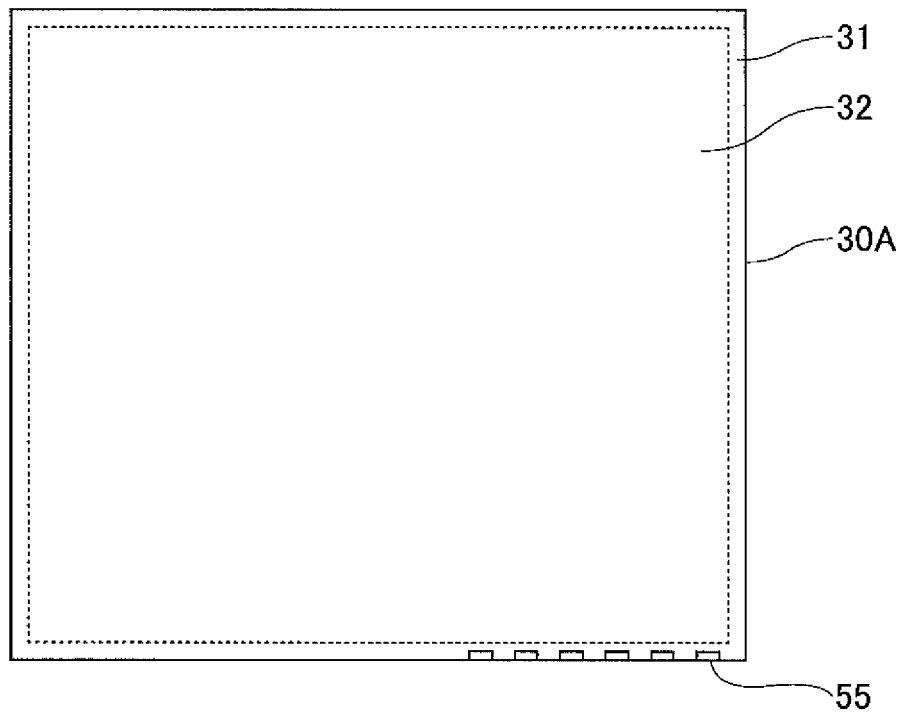
FIG. 31A is a plan view diagram of the semiconductor device of the ninth embodiment.

FIG. 31A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (see FIG. 4), and a plurality of wiring layers 58A-58E (see FIG. 4). As represented in FIG. 1B, the removal region 35 is narrower than the scribe line 31, and thus, there remain a part of the scribe line 31 at the outside of the chip region 32. The scribe line 31 thus remained further includes a part of the pad 55.

Figure 31B:
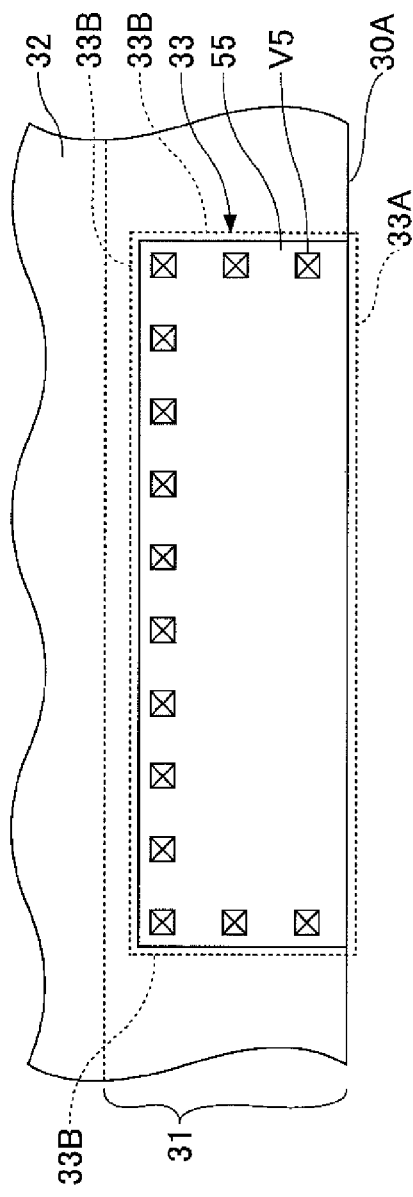

FIG. 31B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. For the pad 55, there are formed a plurality of via-plugs V5 in a row along the outer peripheral surface 33B.

Figure 31C:
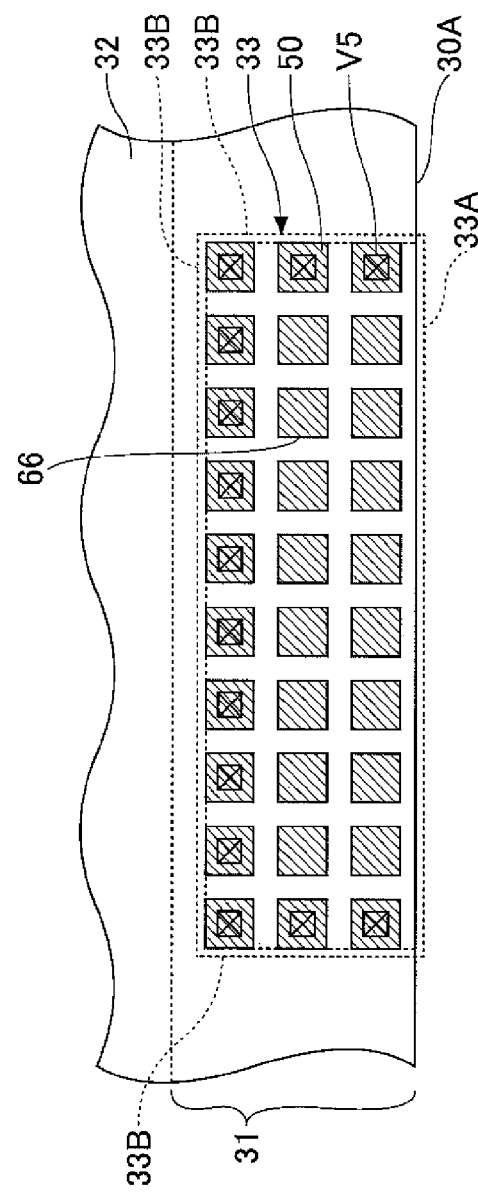
FIG. 31C is a horizontal sectional diagram representing the pad region of a wiring layer lower than the uppermost wiring layer.

FIG. 31C is a horizontal sectional diagram representing the wiring layers 58B-58D (see FIG. 4) of the second through fourth wiring layers.

Referring to FIG. 31C, it will be noted that there remain a large number of mutually isolated conductive patterns 50 in the region between the outer peripheral part 33A and the outer peripheral part of the pad region 33 in the form of a matrix array. Further, in each of the conductive patterns 50, there are disposed a plurality of via-plugs V5 in a row along the outer peripheral part 33B. Further, along the outer periphery 33B, there are formed the plurality of via-plugs V5 in a row, and the dummy patterns 66 are formed in a row and column formation in an inner region thereof, and thus, in the region of the pad region 33 defined between the outer peripheral part 33A and the array of the via-plugs V5.

With the ninth embodiment, too, it becomes possible to suppress the crack formation in the semiconductor wafer 30 similarly to the eighth embodiment represented in FIGS. 27A-27C.

Tenth Embodiment

Next, a tenth embodiment will be explained with reference to FIGS. 32A-32C. Hereinafter, only the difference to the semiconductor device of the seventh embodiment will be described and the explanation for those parts of the same construction will be omitted.

Figure 32A:
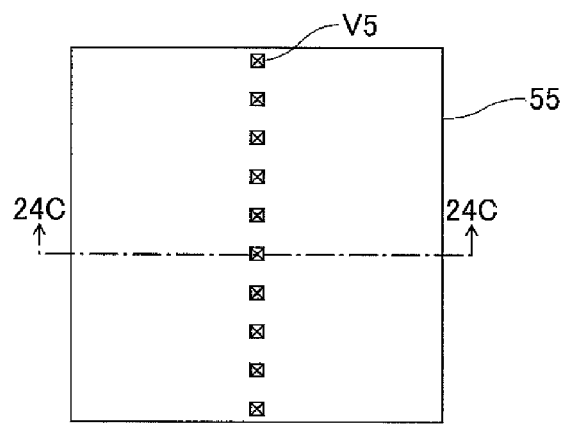
FIG. 32A is a plan view diagram representing the pad of the uppermost wiring layer before the dicing to form a semiconductor device according to a tenth embodiment.

FIG. 32A is a plan view diagram representing the uppermost wiring layer pad 55 formed in the scribe line 31 of the semiconductor wafer 30 according to the tenth embodiment. In FIG. 32A, the plan view shape of the uppermost pad 55 is identical to that of the pad 55 of the seventh embodiment represented in FIG. 18A.

Figure 32B:
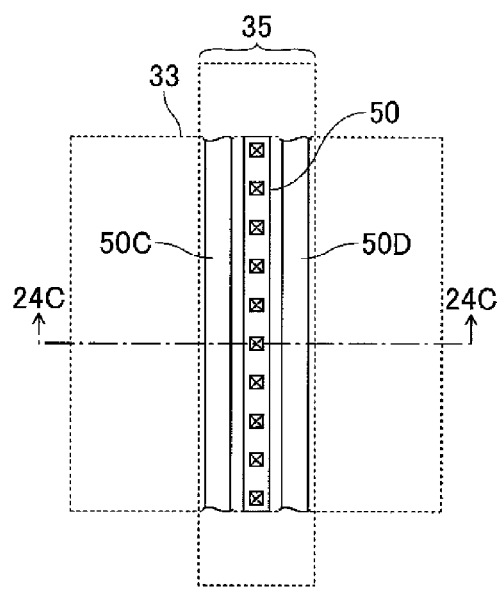
FIG. 32B is a horizontal sectional diagram of a conductive pattern inside the pad region of a wiring layer lower than the uppermost wiring layer in the state before the dicing to form the semiconductor device of the tenth embodiment.

FIG. 32B is a horizontal sectional diagram of the conductive patterns 50 disposed in the wiring layers other than the uppermost wiring layer.

Referring to FIG. 32B, the conductive patterns 30 of the present embodiment are formed, contrary to the case of the seventh embodiment, in the form of elongating conductive strips extending inside the removal region 35 continuously along the removal region 35. In the present embodiment, it should be noted that the conductive pattern 50 are aligned in a row along the central line of the removal region 35. Further, each conductive pattern 50 is formed with a large number of via-plugs V5 aligned in the extending direction of the conductive pattern 50.

Further, as represented in FIG. 32B, there are formed conductive patterns 50C and 50D constituting the wiring to the scribe monitor, like the source wiring 42, the drain wiring 43, the well wiring 44, and the like for the case of the embodiment of FIG. 2A, in the wiring layers 58A, 58B, 58C and 58D lower than the uppermost wiring layer 58E with the present embodiment along the conductive pattern 50, wherein the conductive patterns 50C and 50D are formed so as to be included in the removal region 35 in the plan view in the form of an elongating conductive strip extending in the extending direction of the scribe lien 31 underneath the pad 55 of FIG. 32(A). While these conductive patterns 50C and 50D are drawn to pass the underside of the pad 55 in the illustrated example, it should be noted that these conductive patterns 50C and 50D have respective tip ends that are connected electrically to other pads 55 not illustrated.

Figure 32C:
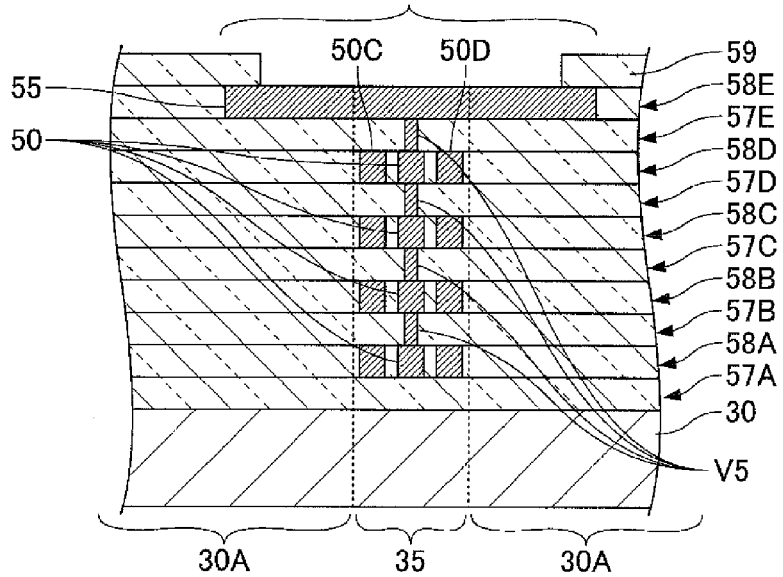
FIG. 32C is a cross-sectional diagram of the semiconductor device taken along a one-dotted line 24C-24C represented in FIGS. 24A and 24B.

FIG. 32C is a cross-sectional diagram taken along a line 24C-24C of FIGS. 32A and 32B.

Referring to FIG. 32C, it can be seen that the conductive patterns 50 of the first through fourth wiring layers and the via-plugs V5 of the second through fifth layers are disposed within the removal region 35. Thus, the conductive pattern 50 is formed of an elongated conductive strip having a width smaller than the width of the removal region 35 and thus a width smaller than the width of the pad 55 and extends continuously along the removal region 35. Further, the via-plugs V5 have a diameter further smaller than the width of the conductive pattern 50. Further, at the underside of the uppermost wiring layer pad 55, it can be seen that the conductive patterns 50C and 50D are formed inside the removal region 35 as a part of the wiring layers 58A-58D that includes the conductive patterns 50. These conductive patterns 50C and 50D are formed of the elongating conductive strip extending along the removal region 35 and are connected to the conductive patterns 50 as necessary. Thereby, with the present embodiment, the location and width of the conductive patterns 50C and 50D are chosen not to protrude laterally beyond the width of the removal region 35 in the plan view of the pad region.

Because the conductive patterns 50C and 50D are thus included within the removal region 35 and not formed outside, the present embodiment can eliminate the dicing blade 34 catching these conductive patterns located outside even when there is caused a fluctuation in the location of the dicing blade 34 at the time of the dicing process.

With the embodiment of FIGS. 32A-32C, too, there remains a part of the pad 55 of the uppermost wiring layer in the semiconductor device after the dicing, while it should be noted that none of the conductive patterns 50 and the via-pugs V5 and further the conductive patterns 50C and 50D remains in the wiring layers 58A-58D excluding the uppermost wiring layer and in the via-layers 57A-57E. Here, it should be noted that the removal region 35 may have a width in the range of 15 μm-50μ as noted before, and thus, the conductive patterns 50 and the conductive patterns 50C and 50D are formed within a region having a width in the range of 15 μm-50μ on the central line of the scribe line 31.

Figure 33A:
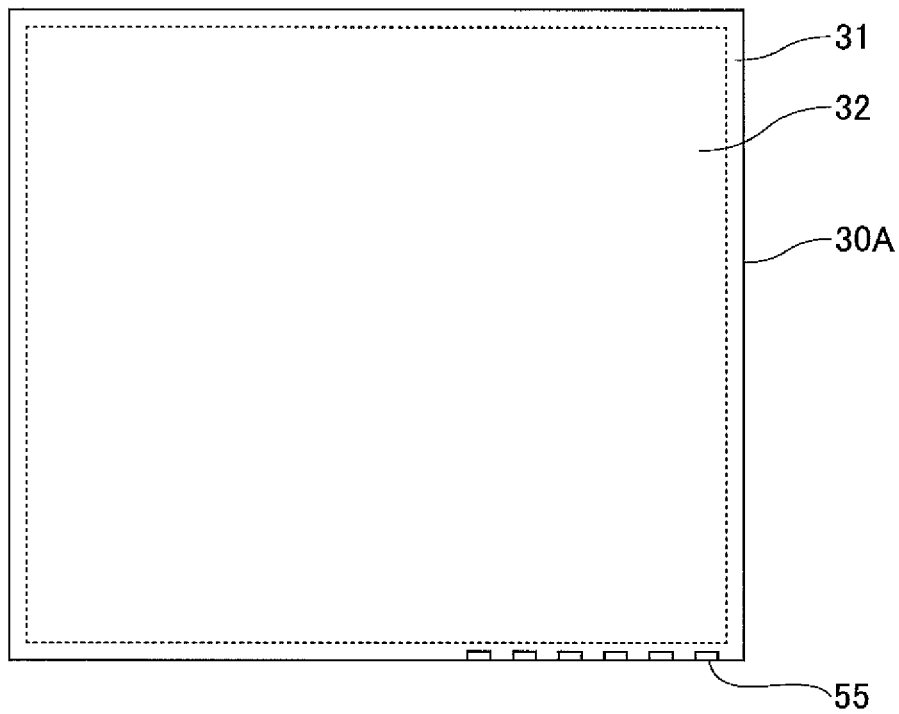
FIG. 33A is a plan view diagram of the semiconductor device of the tenth embodiment.

FIG. 33A is a schematic plan view diagram of the semiconductor device of the present embodiment obtained by the dicing process. The semiconductor device includes a semiconductor substrate 30A diced from the semiconductor wafer 30 represented in FIG. 4, a plurality of via-layers 57A-57E stacked over the semiconductor substrate 30A (FIG. 4), and a plurality of wiring layers 58A-58E (see FIG. 4). As represented in FIG. 1B, the removal region 35 is narrower than the scribe line 31, and thus there remain a part of the scribe line 31 at the outside of the chip region 32. The scribe line 31 thus remained further includes a part of the pad 55.

Figure 33B:
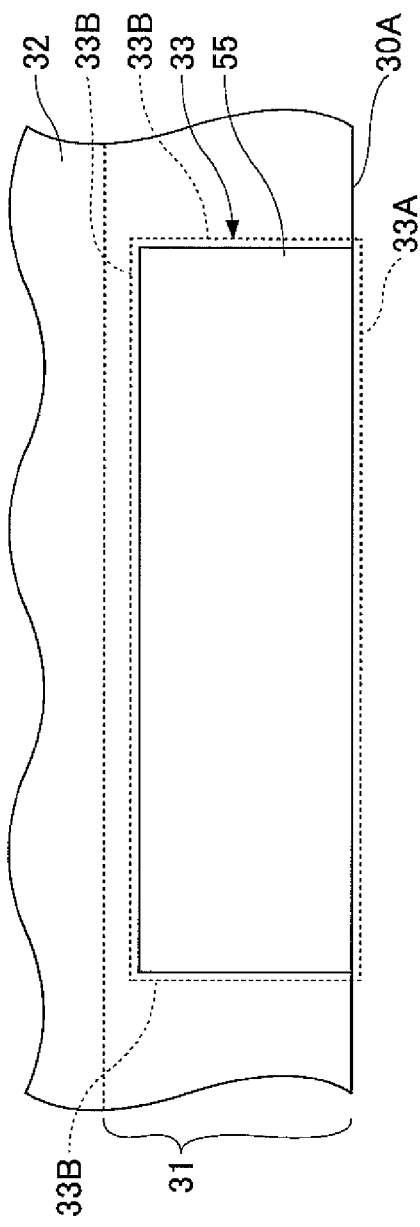

FIG. 33B is a plan view diagram of the remaining pad 55. After the dicing process, it should be noted that a part 33A of the outer periphery of the pad 33 is formed coincident to the edge of the semiconductor substrate 30A. The pad 55 is formed over the entire area of the pad region 33. In the present embodiment, it should be noted that the via-plugs V5 are not included in the remaining pad 55.

Figure 33C:
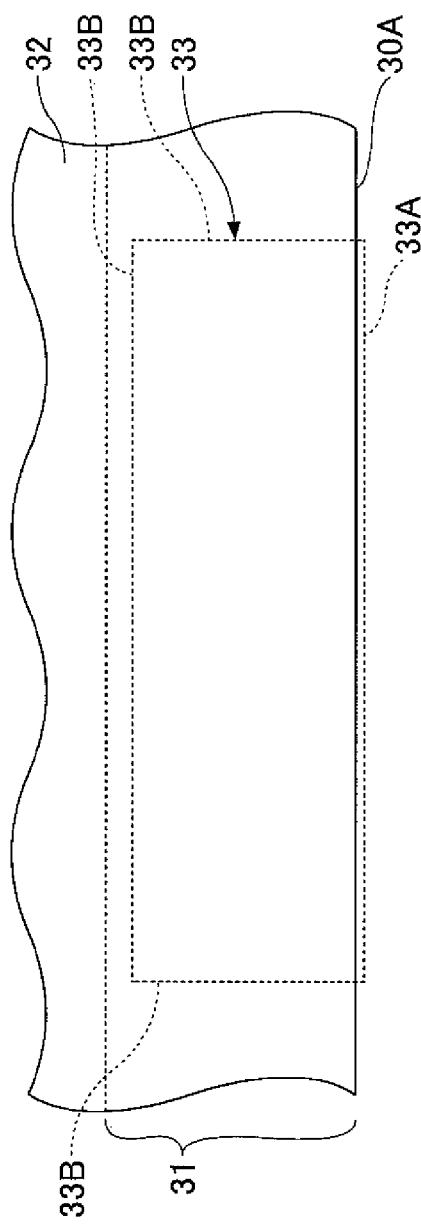
FIG. 33C is a horizontal sectional diagram representing the pad region of a wiring layer lower than the uppermost wiring layer.

FIG. 33C is a horizontal sectional diagram representing the wiring layers 58B-58D (see FIG. 4) of the second through fourth wiring layers.

Referring to FIG. 33C, it should be noted that, because the via-plugs V5 are not included in the region of the outer periphery of the pad region 33 located between the outer peripheral part 33A and the outer peripheral part 33B with the present embodiment, there are included no conductive patterns in such a region.

In the tenth embodiment, too, the conductive patterns 50 are formed by the elongating conductive strips extending along the removal region 35 in the wiring layers 58A-58D excluding the wiring layer 58E, and the conductive patterns 50C and 50D of a similar elongating conductive strips are formed with separation from each other. Because of this, the effect of the ductility of the metals upon the dicing blade 34 is limited as compared with the comparative example of FIG. 6, for example, and little influence is exerted upon the rotational speed or feeding speed of the dicing blade 34. Thus, with the present embodiment, too, it becomes possible to suppress the crack formation in the semiconductor wafer 30 at the time of the dicing and the lifetime of the dicing blade 34 is extended. As will be explained later with reference to actual examples, it is not necessary to provide the conductive patterns 50C and 50D to all of the wiring layers. In such a construction in which the conductive patterns 50C and 50D are not provided to all of the wiring layers, the density of formation of the conductive patterns 50C and 50D in the removal region 35 is reduced and it becomes possible to carry out stable dicing while using the dicing blade 34.

Further, with the tenth embodiment, in which the conductive patterns 50C and 50D forming the wiring to the scribe monitors are formed right underneath the pad 55 of the uppermost wiring layer, it becomes possible to narrow the width of the scribe region as compared with the construction of the first embodiment in which such conductive patterns are formed outside of the pad 55 of the uppermost wiring layer as viewed in a plan view, and with this, it becomes possible to increase the number of the semiconductor chips obtained from one semiconductor wafer by the dicing process.

Such conductive patterns 50C and 50D can be formed to pass the underside of the pad 55 as they are connected to other pads 55 electrically, and thus, it becomes possible to use the region right underneath the scribe line 31 and overlapping the scribe line as viewed in the plan view, efficiently for the wiring to various monitoring devices.

Figure 34A:
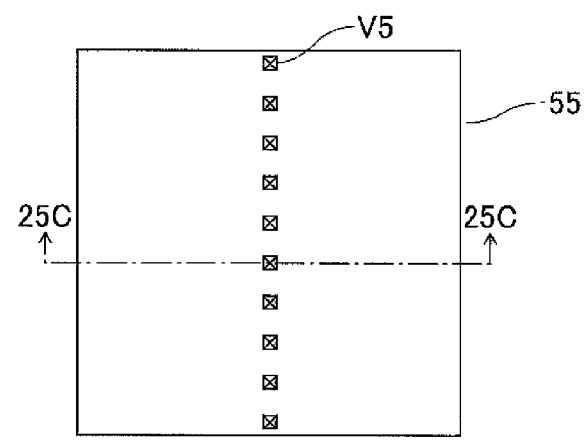
FIG. 34A is a plan view diagram representing the pad of the uppermost wiring layer before the dicing to form a semiconductor device according to a modification of the tenth embodiment.

Next, a modification of the tenth embodiment will be explained with reference to FIGS. 34A-34C. In the drawings, those parts explained before are designated by the same reference numerals and the description thereof will be omitted. FIG. 34A is a plan view diagram representing the pad 55 of the uppermost wring layer of the present embodiment, FIG. 34B is a horizontal sectional diagram of the conductive pattern 50 disposed in the wiring layer other than the uppermost wiring layer, while FIG. 34C is a cross-sectional diagram taken along a one-dotted line 25C-25C in FIGS. 34A and 34B.

Figure 34B:
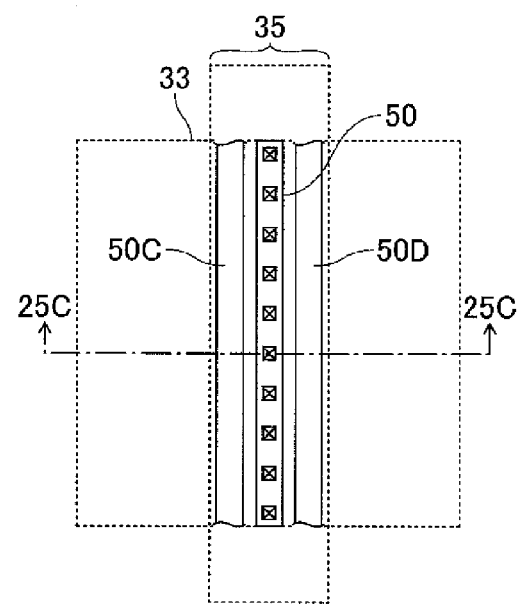
FIG. 34B is a horizontal sectional diagram of a conductive pattern inside the pad region of a wiring layer lower than the uppermost wiring layer in the state before the dicing to form the semiconductor device of the modification of the tenth embodiment.
Figure 34C:
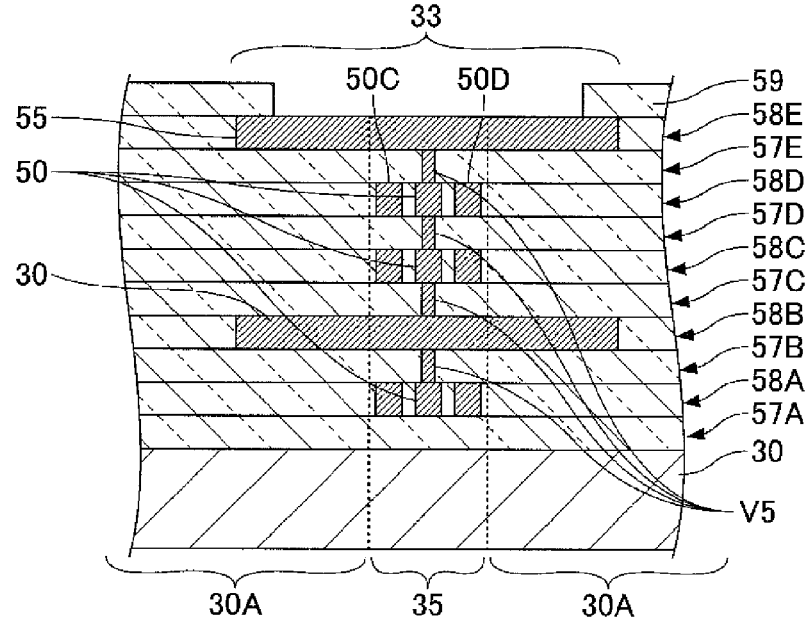
FIG. 34C is a cross-sectional diagram of the semiconductor device taken along a one-dotted line 25C-25C represented in FIGS. 34A and 34B.

With the tenth embodiment, too, it is possible to form the conductive patterns 50 of one or two of the wiring layers 58A-58D excluding the uppermost wiring layer 58E with a solid or continuous conductive film formed over the entire area of the pad region 33 as represented in the modification of FIGS. 34A-34C. At the moment when the wiring layer including the conductive pattern 50, formed of the solid continuous conductive film, is formed, it becomes possible to measure the electric characteristics of the monitoring device 40 (see FIG. 2A) similarly to the example of FIG. 10B explained previously. Here, it should be noted that FIG. 34C is a cross-sectional diagram taken along a line 25C-25C of FIGS. 34A and 34B. In the example of FIG. 34C, a pad of the shape and size identical to the pad 55 of the uppermost wiring layer is formed in the wiring layer 58B by the wiring layer 50 similarly to the example of FIG. 10B. In this case, the conductive patterns 50C and 50D are not formed in the wiring layer 58B, and the function of these conductive patterns is realized by the conductive pattern of other wiring layer.

Figure 36A:
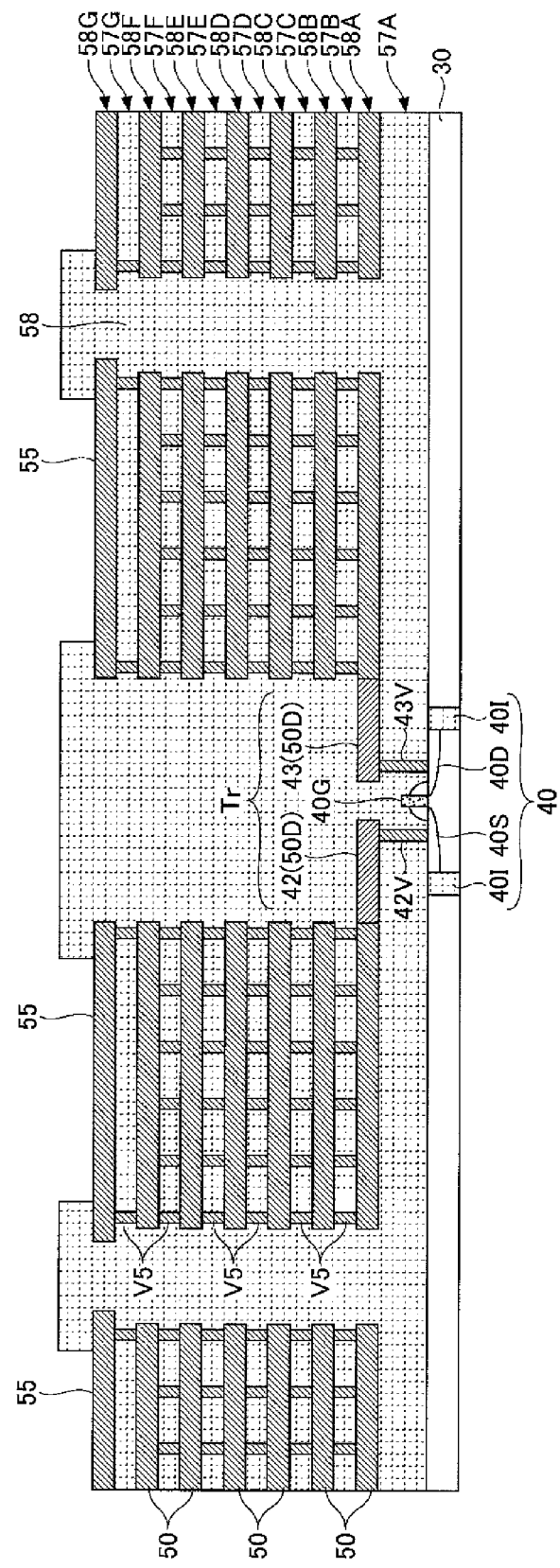
Figure 36B:
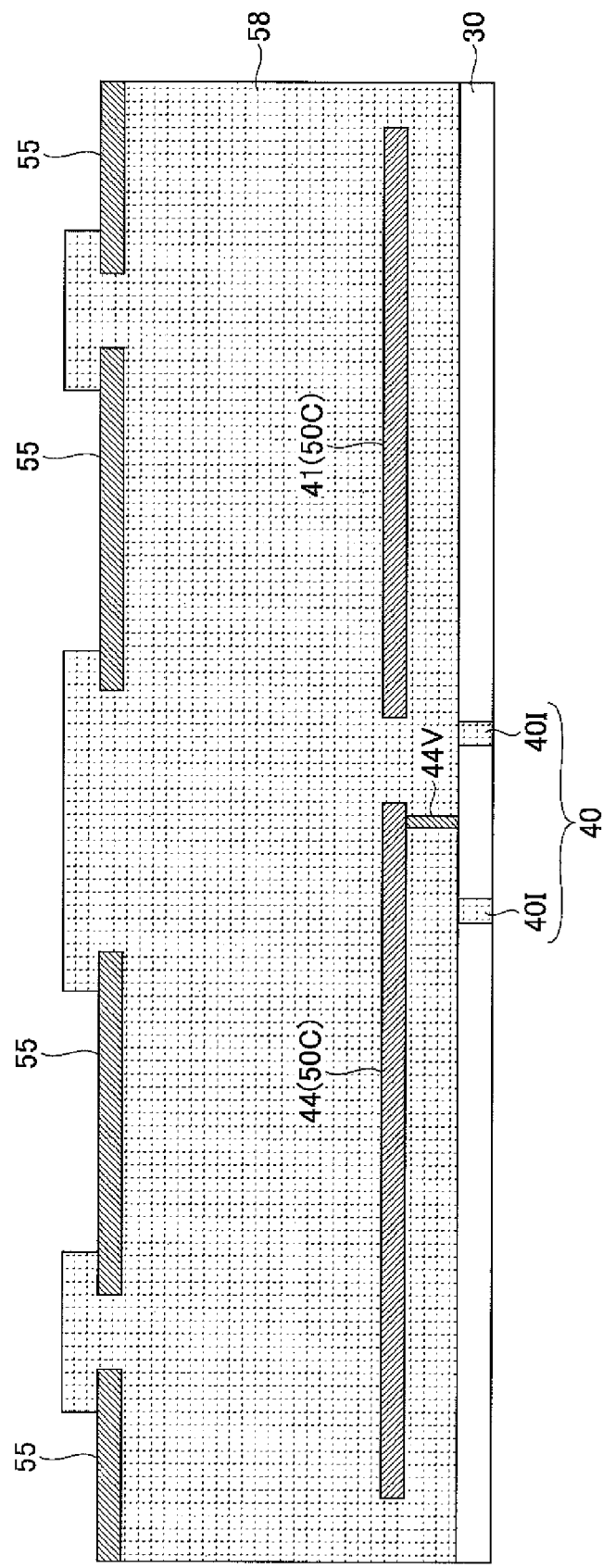
FIG. 36B is a cross-sectional diagram taken along a line 27B-27B of the semiconductor wafer of FIG. 35A.

FIG. 35A is a plan view diagram representing an example of a semiconductor wafer of the present embodiment having a pad structure in the scribe line 31, FIG. 35B is a plan view representing an example of the monitoring device 40 formed in such a scribe line 31, while FIGS. 36A and 36B are cross-sectional diagrams taken respectively along the lines 27A-27A and 27B-27B in the plan view of FIG. 35A. FIG. 35A represents the pads 55 of the uppermost wiring layer. In the drawings, those parts explained before are designated by the same reference numerals and the description thereof will be omitted.

Referring to the cross-sectional diagram of FIG. 36A, the wiring layer 58E is formed in the present embodiment on the via-layer 57E in the structure of FIG. 32C, for example, similarly to other wiring layers 58A-58D, and a next via-layer 57F is formed on the wiring layer 58E similarly to other via-layers 57B-57E. Further, a next wiring layer 58F is formed on the via-layer 57F similarly to other wiring layers 58A-58D, and a next via-layer 57G is formed on the wiring layer 58F similarly to other via-layers 57B-57F. Further, a wiring layer 58G including the pad 55 of the uppermost wiring layer is formed on the via-layer 57G similarly to the wiring layer 58E of FIG. 32A.

Referring to FIGS. 35A and 35B and FIGS. 36A and 36B, the scribe line 31 is formed with the pads 55 of the uppermost wiring layer described already with reference to any of FIGS. 32A-32C and FIGS. 34A-34C consecutively along the scribe line 31, and the conductive patterns 50C and 50D extending from the monitoring device 40 formed on the semiconductor wafer 30 extend over the semiconductor wafer 30 along the scribe line 31 so as to overlap the pads 55 as viewed in a plan view. The conductive patterns 50C and 50D are connected electrically to the respective pads 55 via the stack of via-plugs V5 and the conductive patterns 50 as will be explained in the cross-sectional diagram of FIG. 36A.

In the example of FIG. 35B, the monitoring device 40 includes an active region 40A and a well contact 40B defined in the semiconductor waver 30 by a device isolation region 40I, wherein a transistor Tr having a gate electrode 40G, a source region 40S and a drain region 40D is formed in the active region 40A. The source region 40S of the transistor is connected to the source wiring 42 via a via-plug 42V, while the drain region 40D is connected to the drain wiring 43 via a via-plug 43V. Further, the gate electrode 40G is connected to the gate wiring 41 via a via-plug 41V, and the well 40B is connected to the well wiring 44 via a via-plug 44V.

The source wiring 42 and the drain wiring 43 extend over the semiconductor wafer 30 as the conductive pattern 50C while the gate wiring 41 and the well wiring 43 extend over the semiconductor wafer 30 as the conductive pattern 50D.

With such a construction, there occurs no such a case in which the conductive pattern 50C or 50D for the wiring is formed at a lateral side of the pad 55 as will be seen from the plan view of FIG. 35A, and thus, it becomes possible to reduce the width of the scribe line 31 in accordance with the size of the pad 55.

Further, according to such a construction, as will be noted from the cross-sectional diagrams of FIGS. 36A and 36B, the conductive patterns 50 are formed with high density only in a part of the removal region 35 in which the conductive patterns 50 and the via-plugs V5 are formed in stack and overlap with each other when viewed in a plan view. In a part of the removal region 35 that does not include the conductive patterns 50, however, the density of the conductive patterns is low as can be seen from the cross-section of FIG. 36B. Thus, in the dicing of the removal region 35 having such a structure, the problem of the rotational speed of the dicing blade 34 causing a large change because of the ductility of the metal patterns and the semiconductor chip obtained as a result of the dicing being cracked can be effectively avoided.

While the present invention has been explained with reference to embodiments, it should be noted that the present invention should not be limited to such specific embodiments.

For example, it will be obvious for a person skilled in the art that various modifications improvements and combinations are possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
   a semiconductor substrate that includes a scribe region and a chip region;
   a plurality of wiring layers formed over said semiconductor substrate;
   a via-layer interposed between said plurality of wiring layers;
   conductive films formed respectively in said plurality of wiring layers; and
   a via-plug disposed in said via-layer such that said via-plug connects said conductive films of said wiring layers respectively above and below said via-layer with each other,
   wherein said scribe region is located at an outer periphery of said chip region along an edge of said semiconductor substrate,
   said scribe region includes a pad region in the vicinity of said edge, said pad region overlaps with said conductive films of said plurality of wiring layers in a plan view, said plurality of wiring layers includes a first wiring layer and a second wiring layer, said conductive film of said first wiring layer includes a first conductive pattern formed over an entire surface of said pad region in a plan view, said conductive film of said second wiring layer includes a second conductive pattern formed in an outer periphery part of said pad region and a plurality of third conductive patterns disposed inside said pad region with a mutual separation, wherein said third conductive patterns are electrically isolated from said second conductive pattern.

2. The semiconductor device as claimed in claim 1, wherein said third conductive patterns are formed at least at a location offset from said edge.

3. The semiconductor device as claimed in claim 1, wherein said second conductive pattern is disposed at least along a part of an outer periphery of said pad region such that said second conductive pattern does not overlap said edge.

4. A semiconductor device comprising:
a semiconductor substrate that includes a scribe region and a chip region;
a plurality of wiring layers formed over said semiconductor substrate;
a via-layer interposed between said plurality of wiring layers;
conductive films formed respectively in said plurality of wiring layers; and
a via-plug disposed in said via-layer such that said via-plug connects said conductive films of said wiring layers respectively above and below said via-layer with each other,
wherein said scribe region is located at an outer periphery of said chip region along an edge of said semiconductor substrate,
said scribe region includes a pad region in the vicinity of said edge,
said pad region overlaps with said conductive films of said plurality of wiring layers in a plan view,
said plurality of wiring layers includes a first wiring layer and a second wiring layer,
said conductive film of said first wiring layer includes a first conductive pattern formed over an entire surface of said pad region in a plan view,
said conductive film of said second wiring layer includes a second conductive pattern formed in an outer periphery part of said pad region in a plan view and a plurality of third conductive patterns disposed inside said pad region with a mutual separation and electrically isolated from said second conductive pattern, and
said pad region is defined by: a first outer peripheral part opposing said edge; a second outer peripheral part reaching said edge and said first outer peripheral part; and a third peripheral part reaching said edge and said first outer peripheral part, said pad region including a first apex formed by said first outer peripheral part and said second outer peripheral part, a second apex formed by said first outer peripheral part and said third outer peripheral part, and wherein said second conductive pattern is disposed adjacent to said first apex and said second apex.

5. The semiconductor device as claimed in claim 4, wherein said second conductive pattern has a hook shape and is disposed adjacent to said first apex or said second apex.

6. A wafer comprising:
a semiconductor substrate that includes a scribe region and a chip region defined by said scribe region;
a wiring layer formed over said semiconductor substrate;
a pad of a metal formed along a central line of said scribe region; and
a first conductive pattern, that is electrically connected to said pad and disposed at least to overlap said pad in a plan view, formed in said wiring layer; and
a second conductive pattern, that is electrically isolated from said pad and disposed at least to overlap said pad in a plan view and in separation from said first conductive pattern, formed in said wiring layer.

7. The wafer as claimed in claim 6, wherein said first and second conductive patterns underneath said pad are formed in an area removed by a dicing blade at a time of a dicing process.

8. The wafer as claimed in claim 7, wherein said area has a width of 15 $\mu$m-50 $\mu$m.

9. A semiconductor device comprising:
a semiconductor substrate having a chip region, a scribe region located at an outer periphery of said chip region, and a pad region located in said scribe region and in the vicinity of an edge of the semiconductor substrate in a plan view;
a lower wiring layer, formed over said semiconductor substrate, including a first conductive pattern and a plurality of second conductive patterns each disposed within said pad region, wherein said first conductive pattern is disposed along a periphery of said pad region, said plurality of second conductive patterns are disposed in an inner area of said pad region, and said first conductive pattern and said plurality of second conductive patterns being electrically isolated from each other;
an insulating film formed over said lower wiring layer; and
an upper wiring layer, formed over said insulating film, including a third conductive pattern overlapping with said first and second conductive patterns in a plan view, said third conductive pattern electrically connected to said first conductive pattern.

10. The semiconductor device as claimed in claim 9, wherein said plurality of second conductive patterns comprise a plurality of rectangular patterns.

11. The semiconductor device as claimed in claim 9, wherein said plurality of second conductive patterns are disposed inward from said edge of said semiconductor substrate.

12. The semiconductor device as claimed in claim 9, wherein said pad region is defined by a first outer peripheral part opposing said edge of said semiconductor substrate, a second outer peripheral part reaching said edge and said first outer peripheral part and a third outer peripheral part reaching said edge and said first outer peripheral part, said first conductive pattern is disposed along said first, second, and third outer peripheral parts.

13. The semiconductor device as claimed in claim 9, wherein said first and second conductive patterns are formed of copper and said third conductive pattern is formed of aluminum.

14. The semiconductor device as claimed in claim 9 further comprising a first intermediate wiring layer and a second intermediate wiring layer formed between said lower wiring layer and said semiconductor substrate, wherein said first intermediate wiring layer includes a fourth conductive pattern disposed within said pad region in a plan view and said second intermediate wiring layer includes a plurality of fifth conductive patterns each disposed within said pad region in a plan view, said fourth conductive pattern is disposed along the periphery of said pad region, said plurality of fifth conductive patterns are disposed in the inner area of said pad region, and said fourth conductive pattern is electrically connected to said first and third conductive patterns.

15. The semiconductor device as claimed in claim 14, wherein said plurality of fifth conductive patterns in the fourth wiring layer are electrically connected to each other and to said first and third conductive patterns, and said fifth conductive patterns are separated from each other in a plan view.

* * * * *